(12) United States Patent
Pellegrino et al.

(10) Patent No.: US 10,340,698 B2
(45) Date of Patent: *Jul. 2, 2019

(54) LARGE-SCALE SPACE-BASED SOLAR POWER STATION: PACKAGING, DEPLOYMENT AND STABILIZATION OF LIGHTWEIGHT STRUCTURES

(71) Applicant: California Institute of Technology, Pasadena, CA (US)

(72) Inventors: Sergio Pellegrino, Pasadena, CA (US); Harry A. Atwater, South Pasadena, CA (US); Seyed Ali Hajimiri, La Canada, CA (US); Manan Arya, Pasadena, CA (US); Nicolas Lee, Pasadena, CA (US); Melanie Delapierre, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 673 days.

This patent is subject to a terminal disclaimer.

(21) Appl. No.: 14/712,812

(22) Filed: May 14, 2015

(65) Prior Publication Data

US 2016/0376037 A1 Dec. 29, 2016

Related U.S. Application Data

(60) Provisional application No. 61/993,016, filed on May 14, 2014, provisional application No. 61/993,025, (Continued)

(51) Int. Cl.
*B64G 1/22* (2006.01)
*H02J 3/38* (2006.01)
(Continued)

(52) U.S. Cl.
CPC ............ *H02J 3/383* (2013.01); *B64G 1/1085* (2013.01); *B64G 1/222* (2013.01); *B64G 1/428* (2013.01);
(Continued)

(58) Field of Classification Search
CPC .......... B64G 1/443; H02S 30/20; H02S 30/00
(Continued)

(56) References Cited

U.S. PATENT DOCUMENTS 2,599,944 A 6/1952 Salisbury et al.
3,152,260 A 10/1964 Cummiogs et al.
(Continued)

FOREIGN PATENT DOCUMENTS

CA 2833826 A1 11/2012
CA 2833862 A1 5/2014
(Continued)

OTHER PUBLICATIONS

International Preliminary Report on Patentability for International Application PCT/US2015/030900, dated Nov. 15, 2016, dated Nov. 24, 2016, 9 Pgs.
(Continued)

*Primary Examiner* — Jessica B Wong
(74) *Attorney, Agent, or Firm* — KPPB LLP

(57) ABSTRACT

A space-based solar power station, a power generating satellite module and/or a method for collecting solar radiation and transmitting power generated using electrical current produced therefrom, and/or compactible structures and deployment mechanisms used to form and deploy such satellite modules and power generation tiles associated therewith are provided. Each satellite module and/or power generation tile may be formed of a compactable structure and deployment mechanism capable of reducing the payload area required to deliver the satellite module to an orbital
(Continued)

formation within the space-based solar power station and reliably deploy it once in orbit.

31 Claims, 55 Drawing Sheets

Related U.S. Application Data filed on May 14, 2014, provisional application No. 61/993,957, filed on May 15, 2014, provisional application No. 61/993,037, filed on May 14, 2014, provisional application No. 62/006,604, filed on Jun. 2, 2014, provisional application No. 62/120,650, filed on Feb. 25, 2015.

(51) Int. Cl.

| | |
|---|---|
| *B64G 1/44* | (2006.01) |
| *H01L 31/042* | (2014.01) |
| *H02S 10/40* | (2014.01) |
| *H02S 40/38* | (2014.01) |
| *B64G 1/10* | (2006.01) |
| *B64G 1/42* | (2006.01) |
| *H02S 40/36* | (2014.01) |
| *H02S 40/42* | (2014.01) |
| *H02J 50/80* | (2016.01) |
| *H02J 50/90* | (2016.01) |
| *H02J 50/23* | (2016.01) |
| *H02S 20/30* | (2014.01) |
| *H02S 30/10* | (2014.01) |
| *B64G 1/28* | (2006.01) |
| *B64G 1/36* | (2006.01) |
| *B64G 1/40* | (2006.01) |
| *B64G 1/66* | (2006.01) |

(52) U.S. Cl.
CPC .............. *B64G 1/44* (2013.01); *B64G 1/443* (2013.01); *H01L 31/042* (2013.01); *H02J 50/23* (2016.02); *H02J 50/80* (2016.02); *H02J 50/90* (2016.02); *H02S 10/40* (2014.12); *H02S 20/30* (2014.12); *H02S 30/10* (2014.12); *H02S 40/36* (2014.12); *H02S 40/38* (2014.12); *H02S 40/42* (2014.12); *B64G 1/283* (2013.01); *B64G 1/286* (2013.01); *B64G 1/288* (2013.01); *B64G 1/36* (2013.01); *B64G 1/401* (2013.01); *B64G 1/403* (2013.01); *B64G 1/405* (2013.01); *B64G 1/406* (2013.01); *B64G 1/407* (2013.01); *B64G 1/66* (2013.01); *B64G 2700/66* (2013.01)

(58) Field of Classification Search
USPC ........................................ 244/159.5; 136/245
See application file for complete search history.

(56) References Cited

U.S. PATENT DOCUMENTS

| | | | |
|---|---|---|---|
| 3,419,433 A | 12/1968 | Luther, Jr. | |
| 3,427,200 A | 2/1969 | Philip et al. | |
| 3,433,677 A | 3/1969 | Robinson et al. | |
| 3,437,527 A | 4/1969 | Iles | |
| 3,457,427 A | 7/1969 | Tarneja et al. | |
| 3,489,915 A | 1/1970 | Richard et al. | |
| 3,530,009 A | 9/1970 | Dick et al. | |
| 3,532,299 A | 10/1970 | Baker et al. | |
| 3,562,020 A | 2/1971 | Blevins | |
| 3,611,652 A | 10/1971 | Rabenhorst et al. | |
| 3,616,528 A | 11/1971 | Goldsmith et al. | |
| 3,627,585 A | 12/1971 | Neville et al. | |
| 3,636,539 A | 1/1972 | Gaddy | |
| 3,698,958 A | 10/1972 | Baker et al. | |
| 3,730,457 A | 5/1973 | Williams et al. | |
| 3,735,943 A | 5/1973 | Fayet et al. | |
| 3,758,051 A | 9/1973 | Williams | |
| 3,781,647 A | 12/1973 | Glaser et al. | |
| 3,785,590 A | 1/1974 | Wentworth | |
| 3,793,082 A | 2/1974 | Roger | |
| 3,805,622 A | 4/1974 | Kinard | |
| 3,809,337 A | 5/1974 | Andrews et al. | |
| 3,817,477 A | 6/1974 | Okumura et al. | |
| 3,848,821 A | 11/1974 | Scheel et al. | |
| 3,863,870 A | 2/1975 | Andrews | |
| 3,952,324 A | 4/1976 | Wolff et al. | |
| 3,989,994 A | 11/1976 | Brown et al. | |
| 4,078,747 A | 3/1978 | Minovitch et al. | |
| 4,116,258 A | 9/1978 | Slysh et al. | |
| 4,133,501 A | 1/1979 | Pentlicki | |
| 4,151,872 A | 5/1979 | Slysh et al. | |
| 4,153,474 A | 5/1979 | Rex et al. | |
| 4,155,524 A | 5/1979 | Marello et al. | |
| 4,234,856 A | 11/1980 | Jung et al. | |
| 4,282,394 A | 8/1981 | Nordwall et al. | |
| 4,328,389 A | 5/1982 | Peterson et al. | |
| 4,415,759 A | 11/1983 | Copeland et al. | |
| 4,416,052 A | 11/1983 | Stern et al. | |
| 4,419,532 A | 12/1983 | Severns et al. | |
| 4,687,880 A | 8/1987 | Morris et al. | |
| 4,780,726 A | 10/1988 | Archer et al. | |
| 4,784,700 A | 11/1988 | Mildice et al. | |
| 4,789,989 A | 12/1988 | Stern et al. | |
| 4,947,825 A | 8/1990 | Moriarty | |
| 4,953,190 A | 8/1990 | Kukoleck et al. | |
| 5,013,128 A | 5/1991 | Stern et al. | |
| 5,114,101 A | 5/1992 | Stern et al. | |
| 5,131,955 A | 7/1992 | Lawrence et al. | |
| 5,154,777 A | 10/1992 | Stone et al. | |
| 5,180,441 A | 1/1993 | Cornwall et al. | |
| 5,226,107 A | 7/1993 | Stern et al. | |
| 5,280,441 A | 1/1994 | Wada et al. | |
| 5,310,141 A | 5/1994 | Grob et al. | |
| 5,337,980 A | 8/1994 | Homer et al. | |
| 5,344,496 A | 9/1994 | Cornwall et al. | |
| 5,404,868 A | 4/1995 | Sankrithi | |
| 5,428,483 A | 6/1995 | Sato et al. | |
| 5,487,791 A | 1/1996 | Everman et al. | |
| 5,496,414 A * | 3/1996 | Harvey | F24J 2/085 |
| | | | 136/245 |
| 5,512,913 A | 4/1996 | Staney | |
| 5,520,747 A | 5/1996 | Marks et al. | |
| 5,623,119 A | 4/1997 | Yater et al. | |
| 5,653,222 A | 8/1997 | Newman | |
| 5,785,280 A | 7/1998 | Baghdasarian | |
| 5,885,367 A | 3/1999 | Whalen et al. | |
| 5,909,299 A | 6/1999 | Sheldon, Jr. et al. | |
| 5,909,860 A | 6/1999 | Lee et al. | |
| 5,969,695 A * | 10/1999 | Bassily | H01Q 1/08 |
| | | | 343/912 |
| 5,984,484 A | 11/1999 | Kruer | |
| 6,017,002 A | 1/2000 | Stribling, Jr. et al. | |
| 6,031,178 A | 2/2000 | Kester | |
| 6,043,425 A | 3/2000 | Assad et al. | |
| 6,050,526 A | 4/2000 | Stribling et al. | |
| 6,060,790 A | 5/2000 | Craig, Jr. et al. | |
| 6,091,017 A | 7/2000 | Stern et al. | |
| 6,118,067 A | 9/2000 | Lashley et al. | |
| 6,150,995 A * | 11/2000 | Gilger | B64G 1/222 |
| | | | 136/243 |
| 6,188,012 B1 | 2/2001 | Ralph et al. | |
| 6,194,790 B1 | 2/2001 | Griffin et al. | |
| 6,195,067 B1 | 2/2001 | Gilger et al. | |
| 6,284,967 B1 | 9/2001 | Seifert et al. | |
| 6,300,558 B1 | 10/2001 | Takamoto et al. | |
| 6,343,442 B1 | 2/2002 | Marks et al. | |
| 6,366,255 B1 | 4/2002 | Chiang et al. | |
| 6,366,256 B1 | 4/2002 | Ramanujam et al. | |
| 6,369,545 B1 * | 4/2002 | Williams | H02J 7/35 |
| | | | 320/101 |
| 6,394,395 B1 * | 5/2002 | Poturalski | B64G 1/443 |
| | | | 244/172.7 |
| 6,423,895 B1 | 7/2002 | Foster et al. | |

(56) References Cited

U.S. PATENT DOCUMENTS

| | | |
|---|---|---|
| 6,429,368 B1 | 8/2002 | Summers et al. |
| 6,528,716 B2 | 3/2003 | Collette et al. |
| 6,534,705 B2 | 3/2003 | Berrios et al. |
| 6,541,916 B2 | 4/2003 | Decker et al. |
| 6,547,190 B1 | 4/2003 | Lim et al. |
| 6,555,740 B2 | 4/2003 | Roth et al. |
| 6,557,804 B1 | 5/2003 | Carroll et al. |
| 6,560,942 B2 | 5/2003 | Warren et al. |
| 6,565,044 B1 | 5/2003 | Johnson et al. |
| 6,577,130 B1 | 6/2003 | Adamo et al. |
| 6,587,263 B1 | 7/2003 | Chen et al. |
| 6,590,150 B1 | 7/2003 | Kiefer et al. |
| 6,635,507 B1 | 10/2003 | Karam et al. |
| 6,655,638 B2 | 12/2003 | Deel et al. |
| 6,660,927 B2 | 12/2003 | Zwanenburg |
| 6,660,928 B1 | 12/2003 | Sinharoy et al. |
| 6,689,952 B2 | 2/2004 | Kawaguchi et al. |
| 6,690,252 B2 | 2/2004 | Scoltock, Jr. et al. |
| 6,713,670 B2 | 3/2004 | Stern et al. |
| 6,735,838 B1 | 5/2004 | Triller et al. |
| 6,735,920 B1 | 5/2004 | Cadogan et al. |
| 6,768,048 B2 | 7/2004 | Woll et al. |
| 6,784,359 B2 | 8/2004 | Zuckermandel et al. |
| 6,799,742 B2 | 10/2004 | Nakamura et al. |
| 6,882,072 B2 | 4/2005 | Wingett et al. |
| 6,903,261 B2 | 6/2005 | Collette et al. |
| 6,904,749 B2 | 6/2005 | Joshi et al. |
| 6,909,042 B2 | 6/2005 | Viale et al. |
| 6,936,760 B2 | 8/2005 | Spirnak et al. |
| 6,983,914 B2 | 1/2006 | Stribling et al. |
| 7,006,039 B2 | 2/2006 | Miyamoto et al. |
| 7,053,294 B2 | 5/2006 | Tuttle et al. |
| 7,077,361 B1 | 7/2006 | Rabinowitz |
| 7,138,960 B2 | 11/2006 | Carroll et al. |
| 7,163,179 B1 | 1/2007 | Taylor et al. |
| 7,211,722 B1 | 5/2007 | Murphy |
| 7,271,333 B2 | 9/2007 | Yehle et al. |
| 7,301,095 B2 | 11/2007 | Murphy et al. |
| 7,303,166 B2 | 12/2007 | Geery et al. |
| 7,319,189 B2 | 1/2008 | Collette et al. |
| 7,354,033 B1 | 4/2008 | Murphey et al. |
| 7,392,011 B1 | 6/2008 | Jacomb-Hood |
| 7,464,895 B2 | 12/2008 | Palmer et al. |
| 7,474,249 B1 * | 1/2009 | Williams .............. B64G 1/428 |
| | | 342/25 R |
| 7,486,431 B2 | 2/2009 | Rabinowitz et al. |
| 7,564,149 B2 | 7/2009 | Weinbrenner et al. |
| 7,568,479 B2 | 8/2009 | Rabinowitz et al. |
| 7,612,284 B2 | 11/2009 | Spirnak et al. |
| 7,736,007 B2 | 6/2010 | Rabinowitz et al. |
| 7,866,836 B2 | 1/2011 | Rabinowitz et al. |
| 7,878,667 B2 | 2/2011 | Rabinowitz et al. |
| 7,895,795 B1 | 3/2011 | Murphey et al. |
| 7,960,641 B2 | 6/2011 | Rabinowitz |
| 8,071,873 B2 | 12/2011 | Rabinowitz |
| 8,146,867 B2 | 4/2012 | Jordan et al. |
| 8,215,298 B2 | 7/2012 | Klotz |
| 8,308,111 B2 | 11/2012 | Lu et al. |
| 8,439,511 B2 | 5/2013 | Stern et al. |
| 8,616,502 B1 | 12/2013 | Stribling et al. |
| 8,636,253 B1 | 1/2014 | Schmid et al. |
| 8,683,755 B1 | 4/2014 | Spence et al. |
| 8,872,018 B1 | 10/2014 | Breen et al. |
| 9,004,410 B1 | 4/2015 | Stern et al. |
| 9,079,673 B1 | 7/2015 | Stern et al. |
| 9,120,583 B1 | 9/2015 | Spence et al. |
| 9,156,568 B1 | 10/2015 | Spence et al. |
| 9,248,922 B1 | 2/2016 | Baghdasarian et al. |
| 9,276,148 B2 | 3/2016 | Jaffe et al. |
| 9,346,566 B2 | 5/2016 | Spence et al. |
| 9,444,394 B1 | 9/2016 | Thomas et al. |
| 2002/0007845 A1 | 1/2002 | Collette et al. |
| 2002/0029796 A1 | 3/2002 | Mikami et al. |
| 2002/0029797 A1 | 3/2002 | Mikami et al. |
| 2002/0032992 A1 * | 3/2002 | Roth .................. B64G 1/222 |
| | | 52/109 |
| 2002/0134423 A1 * | 9/2002 | Eller .................. B64G 1/222 |
| | | 136/245 |
| 2003/0098057 A1 | 5/2003 | Mizuno et al. |
| 2003/0098058 A1 | 5/2003 | Takada et al. |
| 2003/0192586 A1 | 10/2003 | Takada et al. |
| 2003/0196298 A1 | 10/2003 | Hinkley et al. |
| 2004/0140930 A1 | 7/2004 | Harles et al. |
| 2004/0231718 A1 | 11/2004 | Umeno et al. |
| 2005/0046977 A1 | 3/2005 | Shifman et al. |
| 2005/0178921 A1 | 8/2005 | Stribling et al. |
| 2005/0241691 A1 | 11/2005 | Wakefield et al. |
| 2005/0257823 A1 | 11/2005 | Zwanenburg et al. |
| 2006/0038083 A1 | 2/2006 | Criswell |
| 2006/0109053 A1 | 5/2006 | Kim et al. |
| 2006/0186274 A1 | 8/2006 | Wang et al. |
| 2007/0029446 A1 | 2/2007 | Mosher et al. |
| 2007/0087704 A1 | 4/2007 | Gilberton |
| 2008/0000232 A1 | 1/2008 | Rogers et al. |
| 2008/0088409 A1 | 4/2008 | Okada |
| 2008/0149162 A1 | 6/2008 | Martinelli et al. |
| 2008/0173349 A1 | 7/2008 | Liu et al. |
| 2008/0185039 A1 | 8/2008 | Chan |
| 2008/0251113 A1 | 10/2008 | Horne et al. |
| 2008/0283109 A1 | 11/2008 | Mankins et al. |
| 2009/0126792 A1 | 5/2009 | Gruhlke et al. |
| 2009/0199893 A1 | 8/2009 | Bita et al. |
| 2009/0223554 A1 | 9/2009 | Sharps et al. |
| 2009/0250094 A1 | 10/2009 | Robison et al. |
| 2009/0301544 A1 | 12/2009 | Minelli et al. |
| 2010/0170560 A1 | 7/2010 | Sapienza et al. |
| 2010/0180946 A1 | 7/2010 | Gruhlke et al. |
| 2010/0224231 A1 | 9/2010 | Hoke |
| 2010/0263709 A1 | 10/2010 | Norman et al. |
| 2010/0269885 A1 | 10/2010 | Benitez et al. |
| 2010/0276547 A1 | 11/2010 | Rubenchik et al. |
| 2010/0289342 A1 * | 11/2010 | Maness ............... B64G 1/007 |
| | | 307/104 |
| 2010/0300507 A1 | 12/2010 | Heng et al. |
| 2010/0319774 A1 | 12/2010 | Schwartz et al. |
| 2011/0041894 A1 | 2/2011 | Liao |
| 2011/0049992 A1 | 3/2011 | Sant'Anselmo et al. |
| 2011/0061718 A1 | 3/2011 | Fork et al. |
| 2011/0080135 A1 | 4/2011 | Bland |
| 2011/0100425 A1 | 5/2011 | Osamura et al. |
| 2011/0120524 A1 | 5/2011 | Wares et al. |
| 2011/0203574 A1 | 8/2011 | Harding et al. |
| 2011/0210229 A1 | 9/2011 | Taylor et al. |
| 2011/0232718 A1 | 9/2011 | Nawab |
| 2011/0300664 A1 | 12/2011 | Chung et al. |
| 2011/0315192 A1 | 12/2011 | Swatek et al. |
| 2012/0019942 A1 | 1/2012 | Morgan et al. |
| 2012/0031393 A1 | 2/2012 | Linderman et al. |
| 2012/0125415 A1 | 5/2012 | Tischler et al. |
| 2012/0138749 A1 | 6/2012 | Ellinghaus et al. |
| 2012/0138997 A1 | 6/2012 | Tasaki et al. |
| 2012/0160299 A1 | 6/2012 | Reid et al. |
| 2013/0009851 A1 * | 1/2013 | Danesh ................ H01G 9/20 |
| | | 343/904 |
| 2013/0032673 A1 | 2/2013 | Kobayashi et al. |
| 2013/0093287 A1 | 4/2013 | Biso et al. |
| 2013/0099599 A1 | 4/2013 | Jaffe et al. |
| 2013/0133730 A1 | 5/2013 | Pan et al. |
| 2013/0220399 A1 | 8/2013 | Gruhlke et al. |
| 2013/0233974 A1 | 9/2013 | Maiboroda et al. |
| 2013/0319504 A1 | 12/2013 | Yang et al. |
| 2013/0319505 A1 | 12/2013 | Yang et al. |
| 2013/0332093 A1 | 12/2013 | Adest et al. |
| 2014/0041705 A1 | 2/2014 | Kang et al. |
| 2014/0083479 A1 | 3/2014 | Takayama et al. |
| 2014/0102686 A1 | 4/2014 | Yu et al. |
| 2014/0131023 A1 | 5/2014 | Raman et al. |
| 2014/0148197 A1 | 5/2014 | Shields et al. |
| 2014/0158197 A1 | 6/2014 | Rubenstein et al. |
| 2014/0159636 A1 | 6/2014 | Yang et al. |
| 2014/0261621 A1 | 9/2014 | Gruhlke et al. |
| 2014/0261622 A1 | 9/2014 | Floyd et al. |
| 2014/0263844 A1 | 9/2014 | Cook, Jr. et al. |

(56) References Cited

U.S. PATENT DOCUMENTS

| | | | |
|---|---|---|---|
| 2014/0263847 A1 | 9/2014 | Eskenazi et al. | |
| 2014/0326833 A1 | 11/2014 | Spence et al. | |
| 2014/0356613 A1 | 12/2014 | Weisenberger et al. | |
| 2015/0022909 A1 | 1/2015 | O'Neill | |
| 2015/0053253 A1 | 2/2015 | O'Neill | |
| 2015/0130293 A1 | 5/2015 | Hajimiri et al. | |
| 2015/0144740 A1 | 5/2015 | Richardson et al. | |
| 2015/0155413 A1 | 6/2015 | Pokharna et al. | |
| 2015/0217876 A1* | 8/2015 | Halsband | B64G 1/10 244/172.6 |
| 2016/0056321 A1 | 2/2016 | Atwater et al. | |
| 2016/0065006 A1 | 3/2016 | Woods | |
| 2016/0122041 A1 | 5/2016 | Abrams et al. | |
| 2016/0164451 A1 | 6/2016 | McEnaney et al. | |
| 2016/0380486 A1 | 12/2016 | Hajimiri et al. | |
| 2016/0380580 A1 | 12/2016 | Atwater et al. | |
| 2017/0021947 A1 | 1/2017 | Pellegrino et al. | |
| 2017/0025992 A1 | 1/2017 | Atwater et al. | |
| 2017/0047463 A1 | 2/2017 | Hajimiri et al. | |
| 2017/0047886 A1 | 2/2017 | Atwater et al. | |
| 2017/0047889 A1 | 2/2017 | Atwater et al. | |
| 2017/0047987 A1 | 2/2017 | Pellegrino et al. | |
| 2017/0063296 A1 | 3/2017 | Cruijssen et al. | |

FOREIGN PATENT DOCUMENTS

| | | |
|---|---|---|
| CN | 104158471 A | 11/2014 |
| EP | 0541052 A1 | 5/1993 |
| EP | 0977273 A1 | 2/2000 |
| EP | 976655 B1 | 9/2005 |
| EP | 1852919 A2 | 11/2007 |
| EP | 1852919 A3 | 2/2009 |
| EP | 3325347 A1 | 5/2018 |
| EP | 3334655 A1 | 6/2018 |
| GB | 2247564 A | 3/1992 |
| JP | 05107328 A | 4/1993 |
| JP | 06253477 A | 9/1994 |
| JP | 2001088799 A | 4/2001 |
| JP | 2001309581 A | 11/2001 |
| JP | 2002362500 A | 12/2002 |
| JP | 2003164077 A | 6/2003 |
| JP | 2003164078 A | 6/2003 |
| JP | 2003191899 A | 7/2003 |
| JP | 2004090817 A | 3/2004 |
| JP | 2004196051 A | 7/2004 |
| JP | 2009184603 A | 8/2009 |
| WO | 2004049538 A2 | 6/2004 |
| WO | 2008073905 A2 | 6/2008 |
| WO | 2010033632 A2 | 3/2010 |
| WO | 2011006506 A1 | 1/2011 |
| WO | 2011062785 A2 | 5/2011 |
| WO | 2011067772 A1 | 6/2011 |
| WO | 2011109275 A1 | 9/2011 |
| WO | 2011062785 A3 | 11/2011 |
| WO | 2015175839 | 11/2015 |
| WO | 2015175839 A1 | 11/2015 |
| WO | 2015179213 A2 | 11/2015 |
| WO | 2015179214 A2 | 11/2015 |
| WO | 2015187221 A2 | 12/2015 |
| WO | 2015187739 | 12/2015 |
| WO | 2017015508 | 1/2017 |
| WO | 2017015605 | 1/2017 |
| WO | 2017027615 | 2/2017 |
| WO | 2017027617 | 2/2017 |
| WO | 2017027629 | 2/2017 |
| WO | 2017027633 | 2/2017 |

OTHER PUBLICATIONS

International Preliminary Report on Patentability for International Application PCT/US2015/033841, dated Dec. 6, 2016, dated Dec. 15, 2016, 8 Pgs.

International Preliminary Report on Patentability for International Application PCT/US2016/030909, dated Nov. 15, 2016, dated Nov. 24, 2016, 11 Pgs.

International Search Report and Written Opinion for International Application No. PCT/US2016/043424, completed Nov. 15, 2016, dated Nov. 15, 2016, 14 Pgs.

International Search Report and Written Opinion for International Application No. PCT/US2016/043677, completed Oct. 21, 2016, dated Oct. 21, 2016, 8 Pgs.

International Search Report and Written Opinion for International Application No. PCT/US2016/046389, completed Nov. 22, 2016, dated Nov. 22, 2016, 11 Pgs.

International Search Report and Written Opinion for International Application No. PCT/US2016/046394, completed Nov. 17, 2016, dated Nov. 17, 2016, 12 Pgs.

International Search Report and Written Opinion for International Application No. PCT/US2016/046415, completed Nov. 17, 2016, dated Nov. 17, 2016, 10 Pgs.

International Search Report and Written Opinion for International Application No. PCT/US2016/046421, completed Nov. 17, 2016, dated Nov. 17, 2016, 10 Pgs.

Aieta et al., "Multiwavelength achromatic metasurfaces by dispersive phase compensation", Science, vol. 347, Issue 6228, DOI:10.1126/science.aaa2494, Mar. 20, 2015, pp. 1342-1345.

Aoki et al., "A Fully Integrated Quad-Band GSM/GPRS Power Amplifier", IEEE Journal of Solid-State Circuits, vol. 43, Issue 12, Dec. 12, 2008, pp. 2747-2758.

Bakr et al., "Impact of phase and amplitude errors on array performance", UC Berkeley Technical Report No. UCB/EECS-2009-1. Retrieved from http://www.eecs.berkeley.com/Pubs/TechRpts/2009/EECS-2009-1.html, Jan. 1, 2009, 12 pgs.

Bohn et al., "Fully Integrated Frequency and Phase Generation for a 6-18GHz Tunable Multi-Band Phased-Array Receiver in CMOS", Radio Frequency Integrated Circuits Symposium (RFIC), Apr. 17-Jun. 17, 2008. IEEE, pp. 439-442.

Brongersma et al., "Light management for photovoltaics using high-index nanostructures", Nature Materials, vol. 13, No. 25, May 2014, pp. 451-460.

Callahan et al., "Light trapping in ultrathin silicon photonic crystal superlattices with randomly-textured dielectric incouplers", Optics Express, vol. 21, Issue 25, DOI: 10.1364/OE.21.030315, 2013, pp. 30315-30326.

Campbell et al., "A Pixel Readout Chip for Mrad in Standard 0.25um CMOS", IEEE Transactions on Nuclear Science, vol. 46, issue: 3, Jun. 1999, pp. 156-160.

Cao et al., "A 4.5MGy TID-Tolerant CMOS Bandgap Reference Circuit Using a Dynamic Base Leakage Compensation Technique", IEEE Transactions on Nuclear Science, vol. 60, issue 4, Aug. 2013, pp. 2819-2824.

Geisz et al., "Infrared Reflective and Transparent Inverted Metamorphic Triple Junction Solar Cells", AIP Conference Proceedings, vol. 1277, Issue 11, Oct. 14, 2010, pp. 11-15.

Kaltenbrunner et al., "Flexible high power-per-weight perovskite solar cells with chromium oxide—metal contacts for improved stability in air", Nature Materials, vol. 14, doi:10.1038/nmat4388, Aug. 24, 2015, pp. 1032-1039.

Lacoe, R. C., "Improving Integrated Circuit Performance Through the Application of Hardness-by-Design Methodology", IEEE Transactions on Nuclear Science, vol. 55, issue: 4, Aug. 2008, pp. 1903-1925.

Lamoureux et al., "Dynamic kirigami structures for integrated solar tracking", Nature Communications, DOI:10.1038/ncomms9092, Sep. 8, 2015, pp. 1-6.

Lohmeyer et al., "Correlation of GEO communication satellite anomalies and space weather phenomena: Improved satellite performance and risk mitigation", paper presented at 30th AIAA International Communications Satellite Systems Conference (ICSSC), Ottawa, Canada, Jul. 13, 2012, pp. 1-20.

Messenger et al., "Status of Implementation of Displacement Damage Dose Method for Space Solar Cell Degradation Analyses", 2008 Dd EOL Calc via SPENVIS manuscript SRM2, Jan. 2008, 8 pgs.

Narita et al., "Development of high accuracy phase control method for space solar power system", Proc. IEEE International Microwave

(56) References Cited

OTHER PUBLICATIONS

Workshop Series on Innovative Wireless Power Transmission: Technologies, Systems, and Applications, May 12-13, 2011, p. 227-230.

Nishioka et al., "Evaluation of temperature characteristics of high-efficiency InGaP/InGaAs/Ge triple-junction solar cells under concentration", Solar Energy Materials and Solar Cells, vol. 85, Issue 3, Jan. 31, 2005, pp. 429-436.

O'Brien et al., "The AE9/AP9 Radiation Specification Development", Aerospace Corporation, Sep. 15, 2009, Report No. TOR-2009(3905)-8, 29 pgs.

Petrovic et al., "Design Methodology for Fault Tolerant ASICs", IEEE 15th International Symposium, Design and Diagnostics of Electronic Circuits & Systems (DDECS), Apr. 18-20, 2012, pp. 8-12.

Rephaeli et al., "Ultrabroadband Photonic Structures to Achieve High-Performance Daytime Radiative Cooling", Nano Letters, vol. 13, Mar. 5, 2013, pp. 1457-1461.

Sato et al., "Modeling of degradation behavior of InGaP/GaAs/Ge triple-junction space solar cell exposed to charged particles", Journal of Applied Physics, vol. 105, 2009, pp. 044504-1-044504-6.

Silverman et al., "Outdoor Performance of a Thin-Film Gallium-Arsenide Photovoltaic Module", presented at the 39th IEEE Photovoltaic Specialist Conference, Conference Jun. 16-21, 2013, Tampa, Florida, USA, 6 pgs.

Snoeys et al., "Integrated Circuits for Particle Physics Experiments", IEEE Journal Solid-State Circuits, vol. 35, issue 12, Dec. 2000, pp. 2018-2030.

Wang et al., "A Broadband Self-Healing Phase Synthesis Scheme", Radio Frequency Integrated Circuits Symposium (RFIC), IEEE, Jun. 5-7, 2011, 4 pgs.

International Search Report and Written Opinion for International Application No. PCT/US2015/030895, completed Nov. 27, 2015, dated Nov. 30, 2015, 14 Pgs.

International Search Report and Written Opinion for International Application No. PCT/US2015/030909, completed Nov. 27, 2015, dated Nov. 27, 2015, 13 Pgs.

International Search Report and Written Opinion for International Application PCT/US2015/030900, Completed Aug. 11, 2015, dated Aug. 13, 2015, 11 pgs.

International Search Report and Written Opinion for International Application PCT/US2015/033841, Completed Sep. 10, 2015, dated Sep. 11, 2015, 11 pgs.

Arya et al., "Wrapping Thick Membranes with Slipping Folds", American Institute of Aeronautics and Astronautics, date unknown, pp. 1-17.

Delapierre et al., "Spin-Stabilized Membrane Antenna Structures", American Institute of Aeronautics and Astronautics, date unknown, pp. 1-15.

NASA TV, "Solar Power, Origami-Style", printed Aug. 14, 2014 from http://www.nasa.gov/jpl/news/origami-style-power-20140814, 4 pgs.

Banik et al., "Performance Validation of the Triangular Rollable and Collapsible Mast", Proceedings of the 24th Annual AIAA/USU Conference on Small Satellites, Logan, UT, Aug. 9, 2010, 8 pgs.

Bapanapalli et al., "The Effect of Tool-Part Interactions on the Geometry of Laminated Composites", Washington State University, Jul. 10, 2016.

Biddy et al., "LightSail-1 solar sail design and qualification", Proceedings of the 41st Aerospace Mechanisms Symposium, May 16, 2012, pp. 451-463.

Cahill et al., "Nanoscale thermal transport. II. 2003-2012", Applied Physics Review, Jan. 14, 2014, vol. 1, No. 1, pp. 011305-1-011305-45.

Calladine et al., "The theory of thin shell structures 1888-1988", Proceedings of the Institution of Mechanical Engineers, Part A: Journal of Power and Energy, vol. 202, No. 3, Jan. 7, 1988, pp. 141-149.

Castle Jr., "Heat conduction in carbon materials", 1st Biennial Conference of the American Carbon Society, pp. 13-19, Nov. 2, 1953.

Chen et al., "Planar Heterojunction Perovskite Solar Cells via Vapor-Assisted Solution Process", Journal of the American Chemical Society 136, Dec. 20, 2013, pp. 622-625.

Cheng et al., "Optical metasurfaces for beam scanning in space", Optics Letters, May 1, 2014, vol. 39, No. 9, pp. 2719-2722.

David, "Extraterrestrial mining could reap riches and spur exploration", http://www.space.com/16273-extraterrestrial-mining-asteroids-moon.html, Jun. 25, 2012, 7 pgs.

Du Toit et al., "Advances in the design of Jaumann absorbers", in Antennas and Propagation Society International Symposium, 1990. AP-S. Merging Technologies for the 90's. Digest., May 7, 1990, vol. 3, pp. 1212-1215.

Elfiky et al., "Study the effects of proton irradiation on GaAs/Ge solar cells", 35th IEEE Photovoltaic Specialist Conference, Jul. 2010, pp. 002528-002532.

Emerson, "Electromagnetic wave absorbers and anechoic chambers through the years", IEEE Trans. Antennas Propag., vol. 21, No. 4, Jul. 1973, pp. 484-490.

Eperon et al., "Morphological Control for High Performance, Solution-Processed Planar Heterojunction Perovskite Solar Cells", Advanced Functional Materials 24, first published Sep. 9, 2013, pp. 151-157.

Ersoy et al., "An experimental method to study the frictional processes during composites manufacturing", Composites Part A: Applied Science and Manufacturing, Feb. 19, 2005, vol. 36, No. 11, pp. 1536-1544.

Estvanko et al., "Numerical analysis of a tape spring hinge folded about two axes", Earth and Space 2012 © Engineering, Science, Construction, and Operations in Challenging Environments, ASCE, Jul. 11, 2012, pp. 714-721.

Fallahi et al., "Thin wideband radar absorbers", Transactions on Antennas and Propagation, Nov. 30, 2010, vol. 58, No. 12, pp. 4051-4058.

Fante et al., "Reflection properties of the Salisbury screen", IEEE Transactions on Antennas and Propagation, Oct. 1988, vol. 36, No. 10, pp. 1443-1454.

Fernandez, "Advanced Deployable Shell-Based Composite Booms for Small Satellite Structural Applications Including Solar Sails", International Symposium on Solar Sailing, Jan. 17-20, 2017, Kyoto, Japan, 19 pgs.

Fernlund, "Experimental and numerical study of the effect of cure cycle, tool surface, geometry, and lay-up on the dimensional fidelity of autoclave-processed composite parts", Composites—Part A: Applied Science and Manufacturing, 33(3):341-351, 2002.

Herbeck et al., "Development and test of deployable ultra-lightweight CFRP-booms for a Solar Sail", European Space Agency, (Special Publication) ESA SP, 49(468):107-112, 2001.

Hillebrandt et al., "The Boom Design of the De-Orbit Sail Satellite", European Conference on Spacecraft Structures, Materials and Mechanical Testing, European Conference on Spacecraft Structures, Materials & Environmental Testing, Apr. 1-4, 2014, Braunschweig, Germany., 8 pgs.

Huang et al., "Gate-tunable conducting oxide metasurfaces", Nano Letters, vol. 16, No. 9., web publication date Aug. 26, 2016, pp. 5319-5325.

Irwin et al., "Low-Mass Deployable Spacecraft Booms", AIAA SPACE 2010 Conference & Exposition, pp. 1-11, Aug. 30, 2010.

Jang et al., "Tunable large resonant absorption in a midinfrared graphene Salisbury screen", Physical Review. B, Oct. 8, 2014, vol. 90, No. 16, pp. 165409-1-165409-5.

Kelly, "On Kirchhoff's law and its generalized application to absorption and emission by cavities", Journal of Research of the National Bureau of Standards-B. Mathematics and Mathematical Physics, Jul.-Sep. 1965, vol. 69B, No. 3, pp. 165-171.

Kildishev et al., "Planar Photonics with Metasurfaces", Science, Mar. 15, 2013, vol. 339, No. 6125, pp. 1232009-1-1232009-6.

Knott et al., "Performance Degradation of Jaumann Absorbers Due to Curvature", IEEE Transactions on Antennas and Propagation, Jan. 1980, vol. AP28, No. 1, pp. 137-139.

(56) References Cited

OTHER PUBLICATIONS

Kryder et al., "Heat Assisted Magnetic Recording", Proceeding of the IEEE, current version published Dec. 2, 2008, vol. 96, No. 11, pp. 1810-1835.
Leclerc et al., "Characterization of Ultra-Thin Composite Triangular Rollable and Collapsible Booms", 4th AIAA Spacecraft Structures Conference, AIAA SciTech Forum, Jan. 2017, 15 pgs.
Lee et al., "Non-Destructive Wafer Recycling for Low-Cost Thin-Film Flexible Optoelectronics", Advanced Functional Materials, Apr. 2, 2014, vol. 24, pp. 4284-4291.
Liang et al., "Additive Enhanced Crystallization of Solution-Processed Perovskite for Highly Efficient Planar-Heterojunction Solar Cells", Advanced Materials, Mar. 14, 2014, vol. 26, pp. 3748-3754.
Liu et al., "Microstructure, thermal shock resistance and thermal emissivity of plasma sprayed LaMAl11 O19(M=Mg, Fe) coatings for metallic thermal protection systems", Applied Surface Science, vol. 271, Feb. 6, 2013, pp. 52-59.
Luukkonen et al., "A thin electromagnetic absorber for wide incidence angles and both polarizations", IEEE Transactions on Antennas and Propagation, IEEE Transactions on Antennas and Propagation Jul. 28, 2009, pp. 3119-3125.
Mankins, "A technical overview of the "SunTower" solar power satellite concept", Acta Astronautica, 50(6):369-377, Mar. 1, 2002.
Messenger et al., "Quantifying low energy proton damage in multijunction solar cell", in the proceedings of the 19th Space photovoltaic research and technology conference, 2005, NASA/CP-2007-214494, pp. 8-17.
Miyazawa et al., "Evaluation of radiation tolerance of perovskite solar cell for use in space", Photovoltaic Specialist Conference (PVSC), 2015 IEEE 42nd, New Orleans, LA, USA, Dec. 17, 2015, pp. 1-4, published Jun. 1, 2015.
Mizuno et al., "A black body absorber from vertically aligned single-walled carbon nanotubes", Proc. Natl. Acad. Sci., Apr. 14, 2009, vol. 106, No. 15, pp. 6044-6047.
Narimanov et al., "Reduced reflection from roughened hyperbolic metamaterial", Optics Express, Jun. 17, 2013, vol. 21, No. 12, pp. 14956-14961.
Ni et al., "Metasurface holograms for visible light", Nature Communications, Nov. 15, 2013, vol. 4, pp. 1-6.
NTPT, "NTPT Thin prepreg 402", Data sheet, Version 1.6, May 11, 2017, 5 pgs.
O'Hara, "Mechanical properties of silicone rubber in a closed volume", Technical Report, Army Armament Research and Development Center, Dec. 1983, 21 pgs.
Pellegrino, "AAReST telescope architecture", obtained from http://www.pellegrino.caltech.edu/aarest2/, printed Jul. 5, 2017, 4 pgs.
Penjuri, et al., "Simulation and Testing of Deployable CFRP Booms for Large Space Structures", PhD thesis, Aug. 2011, 118 pgs.
Pors et al., "Analog Computing Using Reflective Plasmonic Metasurfaces", Nano Lett., Dec. 18, 2014, vol. 15, pp. 791-797.
Radford et al., "Measurement of Manufacturing Distortion in Flat Composite Laminates", International Conference on Composite Materials, Jul. 1999, 9 pgs.
Radford et al., "Separating Sources of Manufacturing Distortion in Laminated Composites", Journal of Reinforced Plastics and Composites, first published May 1, 2000, vol. 19, No. 08/2000, pp. 621-641.
Rakic et al., "Algorithm for the determination of intrinsic optical constants of metal films: application to aluminum", Applied Optics, Aug. 1, 1995, vol. 34, No. 22, pp. 4755-4767.
Rakic et al., "Optical Properties of Metallic Films for Vertical-Cavity Optoelectronic Devices", Applied Optics, Aug. 1, 1998, vol. 37, No. 22, pp. 5271-5283.
Raman et al., "Passive radiative cooling below ambient air temperature under direct sunlight", Nature, Nov. 27, 2014, vol. 515, pp. 540-544.
Reha et al., "A Dual-Band Rectangular CPW Folded Slot Antenna for GNSS Applications", International Journal of Advanced Research in Electrical, Electronics and Instrumentation Engineering, Aug. 2014, pp. 11055-11061.
Rephaeli et al., "Absorber and emitter for solar thermo-photovoltaic systems to achieve efficiency exceeding the Shockley-Queisser limit", Optics. Express, Aug. 11, 2009, vol. 17, No. 17, pp. 15145-15159.
Santer et al., "Composite Tube Flexures at Nanosatellite Scale", 4th AIAA Space-craft Structures Conference, Jan. 9-13, 2017, 12 pgs.
Sasaki, "How Japan plans to build an orbital solar farm", printed from https://energy.gov/articles/space-based-solar-power, published Apr. 24, 2014.
Seffen et al., "Deployment dynamics of tape springs", Proceedings of the Royal Society of London A: Mathematical, Physical and Engineering Sciences, Mar. 9, 1999, vol. 455, , pp. 1003-1048.
Shaltout et al., "Time-varying metasurfaces and Lorentz non-reciprocity", Optical Materials Express, Nov. 1, 2015, vol. 5, No. 11, pp. 2459-2467.
Shin-Etsu, "Meeting the increasingly diverse and sophisticated needs of industry with the unique properties of silicone rubbers", Characteristic properties of Silicone Rubber Compounds, 2013, 16 pgs.
Sickinger et al., "Lightweight deployable booms: Design, manufacture, verification, and smart materials application", 55th International Astronautical Congress, Vancouver, Canada, Oct. 4-8, 2004, pp. 1-11.
Sihn et al., "Experimental studies of thin-ply laminated composites", Composites Science and Technology, May 1, 2007, vol. 67, pp. 996-1008.
Silva et al., "Performing Mathematical Operations with Metamaterials", Science, Jan. 10, 2014, vol. 343, No. 6167, pp. 160-163.
Stabile et al., "Coiling dynamic analysis of thin-walled composite deployable boom", Composite Structures, Mar. 29, 2014, vol. 113, pp. 429-436.
Steeves, "Multilayer Active Shell Mirrors", Thesis of John Steeves, May 5, 2015, 164 pgs.
Streyer et al., "Strong absorption and selective emission from engineered metals with dielectric coatings", Optics Express , Apr. 8, 2013, vol. 21, No. 7, pp. 9113-9122.
Stuart et al., "Absorption enhancement in silicon-on-insulator waveguides using metal island films,", Appl. Phys. Lett., Oct. 14, 1996, vol. 69, No. 16, pp. 2327-2329.
Stuart et al., "Island size effects in nanoparticle-enhanced photodetectors", Appl. Phys. Lett., Dec. 28, 1998, vol. 73, No. 26, pp. 3815-3817.
Svanberg et al., "An experimental investigation on mechanisms for manufacturing induced shape distortions in homogeneous and balanced laminates", Composites—Part A: Applied Science and Manufacturing, Jun. 1, 2001, vol. 32, pp. 827-838.
Torayca, "T800H Technical Data Sheet", Technical report No. CFA-007, 2 pgs.
Walker et al., "An investigation of tape spring fold curvature", Proceedings of the 6th International Conference on Dynamics and Control of Systems and Structures in Space, Citeseer, 2004, 10 pgs.
Walters et al., "Spenvis implementation of end-of-life solar cell calculations using the displacement damage dose methodology", in the Proceedings of the 19th Space Photovoltaic Research and Technology Conference, Feb. 1, 2007, 9 pgs.
Weinberg et al., "Radiation and temperature effects in gallium arsenide, indium phosphide, and silicon solar cells", National Aeronautics and Space Administration Technical Memorandum 89870, May 4-8, 1987, 14 pgs., published Feb. 1, 1987.
Wells et al., "Metamaterials-based Salisbury screens with reduced angular sensitivity", Appl. Phys. Lett., Oct. 21, 2014, vol. 105, pp. 161105-1-161105-4.
White et al., "Cure Cycle Optimization for the Reduction of Processing-Induced Residual Stresses in Composite Materials", Journal of Composite Materials, Dec. 1, 1993, vol. 27, No. 14, pp. 1352-1378.
Whorton et al., "Nanosail-D: the first flight demonstration of solar sails for nanosatellites", 22nd AIAA/USU Conference on Small Satellites, Aug. 11, 2008, pp. 1-6.

(56) References Cited

OTHER PUBLICATIONS

Wood, "Space-based solar power", printed Jul. 5, 2017 from https://energy.gov/articles/space-based-solar-power, Mar. 6, 2014, 7 pgs.
Wu et al., "Retarding the crystallization of PbI2 for highly reproducible planar-structured perovskite solar cells via sequential deposition", Energy & Environmental Science 7, Jun. 24, 2014, pp. 2934-2938.
Yamaguchi, "Radiation-resistant solar cells for space use", Solar Energy Materials & Solar Cells, 2001. vol. 68, pp. 31-53.
Yamaguchi et al., "Correlations for damage in diffused-junction InP solar cells induced by electron and proton irradiation", Journal of Applied Physics, May 1, 1997, vol. 81, No. 9, 6013-6018.
Yamaguchi et al., "Mechanism for the anomalous degradation of Si solar cells induced by high fluence 1 MeV electron irradiation", Applied Physics Letters, May 27, 1996, vol. 68, No. 22, pp. 3141-3143.
Yu et al., "A Broadband, Background-Free Quarter-Wave Plate Based on Plasmonic Metasurfaces", Nano Letters, Nov. 3, 2012, vol. 12, No. 12, pp. 6328-6333.
Yu et al., "Flat optics with designer metasurfaces", Nature Materials, published online Feb. 2014, vol. 13, pp. 139-150.
Zhang et al., "Infrared Refractive Index and Extinction Coefficient of Polyimide Films", International Journal of Thermophysics, May 1, 1998, vol. 19, No. 3, pp. 905-916.
Zheng et al., "Metasurface holograms reaching 80% efficiency", Nature Nanotechnology, published online Feb. 23, 2015, pp. 1-6.
Zhu et al., "Radiative cooling of solar cells", Optica, Jul. 22, 2014, vol. 1, pp. 32-38.
Zhu et al., "Radiative cooling of solar absorbers using a visibly transparent photonic crystal thermal blackbody", PNAS, Oct. 6, 2015, vol. 112, pp. 12282-12287.
ATI Industrial, Multi-Axis Force / Torque Sensor, ATI Industrial Automation, Jul. 23, 2014, pp. 1-44.
DuPont Kapton, Mar. 2012, 26 pgs.
Extended European Search Report for European Application No. 15803447.0, Search completed Oct. 17, 2017, dated Oct. 25, 2017, 10 Pgs.
Smooth on, Mold Max® XLS® II, Jan. 15, 2016, 2 pgs.
"AZ Technology | Materials, Paint and Coatings: AZ-93 White Thermal Control, Electrically Conductive Paint / Coating (AZ's Z-93P)", Available http://www.aztechnology.com/materials-coatings-az-93.html, Accessed: Dec. 19, 2016, 2 pgs.
"Corona Resistant Kapton CR Takes Electrical Insulation Design and Reliability to New Levels", Kapton, DuPont Films, H-54506-1.
"DuPont Kapton 100CRC: Technical Data Sheet", kapton.dupont.com, Jul. 2014, K-28402.
"DuPont Kapton 120FWN616B", kapton.dupont.com, K-28459, Sep. 2014.
"DuPont Kapton 150FCRC019", kapton.dupont.com, K-28402, Jun. 2014.
"DuPont Kapton 150FWN019: Magnet Wire Insulation", www.kapton.dupont.com, H-78319-01, Mar. 2005.
"DuPont Kapton 150FWR019: Insulation Substrate", www.dupont.com/kapton, H-78312, Nov. 2001.
"DuPont Kapton 150PRN411", kapton.com, K-28731, Dec. 2014.
"DuPont Kapton 200FWR919: Insulation Substrate", www.dupont.com/kapton, H-78313, Nov. 2001.
"DuPont Kapton 200RS100", kapton.com, K-15354-2, Sep. 2014.
"DuPont Kapton B: Technical Bulletin", kapton.dupont.com, K-25099-1, Jul. 2013.
"DuPont Kapton FCR: Advanced Magnet Wire Insulation", Jun. 2005, H-99888.
"DuPont Kapton FN: Polyimide Film", kapton.com, K-15347-2, Jun. 2015.
"DuPont Kapton FPC: Polyimide Film", kapton.dupont.com, K-15361, Mar. 2006.
"DuPont Kapton GS Polyimide Film: Technical Data Sheet", kapton.dupont.com, K-26875-1, Jul. 2014.
"DuPont Kapton HN:Polyimide Film", kapton.dupont.com, K-15345-1, Apr. 2011.
"DuPont Kapton HPP-ST: Polyimide Film", kapton.dupont.com, K-15357, Mar. 2006.
"DuPont Kapton MT: Technical Data Sheet", kapton.dupont.com, H-38497-3, Apr. 2014.
"DuPont Kapton PST: Polyimide Film", kapton.dupont.com, K-10790, Nov. 2005.
"DuPont Kapton PV9100 Series: Polyimide Films", kapton.dupont.com, K-26028-1_A4, Oct. 2012.
"DuPont Kapton: Polyimide Film", kapton.dupont.com, Mar. 2012, H-38479-9, 7 pgs.
"ESA. Composite material structures.", printed Jun. 29, 2017 from http://www.esa.int/Our_Activities/Space_Engineering_Technology/Structures/Composite_Materials_structures, Oct. 20, 2014, 2 pgs.
"Orbital ATK", Coilable Boom Systems. Technical report, Oct. 18, 1989, 2 pgs.
"Space solar power limitless clean energy from space", National Space Society, printed Jun. 29, 2017 from http://www.nss.org/settlement/ssp/, May 2017, 11 pgs.
Aguirre-Martinez et al., "Development of a Continuous Manufacturing Method for a Deployable Satellite Mast in Cfrp", 15th Reinforced Plastics Congress 1986., (September), pp. 107-110, 1986.
Aieta et al., "Aberration-Free Ultrathin Flat Lenses and Axicons at Telecom Wavelengths Based on Plasmonic Metasurfaces", Nano Lett., Web publication date Aug. 2, 2012, vol. 12, No. 9, pp. 4932-4936.
Amacher et al., "Thin ply composites: Experimental characterization and modeling of size-effects", Composites Science and Technology, Jul. 11, 2014, vol. 101, pp. 121-132.
Andryieuski et al., "Rough metal and dielectric layers make an even better hyperbolic metamaterial absorber", Optics Express, Jun. 11, 2014, vol. 22, No. 12, pp. 14975-14980.
Arai, "Pitch-based carbon fiber with low modulus and high heat conduction", Nippon Steel Technical Report No. 84, Jul. 11, 2001, pp. 12-17.
Arbabi et al., "Multiwavelength polarization insensitive lenses based on dielectric metasurfaces with meta-molecules", Optics, Jan. 22, 2016, vol. 3, Issue 6, pp. 628-633.
Arbabi et al., "Subwavelength-thick lenses with high numerical apertures and large efficiency based on high-contrast transmitarrays", Nature Communications, May 5, 2015, vol. 6, pp. 7069, doi:10.1038/ncomms8069.
Arbabi et al., "Dielectric Metasurfaces for Complete Control of Phase and Polarization with Subwavelength Spatial Resolution and High Transmission", Nature Nanotechnology, Aug. 31, 2015, 27 pgs., doi:10.1038/nnano.2015.186.
Arya, "Packaging and Deployment of Large Planar Spacecraft Structures", Thesis of Manan Arya, May 2, 2016, 131 pgs.
Arya et al., "Ultralight Structures for Space Solar Power Satellites", American Institute of Aeronautics and Astronautics, 2016, pp. 1-18.
Extended European Search Report for European Application No. 15795587.3, Search completed Feb. 5, 2018, dated Feb. 12, 2018, 7 Pgs.
International Preliminary Report on Patentability for International Application PCT/US2016/043424, Report completed Dec. 2, 2017, dated Dec. 15, 2017, 153 Pgs.
International Preliminary Report on Patentability for International Application PCT/US2016/043677, Report dated Jan. 23, 2018, dated Feb. 1, 2018, 6 Pgs.
International Preliminary Report on Patentability for International Application PCT/US2016/046389, Report dated Feb. 13, 2018, dated Feb. 22, 2018, 9 Pgs.
International Preliminary Report on Patentability for International Application PCT/US2016/046394, Report dated Feb. 13, 2018, dated Feb. 22, 2018, 10 Pgs.
International Preliminary Report on Patentability for International Application PCT/US2016/046415, Report dated Feb. 13, 2018, dated Feb. 22, 2018, 8 Pgs.
International Preliminary Report on Patentability for International Application PCT/US2016/046421, Report dated Feb. 13, 2018, dated Feb. 22, 2018, 8 Pgs.

(56) References Cited

OTHER PUBLICATIONS

Vaccaro et al., "In-flight experiment for combined planar antennas and solar cells (SOLANT)", IET Microwaves Antennas & Propaga, vol. 3, No. 8, Dec. 1, 2009, pp. 1279-1287.
International Preliminary Report on Patentability for International Application PCT/US2016/043424, Report dated May 15, 2018, dated May 24, 2018, 12 Pgs.
Extended European Search Report for European Application No. 16835856.2, Search completed Feb. 22, 2019 dated Mar. 1, 2019, 8 Pgs.
Extended European Search Report for European Application No. 16828571.6, Search completed Mar. 18, 2019, dated Mar. 22, 2019, 17 Pgs.

* cited by examiner

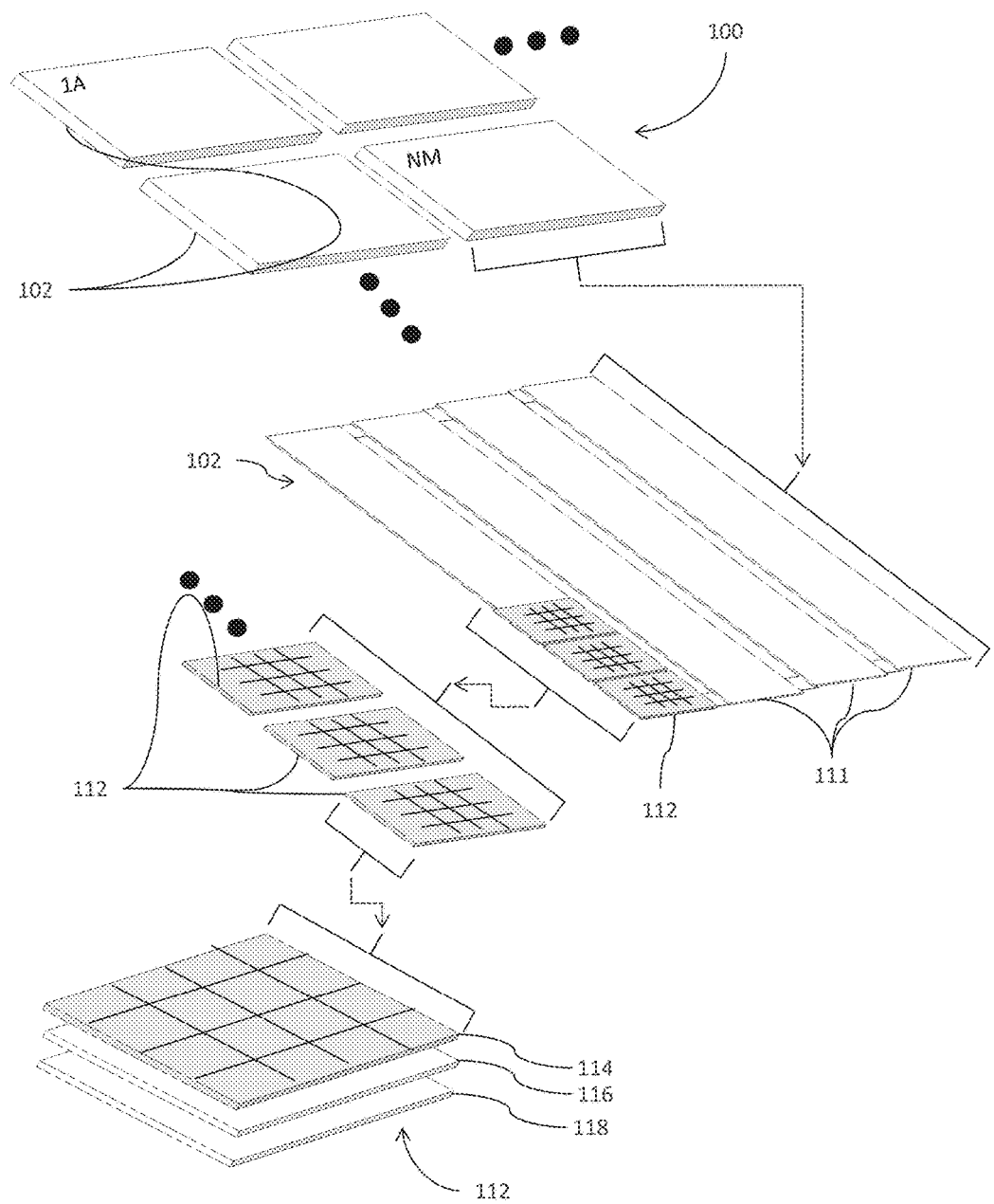

FIG. 4a
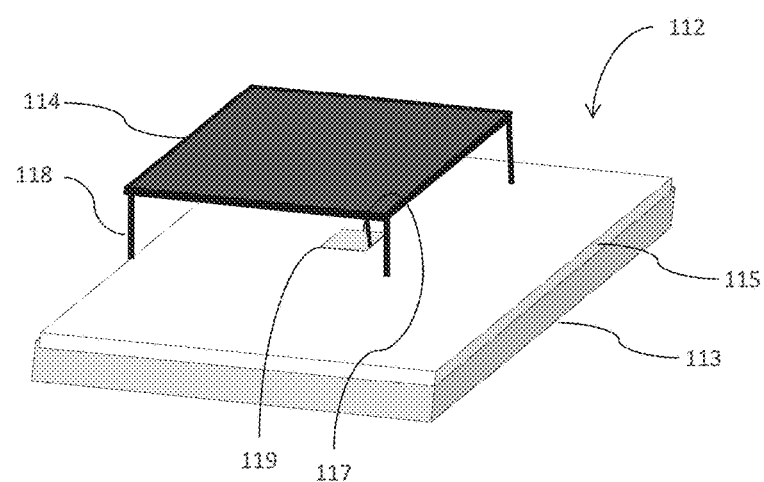
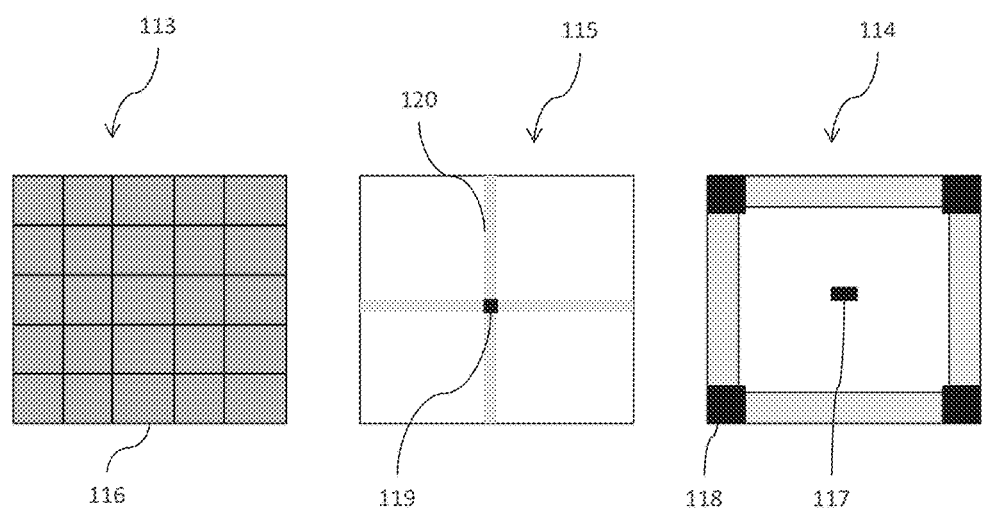

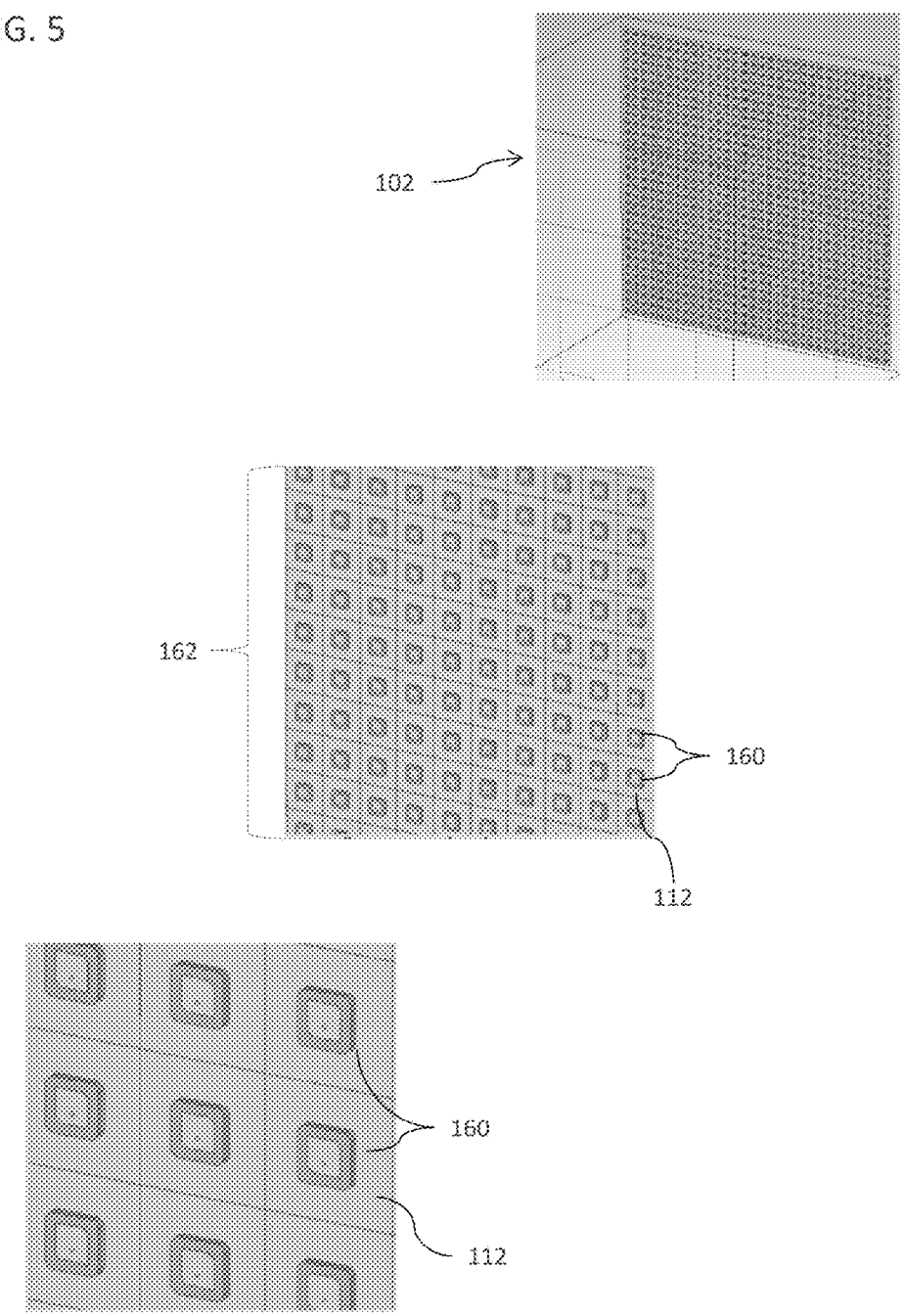

PRIOR ART

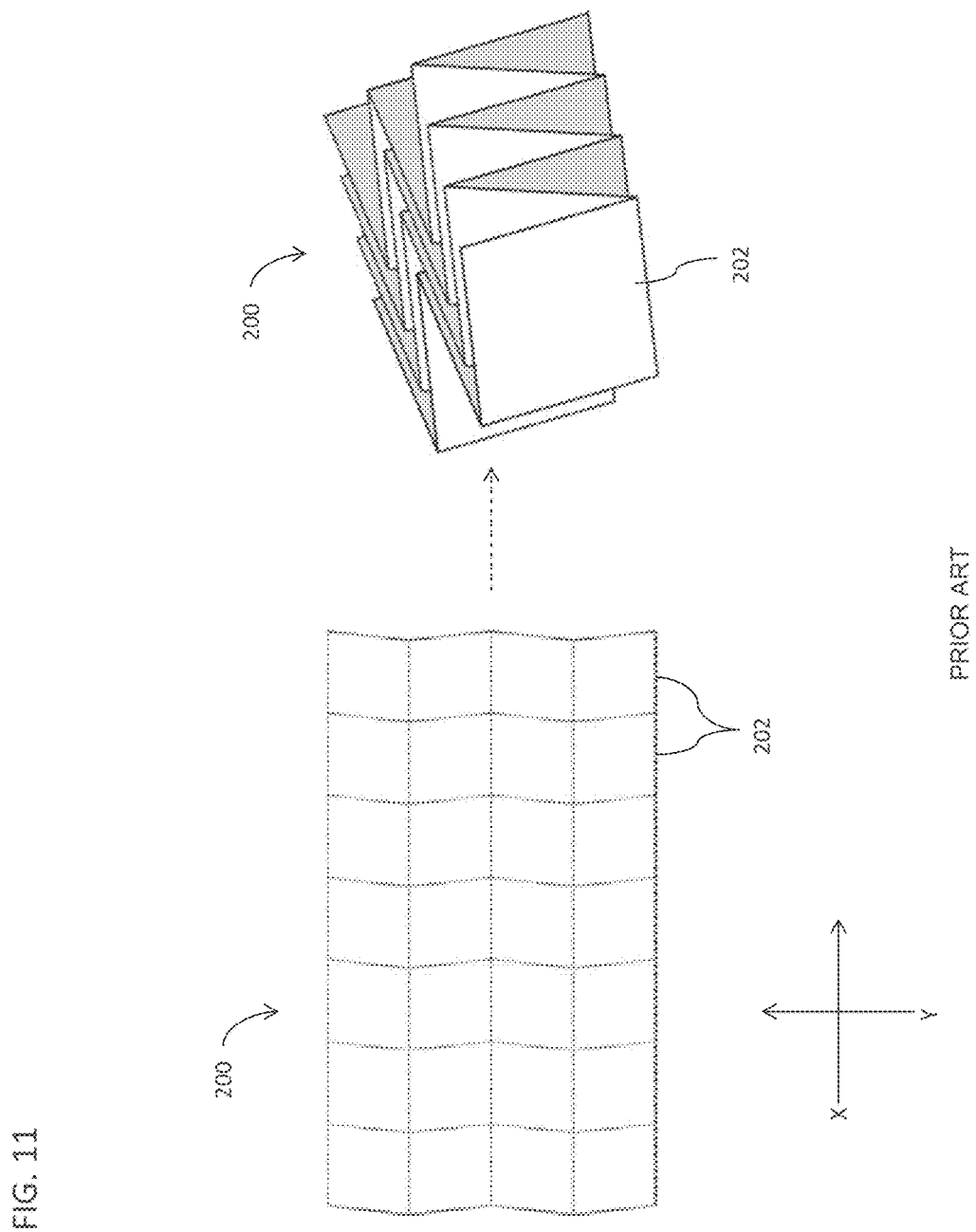

PRIOR ART

Prior Art

FIG. 23a
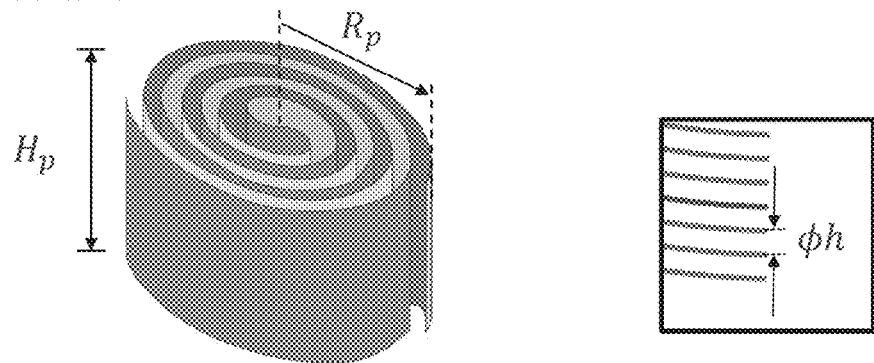
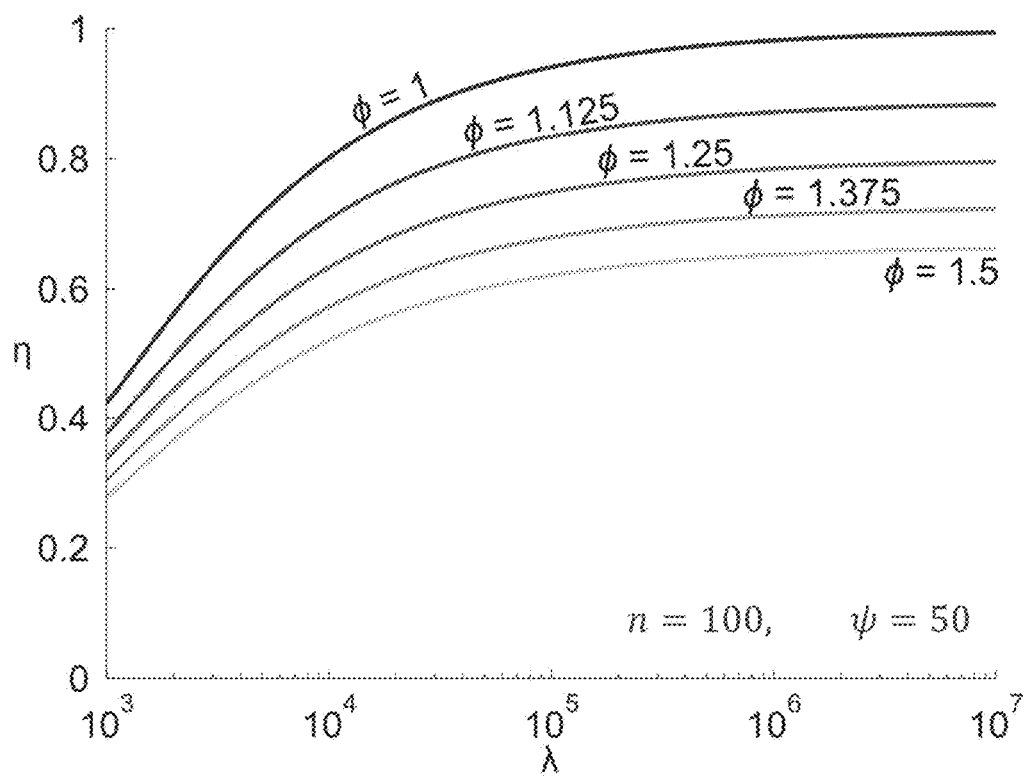

FIG. 23b
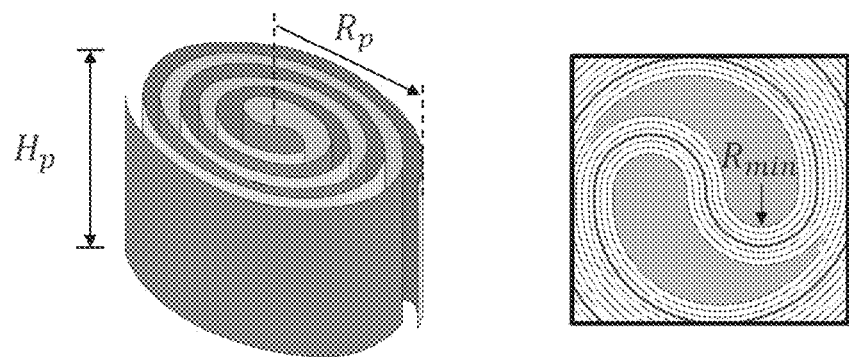
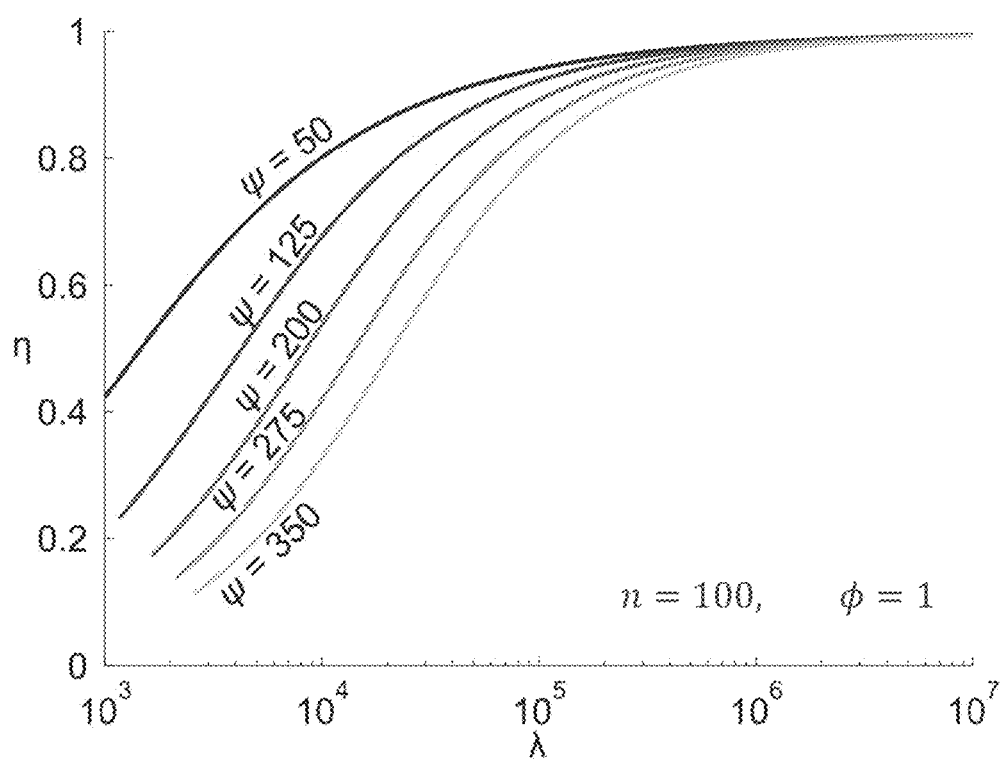

FIG. 27
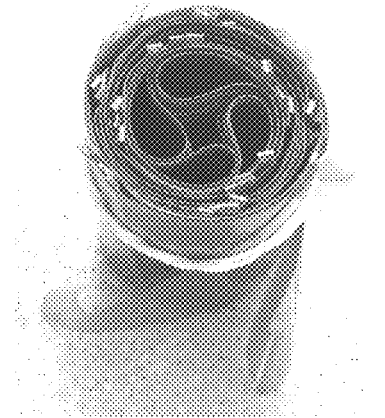
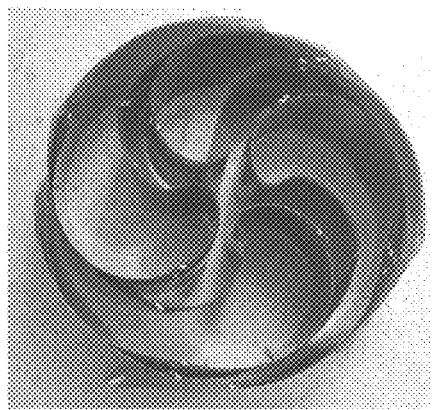

FIG. 34
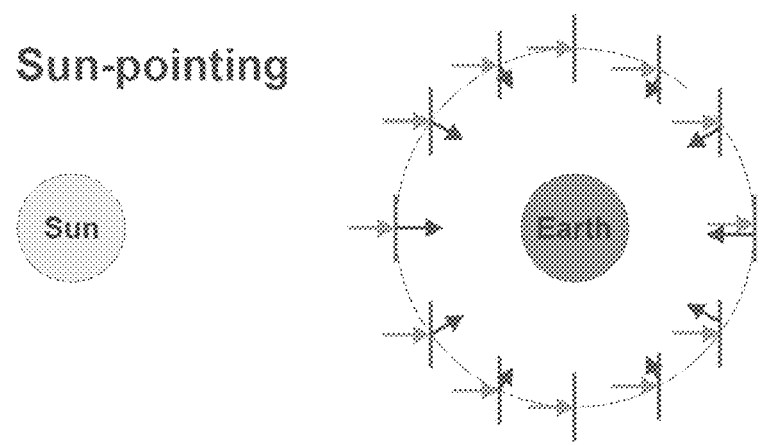
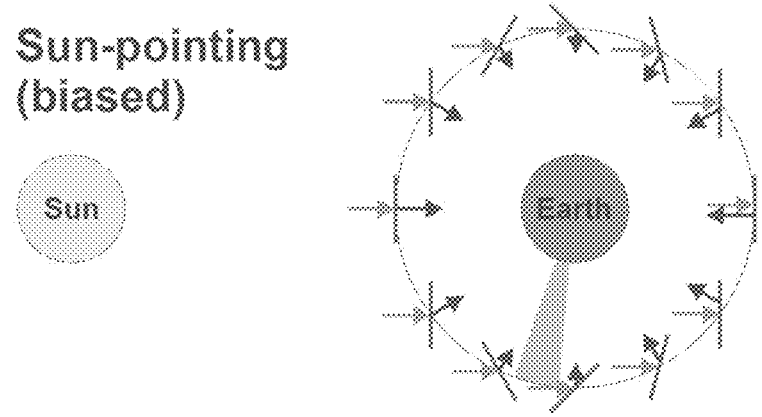

LARGE-SCALE SPACE-BASED SOLAR POWER STATION: PACKAGING, DEPLOYMENT AND STABILIZATION OF LIGHTWEIGHT STRUCTURES

RELATED APPLICATION

This application claims priority to U.S. provisional patent application Ser. No. 61/993,016 entitled "Large-Scale Space-Based Array: Packaging, Deployment and Stabilization of Lightweight Structures," filed on May 14, 2014; U.S. provisional patent application Ser. No. 61/993,025 entitled "Large-Scale Space-Based Array: Multi-Scale Modular Space Power System," filed on May 14, 2014; U.S. provisional patent application Ser. No. 61/993,957 entitled "Large-Scale Space-Based Array: Modular Phased Array Power Transmission," filed May 15, 2014; U.S. provisional patent application Ser. No. 61/993,037 entitled "Large-Scale Space-Based Array: Space-Based Dynamic Power Distribution System," filed May 14, 2014; U.S. provisional patent application Ser. No. 62/006,604 entitled "Large-Scale Space-Based Array: Efficient Photovoltaic Structures for Space," filed Jun. 2, 2014; and U.S. provisional patent application Ser. No. 62/120,650 entitled "Large-Scale Space-Based Array: Packaging, Deployment and Stabilization of Lightweight Structures," filed Feb. 25, 2015, all of which are incorporated by reference herein in their entirety.

FIELD OF THE INVENTION

The present invention is related to a space-based solar power station including lightweight compatible structures for a plurality of solar power satellite modules, more specifically to a modular space-based power station with a plurality of compactable independent solar power satellite modules flown in an orbital formation that by themselves or in unison form a phased and/or amplitude array at radio frequencies for power transmission from space to Earth, each module having a plurality of compatible power generation tiles having integrated photovoltaic cells, antennas, thermal radiator and control circuits in varying configurations; and methods and mechanism for the deployment of such lightweight compatible structures.

BACKGROUND

Space-based solar power (SBSP) describes the collection of solar power in space by a solar-power satellite or a satellite power system (SPS) and then the conversion and transmission of the power to a remote receiver for conversion back to electrical power. In an SBSP system, solar energy is collected as electrical energy on board, powering some manner of wireless power transmission to a receiver located remotely from the SPS. The wireless power transmission application might include a microwave transmitter or laser emitter, which would direct its beam toward a collector, such as a power receiving rectenna at the remote location, such as, on the Earth's surface.

SBSP differs from ground-based solar collection methods in that the means used to collect energy resides on an orbiting satellite instead of on the Earth's surface. Basing such a system in space results in a higher collection rate for the solar energy due to the lack of a diffusing atmosphere. In a conventional ground-based system a large percentage (55-60%) of the solar energy is lost on its way through the atmosphere by the effects of reflection and absorption. Space-based solar power systems convert solar energy to a far-field emission such as microwaves outside the atmosphere, avoiding these losses. In addition, SBSP systems have a longer collection period and the ability to collect solar energy continuously without the downtime (and cosine losses, for fixed flat-plate collectors) that result from the Earth's rotation away from the sun.

A general limitation for SBSP systems is the size of SPS required to generate sufficient electrical power from solar energy. For example, for a 500 MW system a 5 km$^2$ platform may be required. Such a platform would be formed of large satellites on the order to tens to hundreds of tonnes/satellite. The launch costs associated with placing such large structures into orbit reduces the economic viability of such SBSP systems.

SUMMARY

Systems and methods in accordance with various embodiments of the invention provide compatible lightweight structures for a space-based solar power (SBSP) system including compatible lightweight structures for a plurality of solar-power satellite modules. In a number of embodiments, the satellite modules include a plurality of lightweight compatible modular power generation tiles combining at least one photovoltaic cell, a power transmitter and circuitry configured to perform a variety of control functions including (but not limited to) coordinating the participation of the power transmitter in a phased array. Embodiments also provide compatible structures, and methods and mechanisms for deploying such compatible lightweight structures once in a selected operating location. A plurality of the standalone compatible satellite modules may be collocated, deployed into an operating configuration, and flown in any suitable orbital formation in space to collectively constitute the space-based solar power system.

Many embodiments are directed to a space-based solar power station including, a plurality of unconnected compatible satellite modules disposed in space in an orbital array formation, wherein each of the compatible satellite modules including a plurality of structural elements moveably interconnected such that the dimensional extent of the satellite modules in at least one axis is compatible, a plurality of power generation tiles disposed on each of the plurality of moveable elements, each of the power generation tiles having at least one photovoltaic cell and at least one power transmitter collocated thereon, the at least one photovoltaic cell and power transmitter in signal communication such that an electrical current generated by the collection of solar radiation by the at least one photovoltaic cell powers the at least one power transmitter, and where each of the at least one power transmitters including an antenna; and control electronics that controls the phase of a radio frequency power signal that feeds the antenna so that the power transmitter is coordinated with power transmitters on other power generation tiles to form a phased array.

In other embodiments the plurality of structural elements have a finite thickness and are foldable relative to each other by one of the following z-folding, fan-folding, double z-folding, Miura-ori, and slip-folding.

In still other embodiments the folded movably interrelated elements are further compacted by rotationally symmetric wrapping.

In yet other embodiments adjacent structural elements fold together along a fold axis and slip a predetermined distance relative to each other along the fold axis, and wherein at least the edges of the structural elements transverse to the fold axis are continuously interconnected. In some such embodiment material voids are formed along at least portions of the fold axis between the adjacent structural elements. In other such embodiments interconnections are included that bridge the material voids. In still other such embodiments the interconnections comprise one or both ligament folds or hinges. In yet other such embodiments the interconnections are one or more hinges selected from the group consisting of latchable, frictionless, and slippage. In still yet other such embodiments the structural elements are configured to fold along the plurality of fold axes into a stack of a plurality of structural elements compacted along an axis transverse to the fold axis. In still yet other such embodiments the stack of a plurality of structural elements is wrappable into a curved structure having a bend radius at which plastic deformation of the structural elements is avoided. In still yet other such embodiments the bend radius does not exceed a minimum bend radius $R_{min}$ given by:

$$\frac{1}{R_{min}} = \frac{2\sigma_y}{Eh}$$

where h is the thickness of the individual structural elements, E is the material modulus of the structural elements, and $\sigma_y$ yield stress of the structural elements. In still yet other such embodiments the ends of the longitudinal ends of the stack of a plurality of structural elements undergo no slip during wrapping.

In still yet other embodiments the packaging efficiency, of the satellite module when in a compacted state, as determined by the ratio of the packaged volume of the compacted satellite module to the material volume of the satellite module, is greater than 50%.

In still yet other embodiments the dimensionalized length $\lambda$ of the structural elements ranges from $10^3$ to $10^6$ and the spacing $\phi$ between the structural elements in a compacted state is between 1 and 1.5.

In still yet other embodiments each of the plurality of power generation tiles are formed of a plurality of movably interrelated elements such that at least the photovoltaic cell and power transmitter of each power generation tile are movable relative to each other such that the dimensional extent of the power generation tiles are reducible along at least one axis. In some such embodiments the movably interrelated elements of the power generation tiles are interconnected through one or more resilient members. In other such embodiments at least the photovoltaic cell and the power transmitter on each power generation tile are disposed on separate moveable elements such that the moveable elements displace the photovoltaic cell and power transmitter relative to each other such that an offset transverse to the planes of the photovoltaic cell and power transmitter is opened therebetween. In still other such embodiments the separate moveable elements are interconnected through one or more resilient members. In yet other such embodiments the resilient members are springs. In still yet other such embodiments the resilient members are compactable within the plane of the power transmitter. In still yet other such embodiments one or more conductive elements are included that extend between the offset to conductively couple the power transmitter and the photovoltaic cell. In still yet other such embodiments each of the power generation tiles further comprise one or more collectors configured to concentrate incoming solar radiation onto each of the photovoltaic cells, and wherein the collectors are engageable with one or more expandable structures such that the collectors are displaceable into and out of the plane of the photovoltaic cell. In still yet other such embodiments the expandable structures are resilient members.

In still yet other embodiments the structural elements are prestressed such that a tensional force is distributed thereacross, the tensional force being sufficient to resist spatial deformation of the plane of the satellite module. In some such embodiments the prestress tension is distributed across the structural elements by one or more stabilizing boom arms. In other such embodiments the prestress tension is distributed across the structural elements by one or more weighted elements being subject to a centrifugal force applied by the rotation of the satellite module. In still other such embodiments adjacent structural elements are interconnected through slip-folds, and wherein the prestress tension is distributed anisotropically across the plurality of structural elements such that the tension applied along the slip-fold axis is much greater than the tension applied transverse to the slip-fold axis. In yet other such embodiments the edges of the structural elements transverse to the slip-fold axis are continuously interconnected, and wherein the prestress tension is distributed to the plurality of structural elements through the edges of the structural elements. In still yet other such embodiments the edges of the structural elements are disposed in a parabolic profile. In still yet other such embodiments the structural elements comprise an outer supportive frame through which the prestress tension is applied, the power generation tiles being disposed within the outer supportive frame such that no prestress tension is distributed into the power generation tiles.

In still yet other embodiments a deployment mechanism engageable with the at least two structural elements is included to apply a force thereto such that the elements are moved relative to each other on application of the force. In some such embodiments the deployment mechanism comprises one or more elongatable booms. In other such embodiments the deployment mechanism comprises weighted elements, and wherein the force is applied by rotation of the satellite module.

Many other embodiments are directed to a satellite module deployment mechanism including, a cage defining an internal volume configured to contain a slip-wrapped satellite module therein, the cage being comprised of two separable halves of a hollow body, the separable halves further defining two aligned openings accessing the internal volume disposed opposite each other along the line of separation between the two halves, an elongated clip configured to releasably retain a stack of structural elements, the elongated clip being rotatably disposed within the internal volume of the cage and aligned such that the ends of the stack of structural elements of the slip-wrapped satellite module are aligned with the two openings, wherein the clip rotates about an axis within the cage as the ends of the wrapped structural elements of the slip-wrapped satellite module are extended radially outward from the cage, and wherein the halves of the cage are drawn radially outward away from each other as the structural elements of the elongated stack of structural elements of the slip-wrapped satellite module are unfolded outward from the clip axis.

In other embodiments the clip provides a retaining force sufficient such that the plurality of structural elements are unfolded sequentially.

Still many other embodiments are directed to a wrapping guide plug comprising two rotationally symmetric halves of a cylinder having a curved slit running therethrough, wherein the slit has a thickness sufficient to retain a stack of structural elements between the halves of the cylinder such that the ends of structural elements extend beyond the diameter of the cylinder, and wherein the radius of the cylinder is sufficiently large such that wrapping the structural elements about the circumference of the cylinder does not induce a bend radius on the structural elements that exceeds a minimum bend radius that would result in the plastic deformation of one or more of the structural elements.

In other embodiments the structural elements are pre-slipped relative to each other such that when wrapped about the wrapping guide plug the longitudinal ends of the structural elements are aligned.

Yet many other embodiments are directed to methods of packaging and deploying a satellite module of a space-based power station including, providing a plurality of unconnected compactible satellite modules disposed in space in an orbital array formation, wherein each of the compactible satellite modules includes, a plurality of structural elements wherein adjacent structural elements fold together along a fold axis and slip a predetermined distance relative to each other along the fold axis, and wherein at least the edges of the structural elements transverse to the fold axis are continuously interconnected such that the dimensional extend of the satellite modules in at least one axis is compatible, folding the plurality of structural elements together along an axis transverse to the fold axis such that the plurality of structural elements are compacted into a stack having a longitudinal axis and longitudinal ends transverse to the folding axis, symmetrically rotating the two halves of the stack of the plurality of structural elements at the midpoint of the longitudinal length of the stack; and wrapping the symmetrically rotate halves of the stack of the plurality of structural elements into a cylinder wherein the radius of wrapping does not exceed a minimum radius at which the structural elements would be plastically deformed.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF DRAWINGS

The description will be more fully understood with reference to the following figures and data graphs, which are presented as various embodiments of the disclosure and should not be construed as a complete recitation of the scope of the disclosure, wherein:

FIG. 3 conceptually illustrates a large-scale space-based solar power station, a satellite module, and a cross-sectional view of a modular power generation tile, according to one embodiment.

FIG. 4a conceptually illustrates a cross-sectional view of a modular power generation tile, according to one embodiment.

FIG. 5 conceptually illustrates an array of power generation tiles in which the antenna elements of the power generation tiles are configured as a phased array, according to one embodiment.

FIG. 11 conceptually illustrates a compactable satellite module having a biaxial folding configuration.

FIGS. 23a and 23b provide data graphs showing the packaging efficiency of slip-wrapped compactible structures as a function of thickness and wrapping radius, according to embodiments.

FIG. 27 provides images of a star-folded compactible structure, according to embodiments.

FIG. 34 conceptually illustrates the slewing of a solar power station, according to embodiments.

FIG. 49b provides data graphs showing the deploying forces applied to deploy the compactible structure of FIG. 49a.

DETAILED DESCRIPTION

Figure 1:
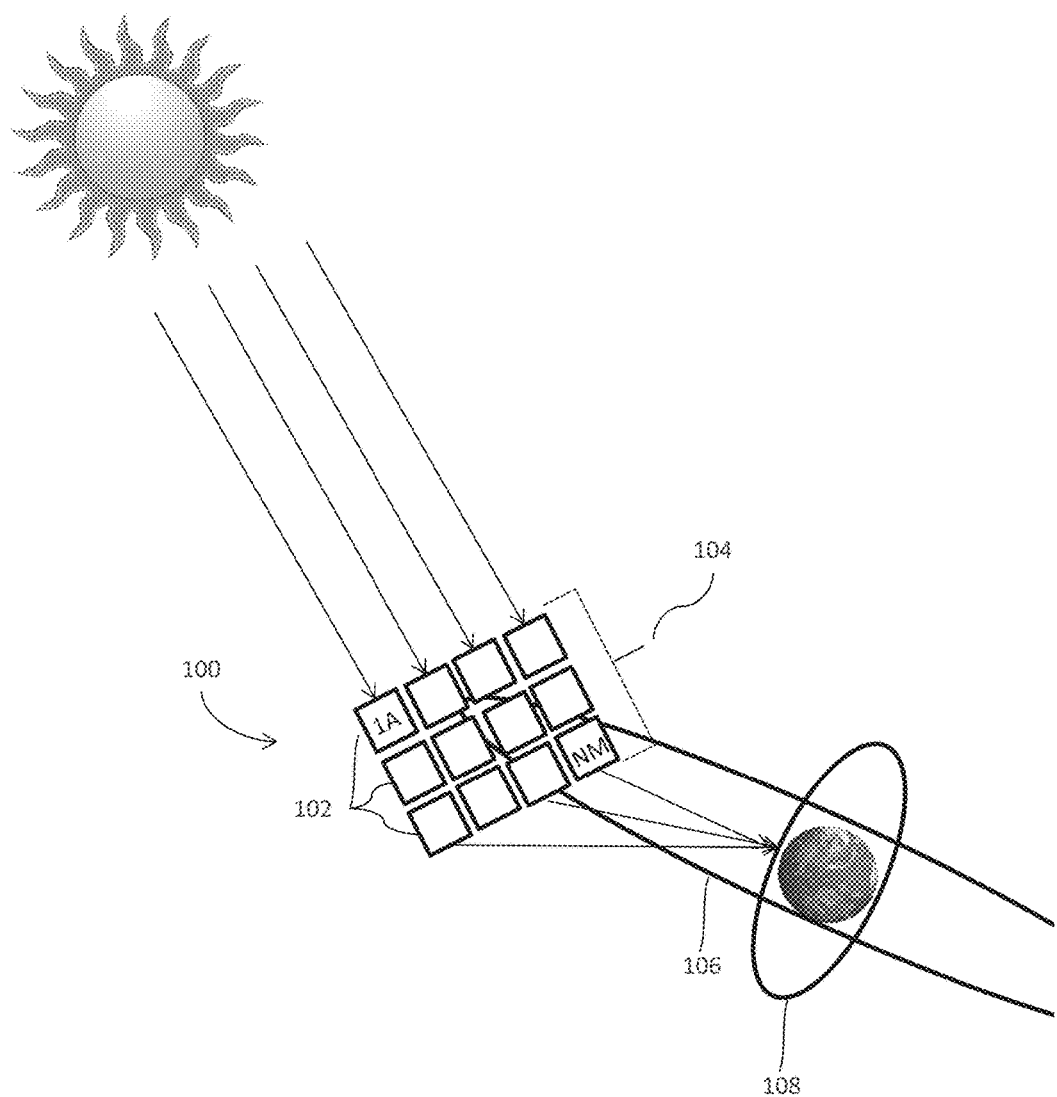
FIG. 1 conceptually illustrates a large-scale space-based solar power station with a plurality of power satellite modules in geosynchronous orbit about the Earth, according to one embodiment.

Turning now to the drawings, compactible lightweight structures for use in large-scale space-based solar power (SBSP) stations in accordance with various embodiments of the invention are illustrated. In many embodiments, the SBSP systems include arrays of independent satellite modules each formed of such compactible structures and incorporating arrays of independent solar electric power generation tiles. In several embodiments, the power generation tiles are each formed from compactible structures incorporating independent photovoltaic cells, power transmitters, and control circuits. Methods for deploying, stabilizing, operating and constructing such large-scale space-based solar power systems in accordance with a number of embodiments of the invention are also described.

A large-scale space-based solar power station is a modular space-based construct that can be formed from a plurality of independent satellite modules placed into orbit within an orbital formation such that the position of each satellite module relative to each other is known. Each of the satellite modules can include a plurality of power generation tiles that capture solar radiation as electrical current and use the current to transmit the energy to one or more remote receivers using power transmitters. In many instances, the transmissions are generated using microwave power transmitters that are coordinated to act as a phased- and/or amplitude array capable of generating a steerable beam and/or focused beam that can be directed toward one or more remote receivers. In other embodiments, any of a variety of appropriate power transmission technologies can be utilized including (but not limited to) optical transmitters such as lasers.

Embodiments relate to lightweight space structures used to construct the modular elements of the solar power station. Some lightweight space structures are used in the construction of the power generation tiles and/or satellite modules and may incorporate movable elements that allow the lightweight space structure to be compacted prior to deployment to reduce the area or dimensional length, height and/or width of the power generation tiles and/or satellite modules prior to deployment. The space structures may be made of any number, size and configuration of movable elements, and the elements may be configured to compact according to any suitable compacting mechanism or configuration, including one or two-dimensional compacting using, among others, z-folding, wrapping, rolling, fan-folding, double z-folding, Miura-ori, slip folding, wrapping, and combinations thereof.

Some embodiments of movable elements are interrelated by hinges, such as, frictionless, latchable, ligament, and slippage hinges, among others. Some embodiments of structures are pre-stressed and/or provided with supportive frameworks to reduce out-of-plane macro- and micro-deformation of the lightweight structures. Structures and modules may include dynamic stabilizing movement (e.g., spinning) during deployment and/or operation. Deployment mechanisms to deploy the compactible lightweight structures into a deployed operational state may be incorporated into or associated with embodiments of the lightweight structures. Some deployment mechanisms may include (but are not limited to) expansive boom arms, centrifugal force mechanisms such as tip masses or module self-mass, among others.

Large-scale spaced-based solar power stations according to many embodiments utilize a distributed approach to capture solar radiation, and to use the energy thus captured to operate power transmitters, which transmit power to one or more remote receivers (e.g., using laser or microwave emissions). The satellite modules of the solar power station can be physically independent structures, each comprising an independent array of power generation tiles. The satellite modules are each placed into a specified flying formation within an array of such satellite modules in a suitable orbit about the Earth. The position of each of the independent satellite modules in space within the orbital array formation is controllable via a combination of station-keeping thrusters and controlled forces from absorption, reflection, and emission of electromagnetic radiation, as well as guidance controls. Using such controllers each of the independent satellite modules may be positioned and maintained within the controlled orbital array formation relative to each of the other satellite modules so that each satellite module forms an independent modular element of the large-scale space-based solar power station. The solar radiation received by each of the power generation tiles of each of the independent satellite module is utilized to generate electricity, which powers one or more power transmitters on each of the power generation tiles. Collectively, the power transmitters on each of the power generation tiles can be configured as independent elements of a phased and/or amplitude-array.

The power generation tiles and/or satellite modules may also include separate electronics to process and exchange timing and control information with other power generation tiles and/or satellite modules within the large-scale space-based solar power station. In many implementations, the separate electronics form part of an integrated circuit that possesses the ability to independently determine a phase offset to apply to a reference signal based upon the position of an individual tile and/or transmitter element. In this way, coordination of a phased array of antennas can be achieved in a distributed manner.

In embodiments of the distributive approach, different array elements of the phased array may be directed to transmit power with different transmission characteristics (e.g., phase) to one or more different remote power receiving collectors (e.g., ground based rectenna). Each satellite module of power generation tiles, or combinations of power generating tiles across one or more satellite modules, may thus be controlled to transmit energy to a different power receiving collector using the independent control circuitry and associated power transmitters.

A photovoltaic cell (PV) refers to an individual solar power collecting element on a power generation tile in a satellite module. The PV includes any electrical device that converts the energy of light directly into electricity by the photovoltaic effect including elements made from polysilicon and monocrystalline silicon, thin film solar cells that include amorphous silicon, CdTe and CIGS cells, multijunction cells, perovskite cells, organic/polymer cells, and various alternatives thereof.

A power transmitter or radiator refers to an individual radiative element on a power generation tile in a satellite module and its associated control circuitry. A power transmitter can include any device capable of converting power in the electrical current generated by the PV to a wireless signal, such as microwave radiation or light, including (but not limited to) a laser, a klystron, a traveling-wave tube, a gyrotron, or suitable transistor and/or diode. A power transmitter may also include suitable transmissive antennas, such as, dipole, patch, helical or spherical antennas, among others.

A phased array refers to an array of power transmitters in which the relative phases of the respective signals feeding the power transmitters are configured such that the effective radiation pattern of the power emission of the array is reinforced in a desired emission direction and suppressed in undesired directions. Phased arrays in accordance with embodiments may be dynamic or fixed, active or passive.

An orbital array formation refers to any size, number or configuration of independent satellite modules being flown in formation at a desired orbit in space such that the position of the satellite modules relative to each other is known such that power generation tiles on each of the satellite modules within the formation serves as an array element in the phased array of the solar power station.

A power generation tile refers to an individual solar power collecting and transmitting element in the phased array of the large-scale space-based solar power station. In many embodiments a power generation tile is a modular solar radiation collector, converter and transmitter that collects solar radiation through at least one photovoltaic cell disposed on the tile, and uses the electrical current to provide power to at least one power transmitter collocated on the same tile that transmits the converted power to one or more remote power receiving collectors. Many of the power generation tiles incorporated within a space-based solar power station include separate control electronics independently control the operation of the at least one power transmitter located on the power generation tile based upon timing, position, and/or control information that may be received from other tiles and/or other modules within the large-scale space-based solar power station. In this way, the separate control electronics can coordinate (in a distributed manner) the transmission characteristics of each of the power generation tiles form a phased array. Each power generation tile may also include other structures such as radiation collectors for focusing solar radiation on the photovoltaic, thermal radiators for regulating the temperature of the power generation tile, and radiation shielding, among other structures.

A satellite module refers to an array of power generation tiles collocated on a single integral space structure. The space structure of the satellite module may be a compactable structure such that the area occupied by the structure may be expanded or contracted depending on the configuration assumed. The satellite modules may include two or more power generation tiles. Each power generation tile may include at least one solar radiation collector and power transmitter. As discussed above, each of the power generation tiles may transmit power and may be independently controlled to form an array element of one or more phased arrays formed across the individual satellite module or several such satellite modules collectively. Alternatively, each of the power generation tiles collocated on a satellite module may be controlled centrally.

A lightweight space structure refers to integral structures of movably interrelated elements used in the construction of the power generation tiles and/or satellite modules that may be configurable between at least packaged and deployed positions wherein the area and or dimensions of the power generation tiles and/or satellite modules may be reduced or enlarged in at least one direction. The lightweight space structures may incorporate or be used in conjunction with deployment mechanisms providing a deploying force for urging the movable elements between deployed and compacted configurations.

A large-scale space-based solar power station or simply solar power station refers to a collection of satellite modules being flown in an orbital array formation designed to function as one or more phased arrays. In embodiments the one or more phased arrays may be operated to direct the collected solar radiation to one or more power receiving collectors.

Transmission characteristics of a power generation tile refer to any characteristics or parameters of the power transmitter of the power generation tile associated with transmitting the collected solar radiation to a power receiving collector via a far-field emission. The transmission characteristics may include, among others, the phase and operational timing of the power transmitter and the amount of power transmitted.

Structure of Large-Scale Space-Based Solar Power Station

A large-scale space-based solar power station including a plurality of satellite modules positioned in an orbital array formation in a geosynchronous orbit about the Earth in accordance with embodiments of the invention is illustrated in FIG. 1. The large-scale space-based solar power station 100 includes an array of independent satellite modules 102. The solar power station 100 is configured by placing a plurality of independent satellite modules 102 into a suitable orbital trajectory in an orbital array formation 104, according to one embodiment. The solar power station 100 may include a plurality of such satellite modules 1A through NM. In one embodiment, the satellite modules 1A through NM are arranged in a grid format as illustrated in FIG. 1. In other embodiments, the satellite modules are arranged in a non-grid format. For example, the satellite modules may be arranged in a circular pattern, zigzagged pattern or scattered pattern. Likewise, the orbit may be either geosynchronous 106, which is typically at an altitude of 35,786 km above the Earth, or low Earth 108, which is typically at an altitude of from 800 to 2000 km above the Earth, depending on the application of the solar power station. As can readily be appreciated, any orbit appropriate to the requirements of a specific application can be utilized by a space-based solar power station in accordance with various embodiments of the invention.

Figure 2:
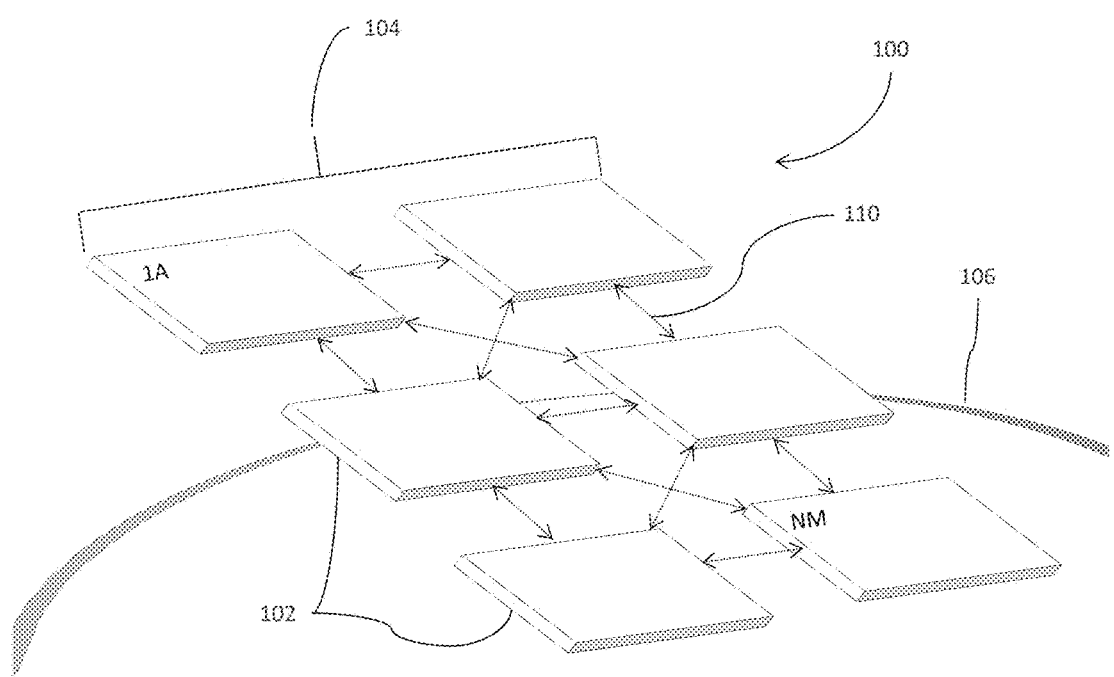
FIG. 2 conceptually illustrates a large-scale space-based solar power station with a plurality of power satellite modules flying in a rectangular orbital formation, according to one embodiment.

In embodiments, the satellite modules in the solar power station are spatially separated from each other by a predetermined distance. By increasing the spatial separation, the maneuverability of the modules in relation to each other is simplified. As discussed further below, the separation and relative orientation of the satellite modules can impact the ability of the power generation tile on each of the satellite modules to operate as elements within a phased array. In one embodiment, each satellite module 1A through NM may include its own station keeping and/or maneuvering propulsion system, guidance control, and related circuitry. Specifically, as illustrated in FIG. 2, each of the satellite modules 102 of the solar power station 100 may include positioning sensors to determine the relative position 110 of the particular satellite module 1A through NM in relation to the other satellite modules 1A to NM, and guidance control circuitry and propulsion system to maintain the satellite module in a desired position within the arbitrary formation 104 of satellite modules during operation of the solar power station. Positioning sensors in accordance with many embodiments can include the use of external positioning data from global positions system (GPS) satellites or international ground station (IGS) network, as well as onboard devices such as inertial measurement units (e.g., gyroscopes and accelerometers), and combinations thereof. In several embodiments, the positioning sensors can utilize beacons that transmit information from which relative position can be determined that are located on the satellite modules and/or additional support satellites. The guidance control and propulsion system may likewise include any suitable combination of circuitry and propulsion system capable of maintaining each of the satellite modules in formation in the solar power station array 104. In many embodiments the propulsion system may utilize, among others, one or more of chemical rockets, such as biopropellant, solid-fuel, resistojet rockets, etc., electromagnetic thrusters, ion thrusters, electrothermal thrusters, solar sails, etc. Likewise, each of the satellite modules may also include attitudinal or orientational controls, such as, for example, reaction wheels or control moment gyroscopes, among others.

In many embodiments, as illustrated in FIG. 3, each satellite module 1A through NM of the solar power station 100 comprises a space structure comprised of one or more interconnected structural elements 111 having one or more power generation tiles 112 collocated thereon. Specifically, each of the satellite modules 1A through NM is associated with an array of power generation tiles 112 where each of the power generation tiles of the array each independently collect solar radiation and covert it to electric current. Power transmitters convert the electrical current to a wireless power transmission that can be received by a remote power receiving station. As discussed above, one or more power transmitters on each of a set of power generation tiles can be configured as an element in one or more phased arrays formed by collections of power generation tiles and satellite modules of the overall solar power station. In one embodiment, the power generation tiles in the satellite module are spatially separated from each other by a predetermined distance. In other embodiments, the construction of the satellite modules is such that the power generation tiles are separated by distances that can vary and the distributed coordination of the power generation tiles to form a phased array involves the control circuitry of individual power transmitters determining phase offsets based upon the relative positions of satellite modules and/or individual power generation tiles.

Power generation tiles 112 according to many embodiments include a multicomponent structure including a photovoltaic cell 113, a power transmitter 114, and accompanying control electronics 115 electrically interconnected as required to suit the needs of the power transmission application. As illustrated in FIG. 4a, in some embodiments photovoltaic cells 113, may comprise a plurality of individual photovoltaic elements 116 of a desired solar collection area that may be interconnected together to produce a desired electrical current output across the power generation tile. Some power transmitters 114 include one or more transmission antennas, which may be of any suitable design, including, among others, dipole, helical and patch. In the illustrated embodiment, a conventional patch antenna 114 incorporating a conductive feed 117 to conductively interconnect the RF power from the control electronics 115 to the antenna 114. As can readily be appreciated the specific antenna design utilized is largely dependent upon the requirements of a specific application. Some power transmitters 114 are physically separated from one or both of the photovoltaic cell 113 and/or the control electronics 115 such as by fixed or deployable spacer structures 118 disposed therebetween. Some control electronics 115 may include one or more integrated circuits 119 that may control some aspect of the power conversion (e.g., to a power emission such as collimated light or an radio frequency (RF) emission such as microwave radiation), movement and/or orientation of the satellite module, inter- and intra-satellite module communications, and transmission characteristics of the power generation tile and/or satellite module. Further conductive interconnections 120 may connect the control electronics 115 to the source power of the photovoltaic cell 113. Each of the power generation tiles may also include thermal radiators to control the operating temperature of each of the power generation tiles.

Figure 4B:
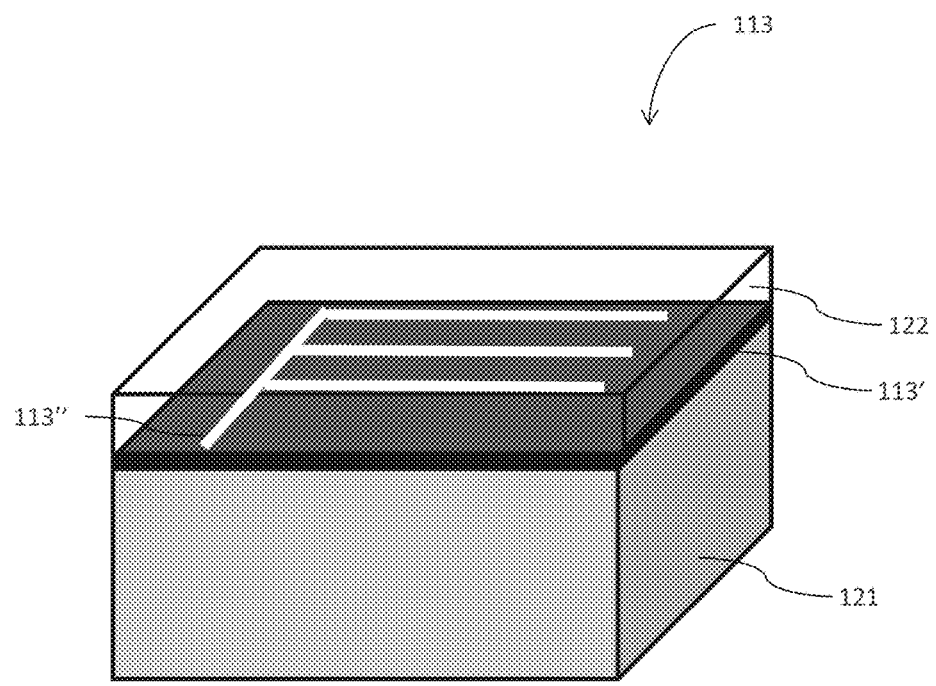
FIG. 4b conceptually illustrates a cross-sectional view of a photovoltaic cell, according to one embodiment.

In some embodiments, the PV 113 is a multi-layer cell, as illustrated in FIG. 4b, incorporating at least an absorber material 113' having one or more junctions 113" disposed between a back contact 121 on a back side of the absorber material and a top radiation shield 122 disposed on the surface of the absorber material in the direction of the incident solar radiation. The PV may include any electrical device that converts the energy of light directly into electricity by the photovoltaic effect including elements made from polysilicon and monocrystalline silicon, thin film solar cells that include amorphous silicon, CdTe and CIGS cells, multijunction cells, perovskite cells, organic/polymer cells, and various alternatives thereof. In some embodiments the made from a thin film of GaInP/GaAs that is matched to the solar spectrum. Radiation shielding may include a solar radiation transparent material such as $SiO_2$, among others. The back contact may be made of any suitable conductive material such as a conductive material like aluminum, among others. The thickness of the back contact and top radiation shield may be of any thickness suitable to provide radiation shielding to the PV. Additional structures may be provided around the PV to increase the efficiency of the absorption and operation of the device including, for example, one or more concentrators that gather and focus incoming solar radiation on the PV, such as a Cassegrain, parabolic, nonparabolic, hyperbolic geometries or combinations thereof. The PV may also incorporate a temperature management device, such as a radiative heat sink. In some embodiments the temperature management device is integrated with the control electronics and may be configured to control the operating temperature of the PV within a range of from ~150 to 300 K.

In a number of embodiments, the power transmitters that are components of power generation tiles are implemented using a combination of control circuitry and one or more antennas. The control circuitry can provide the power generation tile with the computational capacity to determine the location of the power generation tile antenna(s) relative to other antennas within the satellite module and/or the solar power station. As can readily be appreciated, the relative phase of each element within a phased array is determined based upon the location of the element and a desired beam direction and/or focal point location. The control circuitry on each power generation tile can determine an appropriate phased offset to apply to a reference signal using a determined location of the power generation tile antenna(s) and beam-steering information. In certain embodiments, the control circuitry receives position information for the satellite module and utilizes the position information to determine the location of the power generation tile antenna(s) and determine a phase offset to apply to a reference signal. In other embodiments, a central processor within a satellite module can determine the locations of antennas on power generation tiles and/or phase offsets to apply and provides the location and/or phase offset information to individual power generation tiles.

In many embodiments, the positional information of each tile is received from partially redundant systems, such as, but not limited to, gyroscopes, accelerometers, electronic ranging radar, electronic positioning systems, phase and/or timing information from beacons, as well as employing a priori knowledge from system steering and flight control commands. In several embodiments, electronic systems are located on the ground, and/or in space on satellites deployed for this purpose (and, possibly, other purposes, e.g. in the case of using GPS satellites).

In a number of embodiments, position information may be relayed in a hierarchical fashion between modules, panels and/or tiles within the space-based solar power station, such that a central processing unit relays positional information such as location and orientation of the entire space-based solar power station with respect to a ground station and/or other suitable known locations to modules within the system. The relayed information can be expressed as an absolute and/or differential location(s), and/or orientation(s) as appropriate to the requirements of specific applications. In a similar fashion, the location and/or orientation of each module with respect to the center of the space-based solar power station or other suitable reference point can be determined at each module using processes similar to those outlined above. Furthermore, going down a hierarchical level, the position and orientation information of individual panels and tiles can be determined in a similar fashion. The entirety or any useful part of this information can be used at the tile-level, the panel-level, the module-level, the system-level and/or any combination thereof to control the phase and/or amplitude of each tile radiator to form a beam or focal spot on the ground. The aggregate computational power of the computational resources of each tile, panel and/or module can be utilized since each tile (and/or panel or module) can utilize its local computational power available from a DSP, microcontroller or other suitable computational resource to control its operation such that the system in aggregate generates the desired or close-to desired beam and/or focused transmission.

Figure 4C:
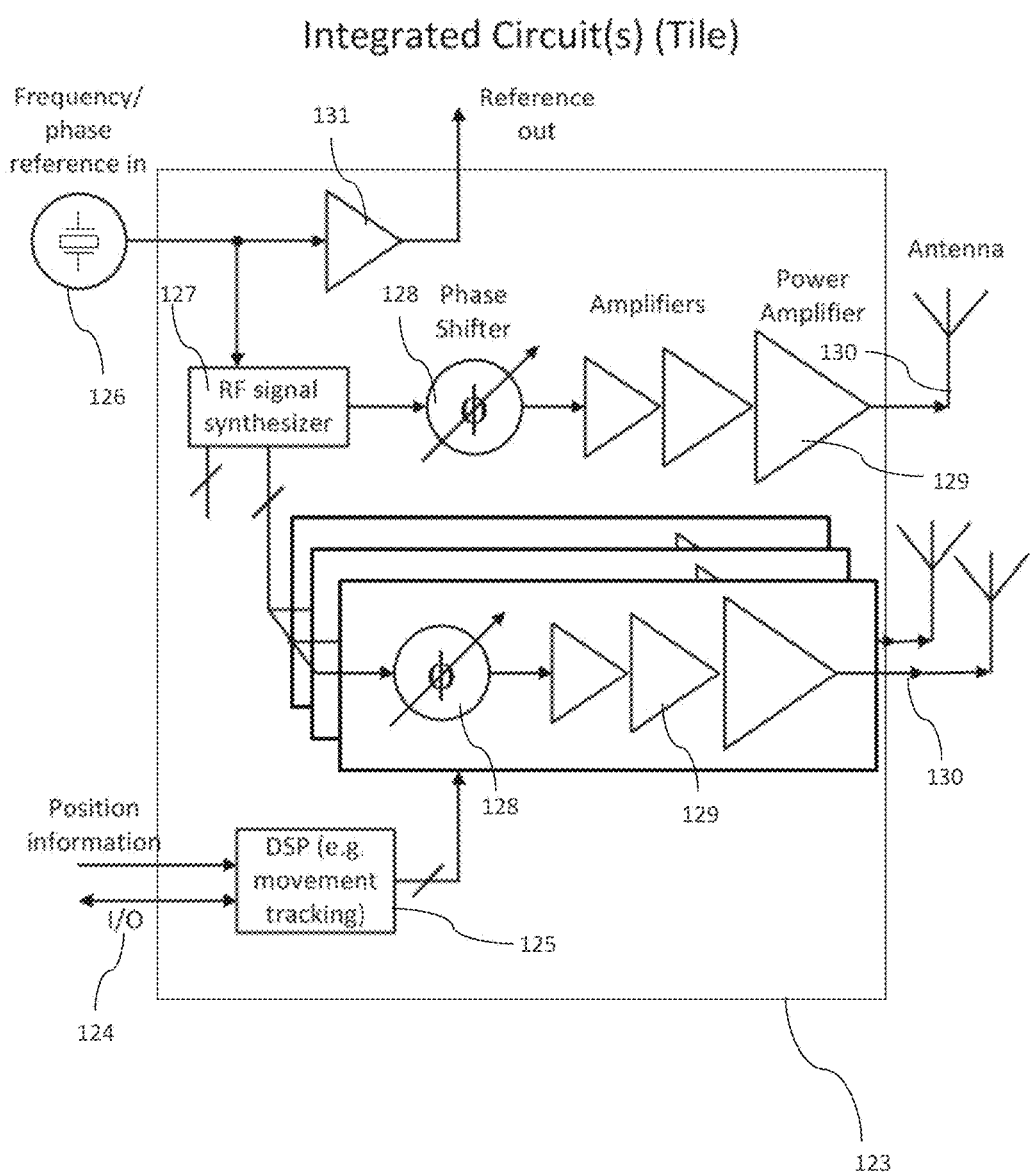
FIG. 4c conceptually illustrates a block-diagram for an integrated circuit suitable for utilization in a power transmitter forming part of a power generation tile, according to one embodiment.

In various embodiments, as illustrated conceptually in FIG. 4c, power generation tile control circuitry can be implemented using one or more integrated circuits. An integrated circuit 123 can include an input/output interface 124 via which a digital signal processing block 125 can send and receive information to communicate with other elements of a satellite module, which typically includes a processor and/or memory configured by a control application. In certain embodiments, the digital signal processing block 125 receives location information (see discussion above) that can be utilized to determine the location of one or more antennas. In many embodiments, the location information can include a fixed location and/or one or more relative locations with respect to a reference point. The digital signal processing block can utilize the received location information and/or additional information obtained from any of a variety of sensors including (but not limited to) temperature sensors, accelerometers, and/or gyroscopes to determine the position of one or more antennas. Based upon the determined positions of the one or more antennas, the digital signal processing block 125 can determine a phase offset to apply to a reference signal 126 used to generate the RF signal fed to a specific antenna. In the illustrated embodiment, the integrated circuit 500 receives a reference signal 126, which is provided to an RF synthesizer 127 to generate an RF signal having a desired frequency. The RF signal generated by the RF synthesizer 127 is provided to one or more phase offset devices 128, which are configured to controllably phase shift the RF signal received from the RF synthesizer. The digital signal processing block 125 can generate control signals that are provided to the phase offset device(s) 128 to introduce the appropriate phase shifts based upon the determined location(s) of the one or more antennas. In many embodiments, the amplitude of the generated signal can be modulated and/or varied alone or in conjunction with the phase appropriately upon the determined locations to form the power beam and/or focused transmission. The amplitude can be modulated in variety of ways such as at the input of a power amplifier chain via a mixer or within an amplifier via its supply voltage, an internal gate or cascade biasing voltage. As can readily be appreciated, any of a variety of techniques appropriate to the requirements of a specific application can be utilized to amplitude modulate an RF signal in accordance with various embodiments of the invention. The phase shifted RF signals can then be provided to a series of amplifiers that includes a power amplifier 129. While the entire circuit is powered by the electric current generated by the PV component(s) of the power generation tile, the power amplifier is primarily responsible for converting the DC electric current into RF power that is transmitted via the RF signal. Accordingly, the power amplifier increases the amplitude of the received phase shifted RF signal and the amplified and phase shifted RF signal is provided to an output RF feed 130 connected to an antenna. In many embodiments, the RF signal generated by the RF synthesizer is provided to an amplifier 131 and distributed to the control circuitry of other tiles. The distribution of reference signals between tiles in a module in accordance with various embodiments of the invention is discussed further below.

Although specific integrated circuit implementations are described above with reference to FIG. 4c, power generation tile control circuitry can be implemented using any of a variety of integrated circuits and computing platforms in accordance with various embodiments. Furthermore, satellite modules can be implemented without providing computational capabilities on each power generation tile and/or without utilizing the computational capabilities of a power generation tile to determine locations and/or phase shifts for the purposes of generating an RF signal to feed a power generation tile antenna.

In many embodiments, as illustrated conceptually in FIG. 5, a plurality of power generation tiles 112 on each satellite module may each form a panel 160 of a modular phased array 162 incorporating at least self-contained, collocated photovoltaics, power transmitters and control electronics within each power generation tile. The control electronics may allow for wire or wireless communications between the individual power generation tiles for the exchange of timing and control information. The array of control electronics may also allow for the exchange of control and timing formation with other satellite modules. Collocation of at least the power collection, far-field conversion, and transmission elements on each modular power generation tile allows for the each power generation tile to operate as an independent element of the phased array without inter- and intra-module power wiring.

In one embodiment, the power generation tiles and/or satellite modules may include other related circuitry. The other circuitry may include, among others, circuitry to control transmission characteristics of the power generation tiles, thermal management, inter or intra-module communications, and sensors to sense physical parameters, such as orientation, position, etc. The control circuitry may control transmission parameters such as phase and timing information such that the arrays of power generation tiles across each module and across the solar power station may be operated as independent array elements of one or more phased arrays. The sensors may include inertial measurement units, GPS or IGS devices to estimate position and orientation, and thermocouples to estimate the temperature on the power generation tiles.

In one embodiment, the circuits for controlling transmission characteristic parameters may be collocated on the several power generation tiles or satellite modules and may control each transmitter of each power generation tile independently or in a synchronized manner such that the tiles operate as one or more element of one or more phased arrays. Reference signals (e.g., phase and timing) that can be used to synchronize the operation of the power generation tiles as a phased array may be generated locally on each power generation tile or satellite module and propagated via wired or wireless intra and inter-module communications links, or may be generated centrally from a single source on a single satellite module and propagated via wired or wireless intra and/or inter-module communications links across each of the satellite modules and power generation tiles. In addition, one or multiple timing reference signals may be generated from outside the space-based solar power station system such as one or more satellites flying in close proximity or even in different orbits; as well as from one or more ground stations.

Each power generation tile or satellite module may be operated independently or collectively as an element in a phased array. Entire or most operations associated with each individual power generation tile may be collocated on each of the power generation tiles or collectivized within the satellite module on which the power generation tiles are collocated, or across multiple satellite modules. In one embodiment, a central reference signal is generated and deviation (e.g., phase) from such reference signal is determined for each power generation tile array element of the phased array. By propagating a central reference signal from the reference signal, higher levels of control abstraction can be achieved to facilitate simpler programming for many operations of the phased array.

In some embodiments, each power generation tile of each satellite module may be the same or different. The number of distinct combinations of photovoltaic cells, transmission modules and control electronics may be as large as the number of power generation tiles in the satellite modules. Further, even where each of the power generation tiles on a satellite module are the same, each of the satellite modules 1A through NM or a group of satellite modules may have different solar radiation collection or transmission characteristics or may have arrays of power generation tiles of different sizes, shapes and configurations.

In embodiments, the solar power station is designed as a modular phased array where the plurality of satellite modules and power generation tiles located thereon form the array elements of the phased array. For this purpose, each of the satellite modules may be designed to be physically compatible with conventional launch vehicles although the achieved power generation of the phased array of the solar power station may exceed conventional space-based solar power satellites in many respects. Taking advantage of the increased performance, the solar power station phased array of the embodiment may include smaller payload size and overall array size to obtain equal or better power generation compared to conventional space-based solar power satellites. Alternatively, the size of the overall solar power station may be reduced compared to solar platforms in conventional solar power satellites while achieving comparable results.

In order to match the power generation of a conventional solar power satellite without increasing platform size or weight, the power collection, transmission and control logic for the individual power generation tiles is preferably collocated within each of the power generation tiles or within the satellite module on which the power generation tiles are collocated thus eliminating the need for intra- or inter-module communications, wiring or structural interconnection. In one embodiment, much of the power transmission control logic is a single collection of functions common to all or most of the power generation tiles. In this embodiment, the conventional external intra- and inter-power generation tile infrastructure for the solar power station may be entirely eliminated thus reducing the power generated per weight unit (W/kg).

In one embodiment, the phased array of the solar power station including the satellite modules and power generation tiles replaces a conventional monolithic solar power satellite. The solar power station includes N×N satellite modules, each module including power generation tiles of $$\frac{M}{N^2}.$$

Figure 6:
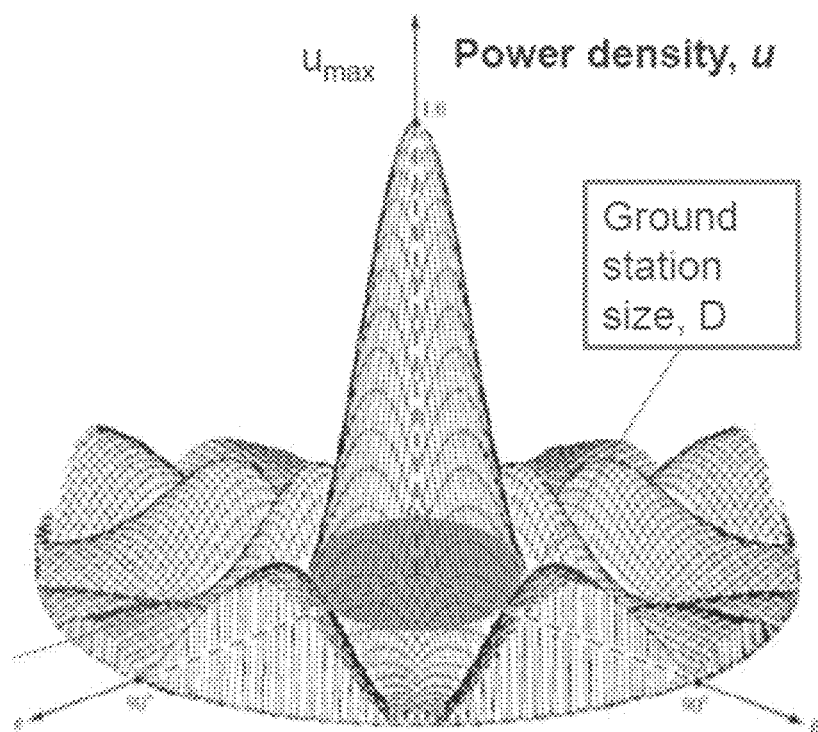
FIG. 6 conceptually illustrates the power density distribution at a ground receiver from a transmission of power from a phased array of antennas on a solar power station, according to embodiments.

Table 1 lists example configurations of solar power stations according to embodiments replacing conventional solar power stations.

the solar power station may be determined based on, among other factors, power requirements, payload restrictions, etc. A first factor for the size of an overall solar power station is the power to be generated at the power receiving rectenna. As illustrated in FIG. 6, in embodiments the power incident on the ground using a far-field RF emission can have a maximum power lobe ($u_{max}$) that is dependent on factors including (but not limited to) the size of the array, the wavelength of the RF transmission, and the phase offset error tolerated within the phased array. For example, in embodiments of a 50×50 array of satellite modules in a solar power station formed by 60×60 m satellite modules a maximum power lobe of 926 W/m² is estimated to be generated on the ground with a sidelobe level of 44 W/m². The incident area of the maximum power lobe with a 1 GHz emission is estimated to have a diameter of 6.6 km, while the incident area is estimated to have a diameter of 2.8 km for a 2.4 GHz emission. From a power transmission point of view, the preferred number of elements in the phased array formed by a solar power station and the wavelength of the transmission will depend on the size of the receiving rectenna and/or array of receiving rectennas. In many embodiments it is desirable to have the maximum power lobe on the ground coextensive with the rectenna area.

Figure 7:
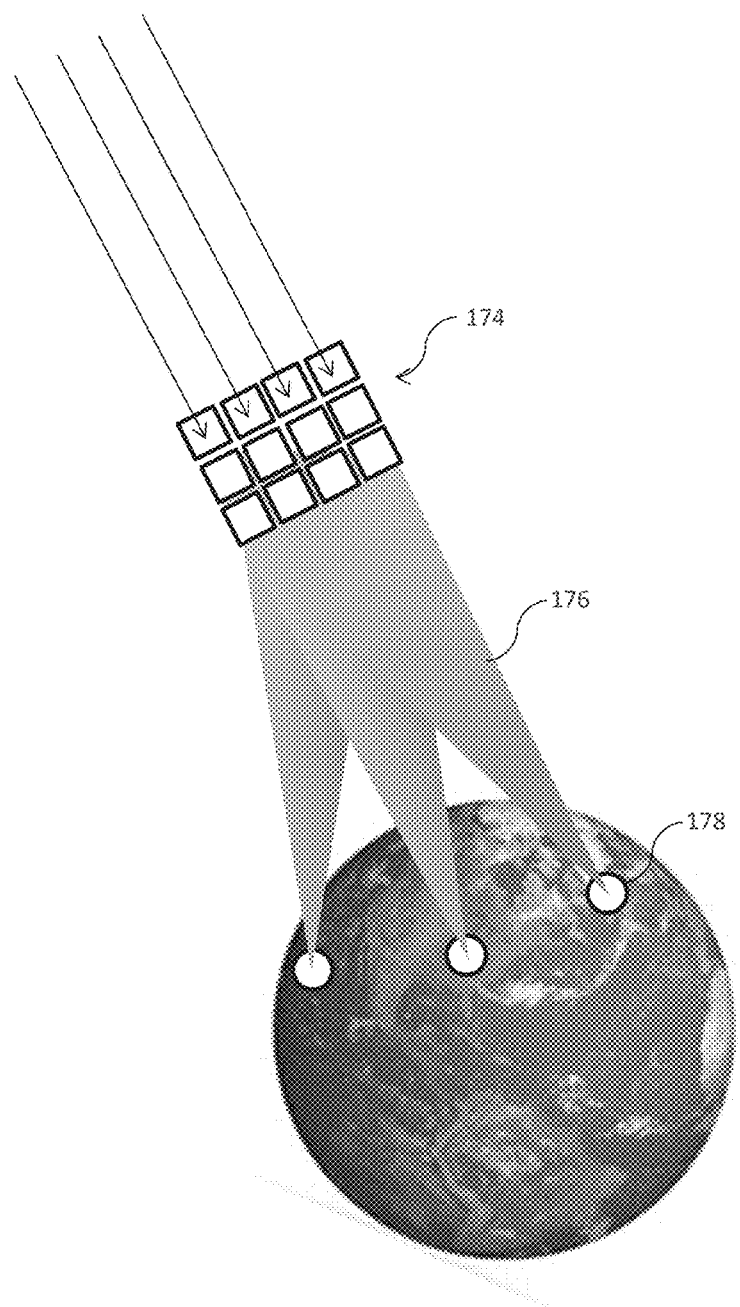
FIG. 7 conceptually illustrates dynamic power allocation from a large-scale space-based solar power system, according to one embodiment.

In embodiments this limitation may also be overcome by dividing the power transmission output 176 of the solar power station 174 between different rectenna power receivers 178, as illustrated conceptually in FIG. 7. In many embodiments, different collections of elements (e.g., satellite modules and/or power generation tiles) forming part of the solar power station 174 may be configured into different phased arrays that may be simultaneously directed at different rectenna power receivers 178 on the ground thus potentially reducing the individual incident areas radiated by the solar power station. In some embodiments additional control circuitry is provided either within the satellite module or within each of the power generation tiles to allow for dynamic electronic steering of the transmission beam, either from the collective power generation tiles of a satellite module or from each power generation tile independently. In

TABLE 1

| | | SPS Configuration Parameters | | | |
|---|---|---|---|---|---|
| Efficiency Standards | | SPS Configuration | W/kg | Max Size | Exemplary Phased Array System Performance* |
| Solar Cell Efficiency | 35% | | | | |
| DC-Microwave Conversion | 78% | USEF | 41 | 100 × 95 m | Power Received 12 GW |
| Collection Efficiency | 86% | JAXA | 98 | 3.5 km | Power Received/Module 1.72 MW |
| Transmission Efficiency | 77% | ESA | 132 | 15 km | Power Received Rectenna 1.34 GW |
| Atmospheric Absorption | <2% | Alpha | 33 | 6 km | Rectenna size: 6.65 km |
| Overall | 14% | Modular Phased Array According to Embodiments | 2270 | 60 × 60 m | Total mass (avg: 100 g/m²) 900000 kg |

*Assuming a Solar Power Station having a 50 × 50 array of 60 × 60 m satellite modules in a geosynchronous orbit with a 1 GHz power transmission having a/λ = 0.5, and a solar irradiance of 1400 W/m².

The Conventional SPS performance in Table 1 are taken from published literature. The Exemplary Phased Array System Performance in Table 1 are estimates and may differ based on the actual design parameters implemented.

Figure 8A:
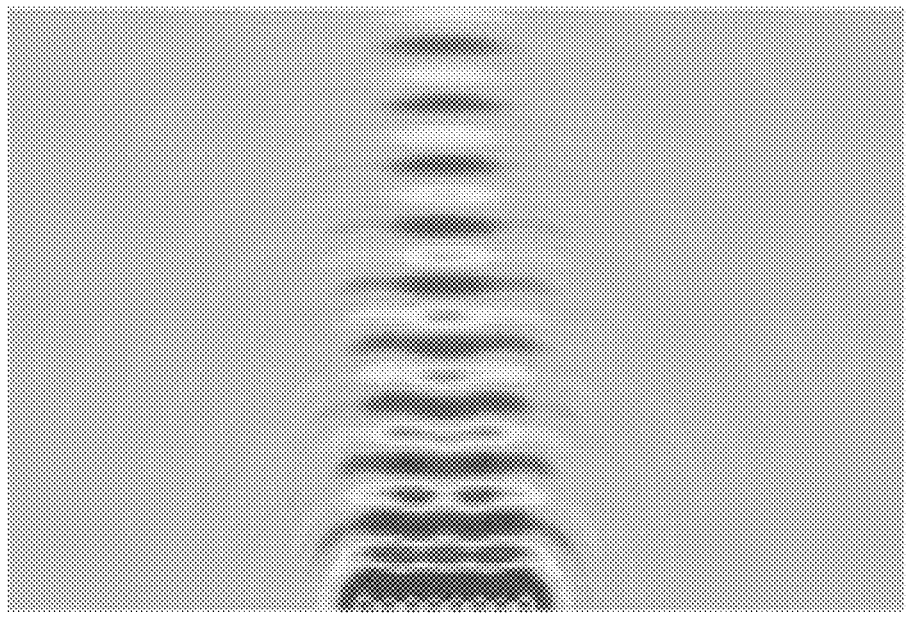
FIGS. 8a and 8b conceptually illustrate electronic beam steering using relative phase offset between elements of a phased array, according to one embodiment.
Figure 8B:
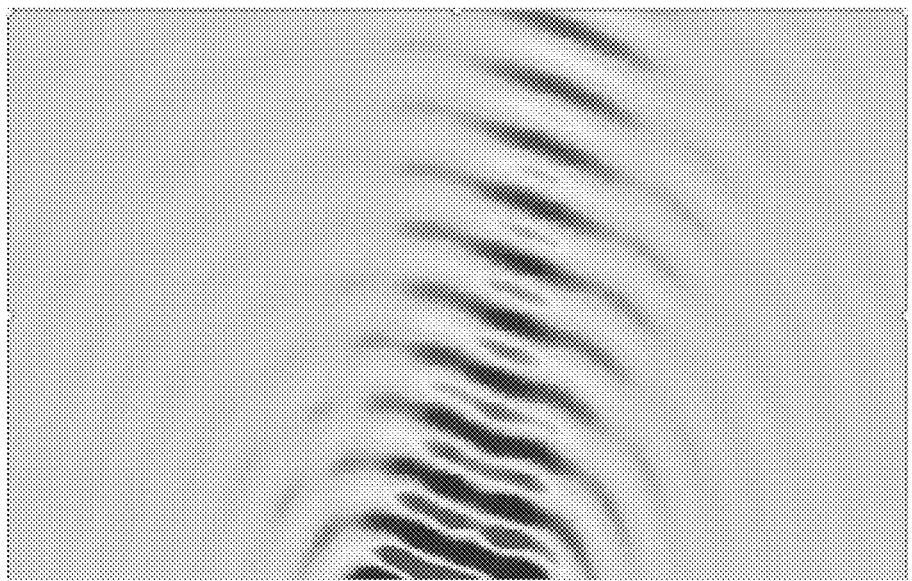

The number of power generation tile array elements in each satellite module, and the number of satellite modules in some embodiments the power steering circuitry may allow for the control of the relative timing (phase) of the various power transmitters on the power generation tile array elements, as illustrated conceptually in FIGS. 8a and 8b, such that each transmission beam may be redirected electronically at micro- and/or nano-second time scales. The power transmission from such dynamically steerable phased array on a solar power station allows for the entire phased array or portions thereof to be dynamically redirected in different directions dependent on demand at one or more rectenna power receivers. Embodiments of such dynamically directable phased arrays on power solar stations, may be used to redirect the power transmission in different directions at micro and nano-second time scales by electronic steering. Embodiments also allow for power transmissions to be dynamically distributed to various ground stations either simultaneously or sequentially based on instantaneous local demand. Power levels at each of such rectenna receivers may also be dynamically adjusted. Rapid time domain switching of power amongst rectenna receivers can also be used to control duty cycle and alleviate large scale AC synchronization issues with respect to an overall power grid.

A second factor that may constrain the number of array elements in any satellite module is the issue of payload size and weight. Current payload delivery technologies for geosynchronous orbits range from 2,000 to 20,000 kg. Accordingly, the limit to the size of any single satellite module is the actual lift capacity of available payload delivery vehicles. Based on an assumption of 100 g/m$^2$ for the phased array satellite modules according to embodiments, a 60×60 m satellite module would have a weight of 360 kg, well within the limits of current delivery technologies. Larger modules could be produced provided they are within the lift capacity of available lift vehicles.

Figure 9A:
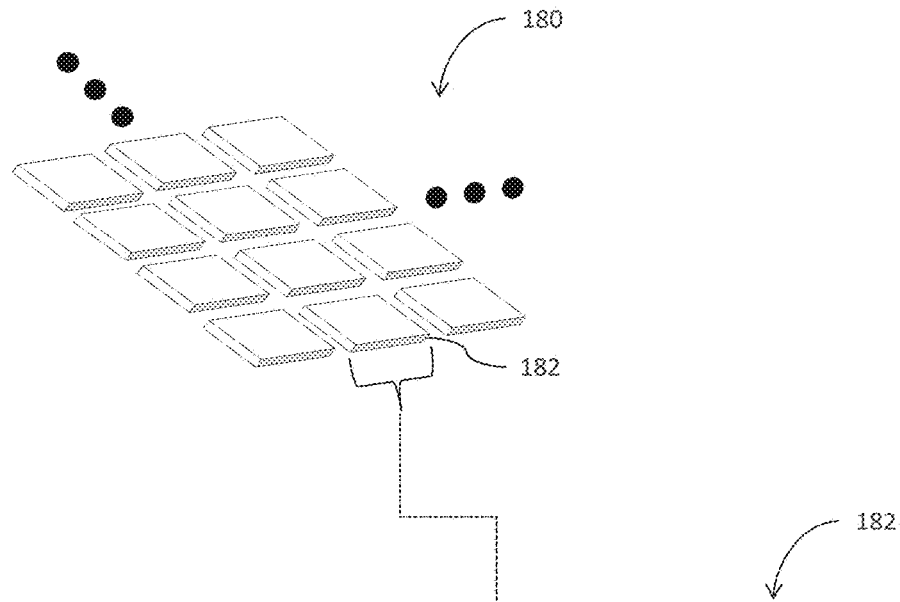
FIG. 9a conceptually illustrates a large-scale space-based solar power station and a compactable satellite module in a deployed configuration, according to embodiments.
Figure 9B:
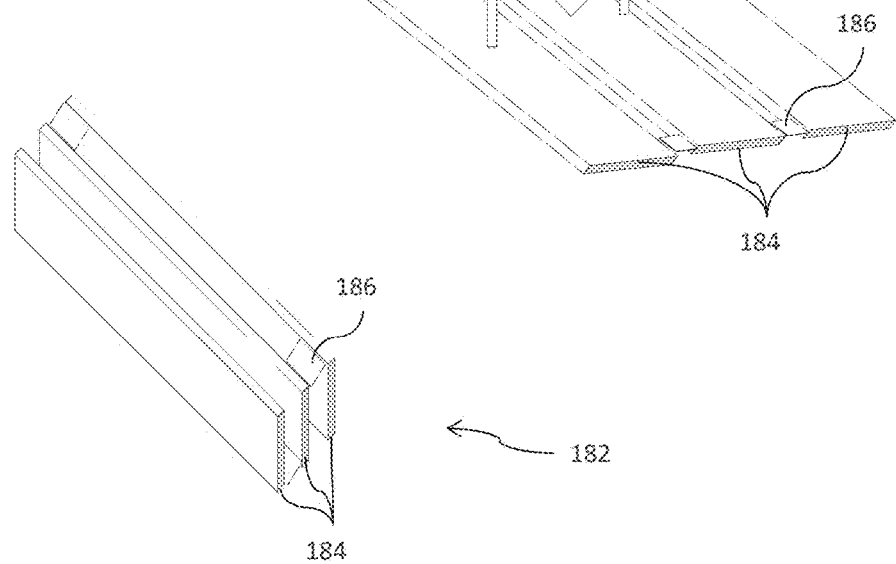
FIG. 9b conceptually illustrates a retracted compactable satellite module, according to FIG. 9a in a retracted configuration.

In some embodiments, satellite modules are compactable such that the size of the satellite module in one or more dimensions may be reduced during delivery to overcome payload space constraints and then expanded into its final operating configuration. As illustrated in FIGS. 9a and 9b, in many embodiments the solar power station 180 includes an array of satellite modules 182, each satellite module comprising a plurality of structural elements 184 that are movably interconnected such that the plurality of structural elements may be moved between at least two configurations: a deployed configuration (FIG. 9a) and a compacted configuration (9b), such that the ratio of the packaged volume to the material volume is larger in the deployed configuration when compared to the compacted or packaged configuration. In embodiments, the structural elements 184 may be hinged, tessellated, folded or otherwise interconnected 186 such that the structural elements can move in relation to each other between the compacted and deployed configurations. Each satellite module of a solar power station may be configured to compact to the same or different sizes. In addition, different compacting methods may be used to compact one or more satellite modules of a solar space station, including, among others, one and two-dimensional compaction structures. In some embodiments, one or a combination of z-folding, wrapping, rolling, fan-folding, double z-folding, Miura-ori, slip folding and symmetric wrapping may be used, among others.

In many embodiments the power generation tiles may have further compactible and expandable features and structures disposed thereon. In some embodiments of power generation tiles the photovoltaic cell and power transmitter may be movably interrelated through a compactable structure, such that when in a compacted or packaged configuration the elements of the power generating cell are compressed together to occupy a total volume lower than when in a deployed configuration. In some deployed configurations the photovoltaic cell and power transmitter are separated by a gap (e.g., to create a vertical offset therebetween). Embodiments of compactable structure include motorized interconnections and resilient members such as spring or tension arms that are bent or under compression, among others. Such compactable structures may also incorporate packaging techniques such as one or a combination of z-folding, wrapping, rolling, fan-folding, double z-folding, Miura-ori, slip folding and symmetric wrapping may be used, among others.

The power generation tiles and/or satellite modules may include other structures to enhance the collection of solar radiation or transmission of power from the power generation tiles and/or satellite modules. Embodiments of structures that may be incorporated into power generation tiles and/or satellite modules may include, among others, thermal radiators for controlling the thermal profile of the power generation tiles, light-collecting structures (e.g., radiators, reflectors and collectors) to enhance the efficiency of solar radiation collection to the photovoltaic cell, and radiation shielding to protect the photovoltaic cells, power transmitters and/or control electronics from space radiation. Such structures may also be independently compactible, between packaged and deployed configurations, as described above in relation to other elements of the power generation tiles.

A design for a satellite module or power generation tile may be applied to different satellite modules or power generation tiles. Other variables in the solar power station such as spatial distances, photovoltaics, power transmitter, control electronics and combinations with may be modified to produce a phased array with differing power collection and transmission characteristics. In this way, a diverse mix of solar power stations may be produced while maintaining the benefits of the modular solar power station described.

Compactable Space Structures

In many embodiments, the satellite modules and power generation tiles of the solar power station employ compactible structures. Compactable structures allow for the satellite modules and/or power generation tiles to be packaged in a compacted form such that the volume occupied by the satellite module and/or power generation tiles can be reduced along at least dimension to allow for the satellite modules to fit within an assigned payload envelope within a delivery vehicle, and then expanded when deployed in space. Several exemplary embodiments of possible packaging configuration are provided, however, it should be understood that the packaging methods and compactible structures may involve, among other procedures, using one and two-dimensional compaction techniques, including, one or a combination of z-folding, wrapping, rolling, fan-folding, double z-folding, Miura-ori, star folding, slip folding and wrapping.

Compactible Space Structures

Several challenges exist in forming compactible structures to be used in constructing space-based satellites and platforms, including packaging the structures efficiently (e.g., packaged with minimal volume gaps in the folded structure), packaging without exceeding the yield stress of the material of the structures, and the ability to extend the structure to a deployed state with minimal edge forces.

Figure 10A:
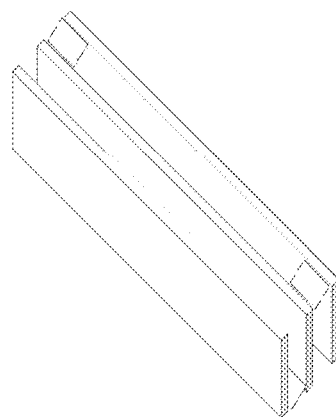
FIGS. 10a to 10c conceptually illustrate: a) z-folding of a compactible satellite module, b) wrapping of a compactible satellite module, and c) fan-folding of a compactible satellite module.
Figure 10B:
Figure 10C:
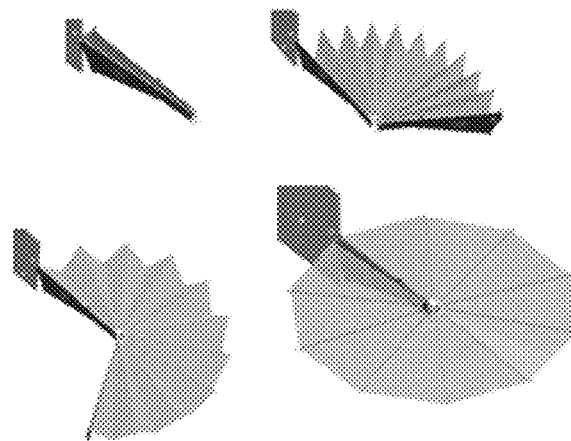

Compaction can be generally divided into techniques that compact in either one or two-dimensions. Some techniques that may be performed along one dimension, include, for example, z-folding, wrapping (or rolling), and fan-folding, illustrated in FIGS. 10a to 10c, among others. Such one-dimensional folding mechanisms may be used in compacting the space structures of the power generation tiles and satellite modules, in accordance with embodiments.

While these techniques have some advantages in that they provide efficient packaging, can accommodate for thickness in the movable panels or elements that form the compactible structure, and can avoid plastic deformation by choosing a suitably large radius of wrapping or folding, because the compaction occurs in only one dimension these techniques are not applicable when both dimensions of the deployed structure exceed the available packaging envelope (as is often the case with large-scale SPS constructs that can easily exceed 60 m in at least two dimensions).

Figure 12:
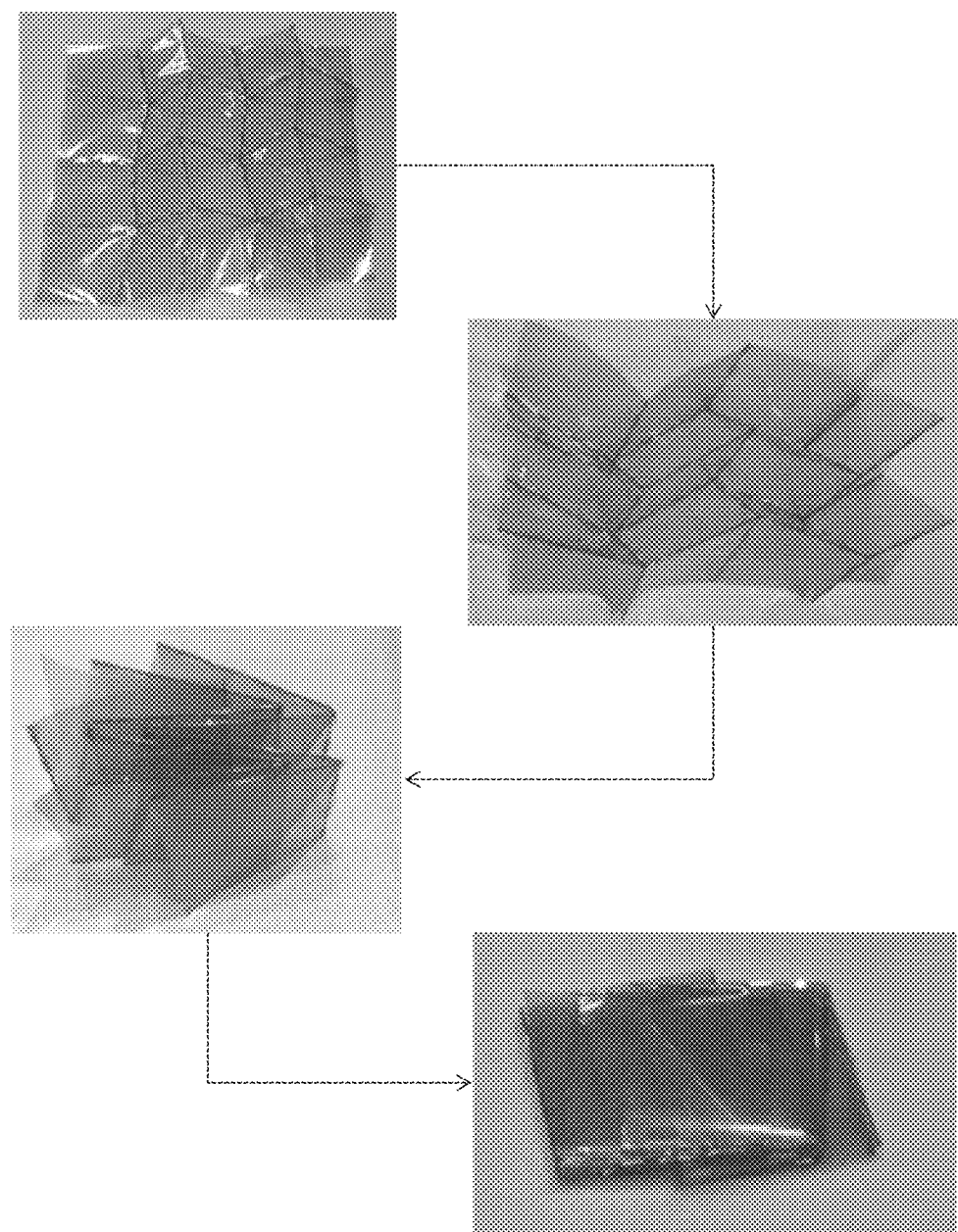
FIG. 12 provides images of the compaction of a membrane using the compaction technique of FIG. 11.

Two-dimensional compaction is able to address these larger compactible structures. Miura-ori is one scheme for biaxially packaging a compactible structure. FIG. 11 illustrates embodiments of such a Miura-ori compaction technique where a satellite module 200 divided into a series of compactible tile panels 202 is biaxially folded. It modifies the standard map folding technique (i.e. double z-folding) by skewing one set of parallel fold lines. Images of a compactible structure folded in accordance with embodiments of such a biaxial folding mechanisms are provided in FIG. 12. Both map folding and Miura-ori have been used for packaging space structures, however, neither basic map folding nor Miura-ori can accommodate space structures that have significant thickness greater than that found in thin membranes.

Figure 13A:
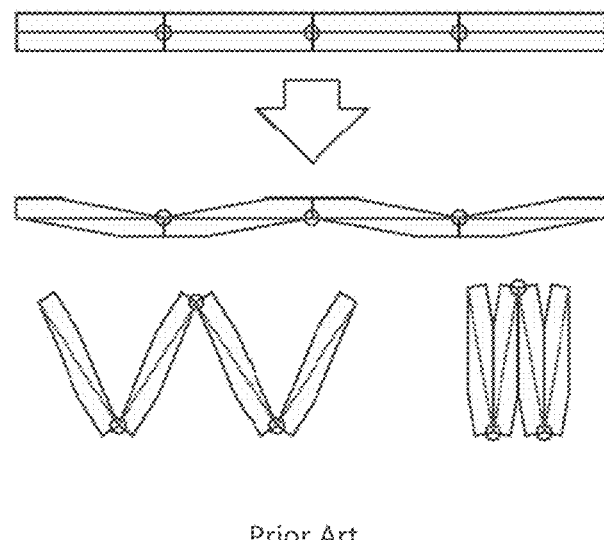
FIGS. 13a and 13b conceptually illustrate folding techniques for a compactible structure.

It is also possible to compact thin membranes along two dimensions by first folding and then wrapping. Both z-folding and wrapping, and star-folding and wrapping have been used to package membrane space structures. However, these conventional two-dimensional folding techniques require localized bending deformation, known as creasing, as the basic mechanism for compaction, and these curved creases are not able to preserve the planar flatness of the structure. For example, techniques for wrapping a membrane around a polygonal hub using straight creases have been proposed. These techniques generate crease patterns by modeling the wrapped membrane as a collection of straight-line creases intersecting at vertices. By placing the vertices set distances apart in the folded state, the crease lengths and angles can be computed. Although these patterns provide, on average, the required accommodation for the thickness of the membrane, the solution is not correct near the fold lines or at the vertices. It is possible to make these solutions exact by trimming away material. FIG. 13a illustrates an ideal zero-thickness fold pattern (denoted by the central line running longitudinally through the circles in the images) that can be applied to a finite thickness membrane (denoted by the outer lines) by trimming away material close to the fold lines and vertices. However, as the final fold angle decreases, more and more material must be trimmed away; in the limit as the final fold angle goes to zero, all material must be removed. In practice, because it is impossible to decrease the thickness of the membrane to zero, the packaging efficiencies achievable are limited. This technique also requires panels of non-uniform thickness, which may be troublesome for engineering applications.

Figure 13B:
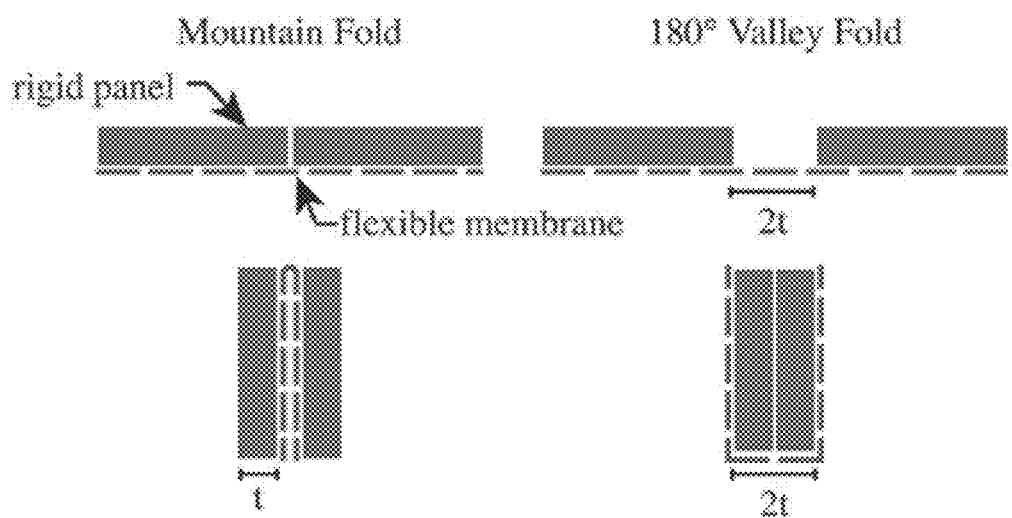

Instead of removing material, it has also been proposed to widen and reduce the thickness of the crease regions. However, this results in the presence of large voids in the packaged membrane, as illustrated in FIG. 13b. Crease widths of 10 to 14 times the panel thickness were required in previous studies to enable packaging. Modifications of Miura-ori allow for the folding of thick membranes. However, again these modified patterns also result in gaps between membrane faces in the folded state, and the size of these gaps grows with the size of the membrane, leading to loss of packaging efficiency. Finally, a degree-4 vertex has been proposed in a thick membrane enabled by sliding hinges along the crease lines. However, this scheme requires the creases to slide by an infinite amount as the crease angle tends to zero. For this reason, this method also does not result in tight and efficient packaging.

In many embodiments, compactible space structures configured to accommodate power generation tiles and satellite modules of the SPS having finite thicknesses are described. Many such embodiments utilize a combination slip-folding and wrapping compaction technique (referred to here as slip-wrapping) to extend and/or retract the power generation tiles and/or satellite modules between deployed and packaged or compacted configurations. Some embodiments of such compactible structures incorporate the removal of structure material to create gaps or empty portions along the fold lines.

Figure 14:
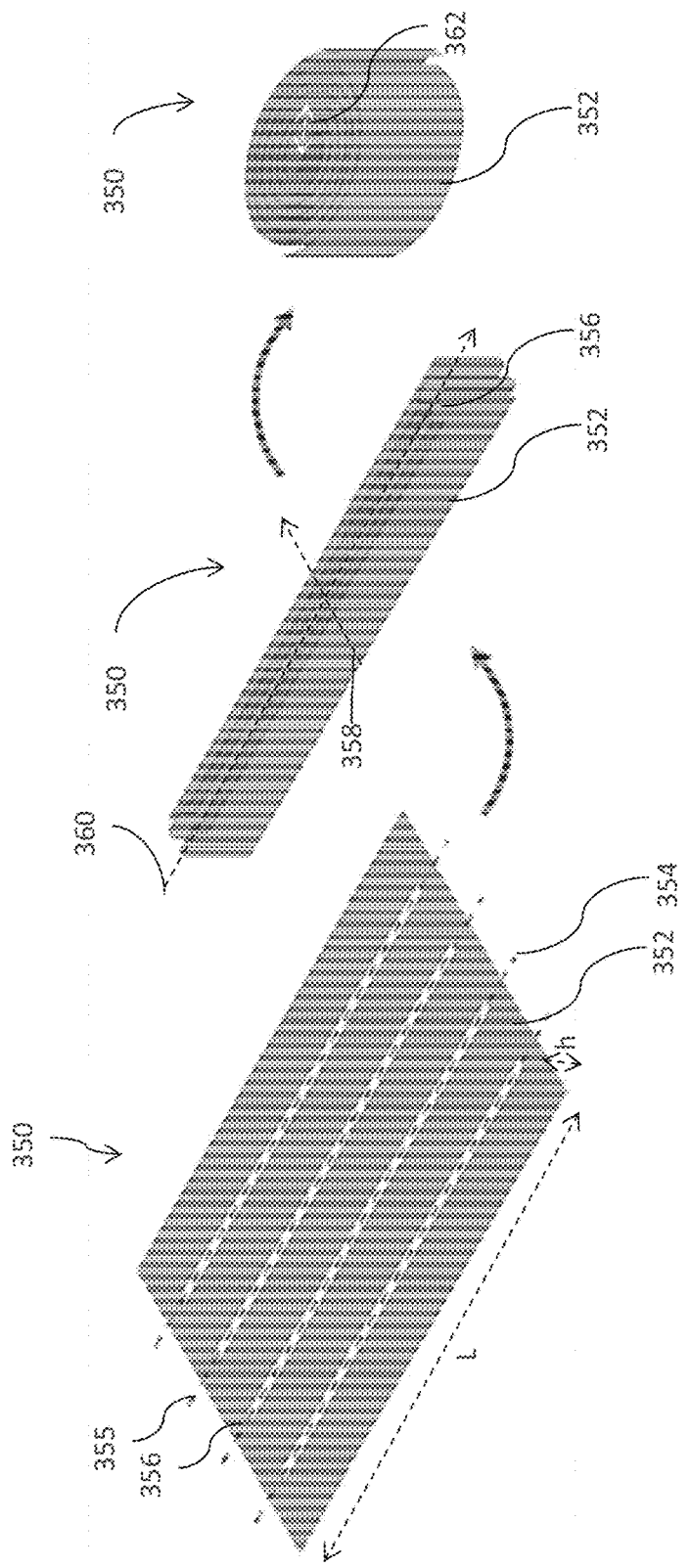
FIG. 14 conceptually illustrates a perspective view of a compactable satellite module having a slip folding and wrapping configuration, according to embodiments.

FIG. 14 illustrates embodiments of a slip-wrapping compaction mechanism and method. In some embodiments a compactible structure 350 of side length L and thickness h is divided into n compactible panels 352 by n–1 slipping folds 354. As will be described in greater detail below, a slip fold allows for rotation about the fold line as well as slip along the fold line 354. In some embodiments the slipping folds are realized by cutting a series of parallel slits 355 in the body of the compactible structure 350 at the fold line, while maintaining the continuity of the compactible structure via a continuous edge strip 356 that runs across the panels 352 at either end of each fold line 354. During compaction the structure is compacted first along a single dimension (e.g. by a z-fold) using parallel slipping folds, which produces a stack of n panels 352 that are compacted along a first axis 358 orthogonal to the fold axis 360 of the structure 350. In a second step, this stack of panels is wrapped in a rotationally symmetric fashion about a hub with a radius 362 (which is selected to be no smaller than the minimum bend radius of the elongated panel structures of the compactible satellite module) to further compact the panels along a second axis, thereby forming a fully compacted satellite module. Although a compactible structure with an overall rectangular configuration is shown in FIG. 14, it should be understood that the slip-wrapping compaction technique and mechanism may be implemented with any configuration, number or shape of individual compactible elements so long as they are joined such that shear as described above is permitted between the various panels of the compactible structure.

Figure 15A:
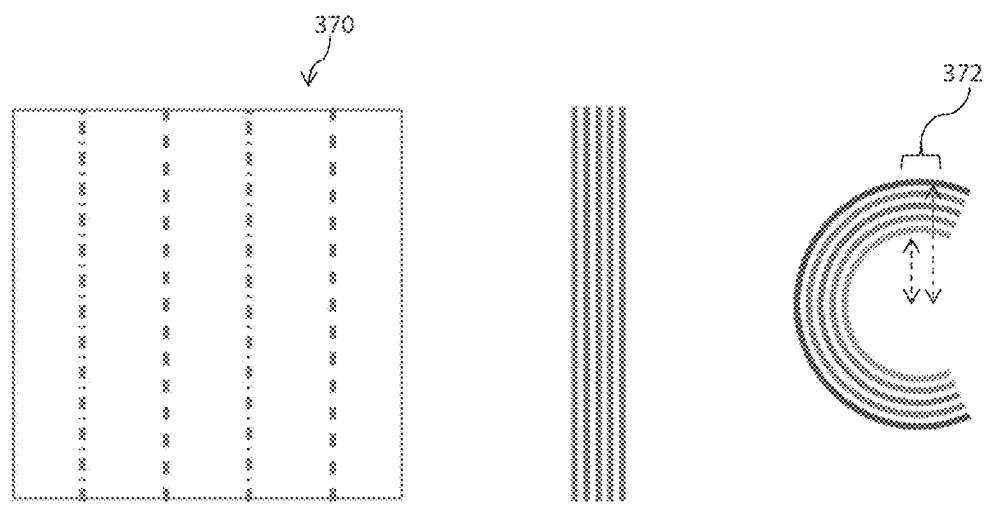
FIGS. 15a and 15b conceptually illustrate wrapping of: a) conventionally folded compactible structure; and b) a compactible structure incorporating slip folding, according to embodiments.
Figure 15B:
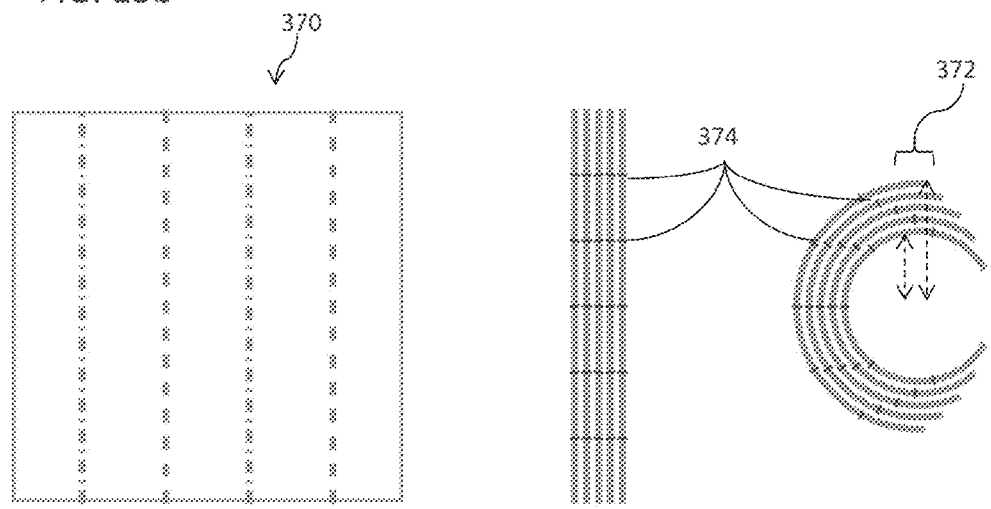

As shown above, embodiments of the slip-wrap compaction mechanism and method incorporate slipping folds, which accommodate the incompatibility created by wrapping panel members of the compactible structure having finite thickness around different radii. Issues related to the accommodation of compactible wrapping structures having finite thickness are illustrated in FIGS. 15a and 15. Configurations of folded and wrapped structures have been implemented for very thin membranes, such as, for example, solar sails. However, implementing folding and wrapping for thicker structures, such as the power generation tiles and satellite modules presents additional challenges. Specifically, when a thicker structure 370 is folded and wrapped, as illustrated in FIG. 15a, each crease wraps around a different radius 372, which results in strain, crease line drift and buckles along the crease lines. In embodiments, this issue is addressed by introducing slip folds 374 within the structure, as illustrated in FIG. 15b. As shown, allowing slip along the fold lines wraps the creases without extension about the different radii.

Figure 16:
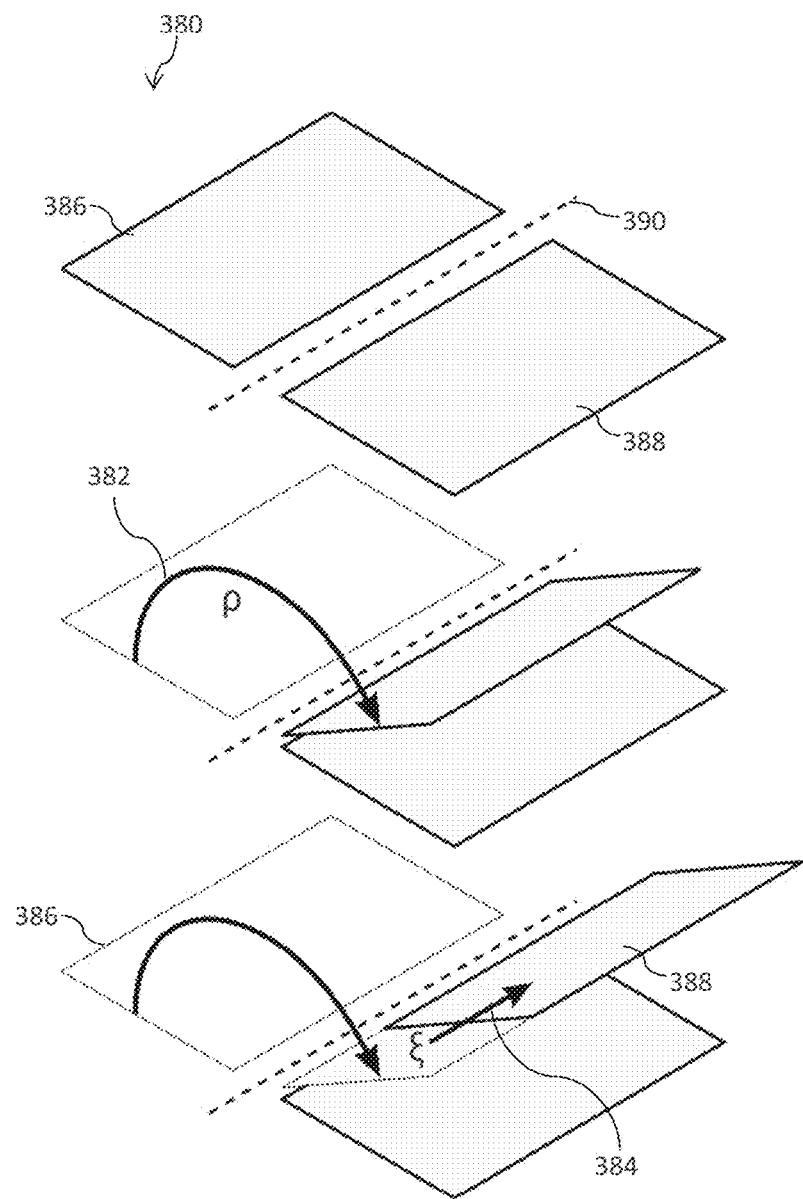
FIG. 16 conceptually illustrates a slip fold according to embodiments.

An illustration of the principles of operation of a slip fold is provided in FIG. 16. As shown, slip folds 380 offer two degrees of freedom: in addition to the fold angle 382, (ρ)

slipping folds have a slip degree of freedom 384 (ξ), which is the linear displacement of the material of the compactible panel on one side 386 of the fold 380 with respect to the material of the compactible panel on the other side 388 in the direction of the fold line 390. An ideal slipping fold may have zero stiffness associated with both these degrees of freedom. Embodiments of a slip fold 380 incorporate the removal of material along at least a section 392 of the fold lines of the compactible structure. As a result of the section 392 of removed material the compactible panels of the compactible structure can be folded and unfolded, and the two panels of the compactible structure translated relative to each other at such slipping folds without straining the material of the panels of the compactible structure.

Figure 17A:
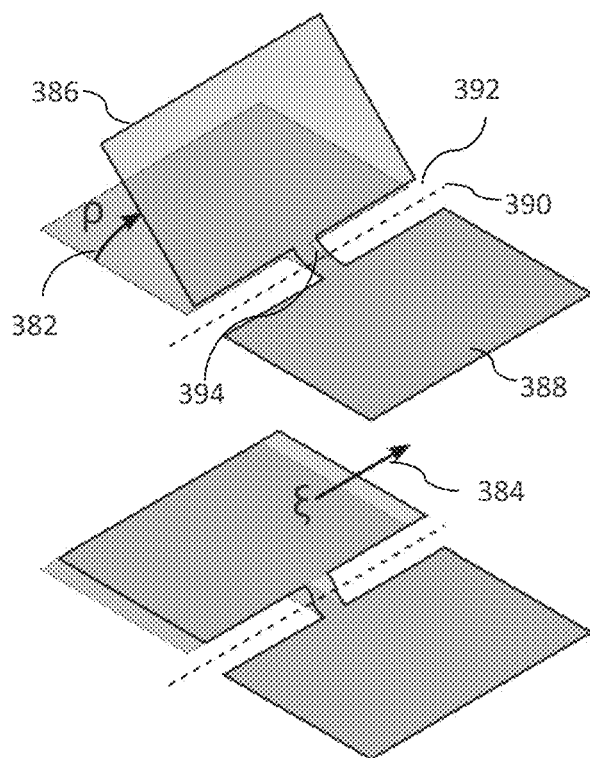
FIGS. 17a and 17b conceptually illustrate interconnections for slip folding compactible structures, according to embodiments.
Figure 17B:
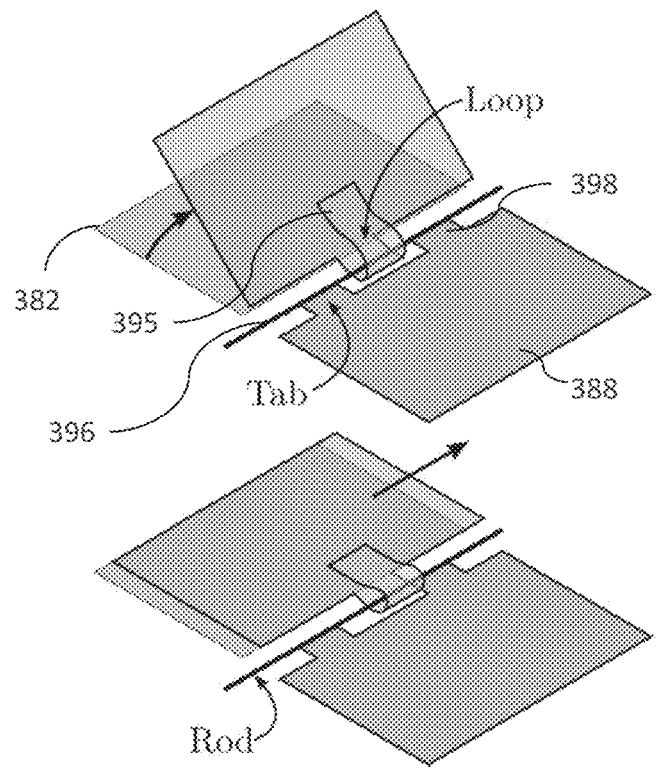
Figure 18:
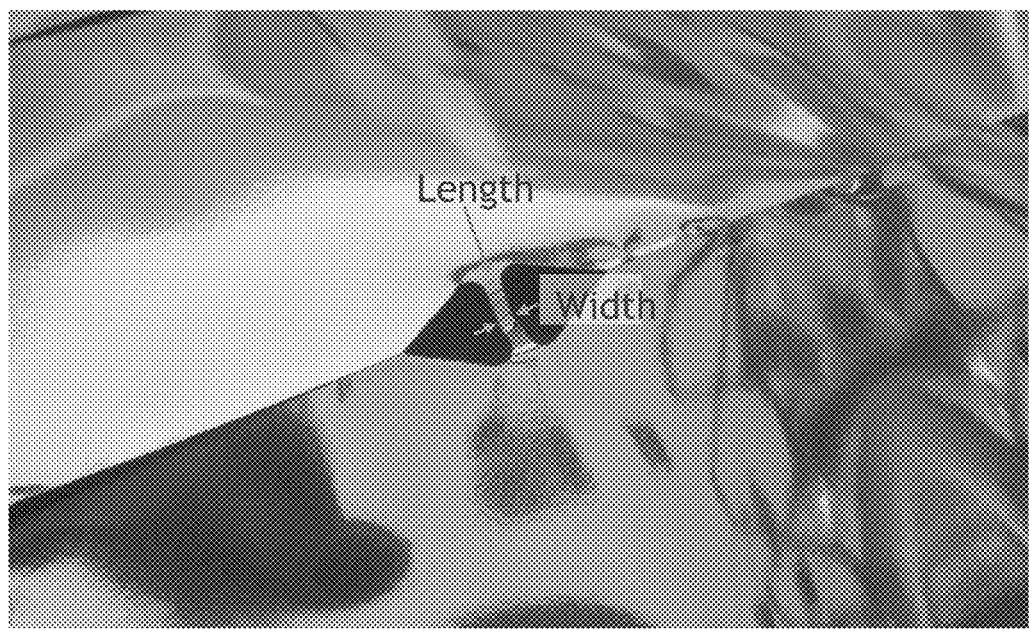
FIG. 18 provides an image of a compactible structure incorporating a ligament fold, according to embodiments.

The creation of sections of material void (e.g., through material removal) along the fold lines of the panels of the compactible structures can lead to a reduction in the continuity and hence in the stiffness of a panel or the overall compactible structure. In many embodiments slipping folds are realized that include interconnections that allow for the transmission of tension forces and the limited transmission of shearing forces across fold lines. Embodiments of implementations of such interconnected slip folds are illustrated in FIGS. 17a and 17b. As illustrated in FIG. 17a, some embodiments of a slip fold for compactible structures implement a ligament fold incorporating one or more strips or ligaments of material 394 left uncut at the fold line 390. A ligament fold allows for the transmission of tension and shear across the fold line. In embodiments the length of the interconnecting ligament is chosen to allow for the required deformation along the fold line. (An image of an exemplary ligament fold is provided in FIG. 18.) A ligament fold has a state of maximum slip beyond which the ligament will deform plastically. Some other embodiments may implement a hinged fold 395 where a support element 396 (e.g., a cylindrical rod) is located at the fold line, as illustrated in FIG. 17b. In some embodiments this support element 396 is attached to the material on one side 388 of the fold using tabs 398. The material on the other side 382 is attached to the rod using a loop 395. This loop is rotatable about the rod and may also slip along the rod. Maximum slip is reached when the loop 395 contacts a tab 398. A hinged fold transmits tension across the fold line. In the maximum slip state, a shearing force may also be transmitted. Although loop and ligament hinges are shown, many embodiments of movable panels or elements of compactible structures are interrelated by slip folds incorporating other hinge types, such as, frictionless and latchable hinges, among others.

Figure 19:
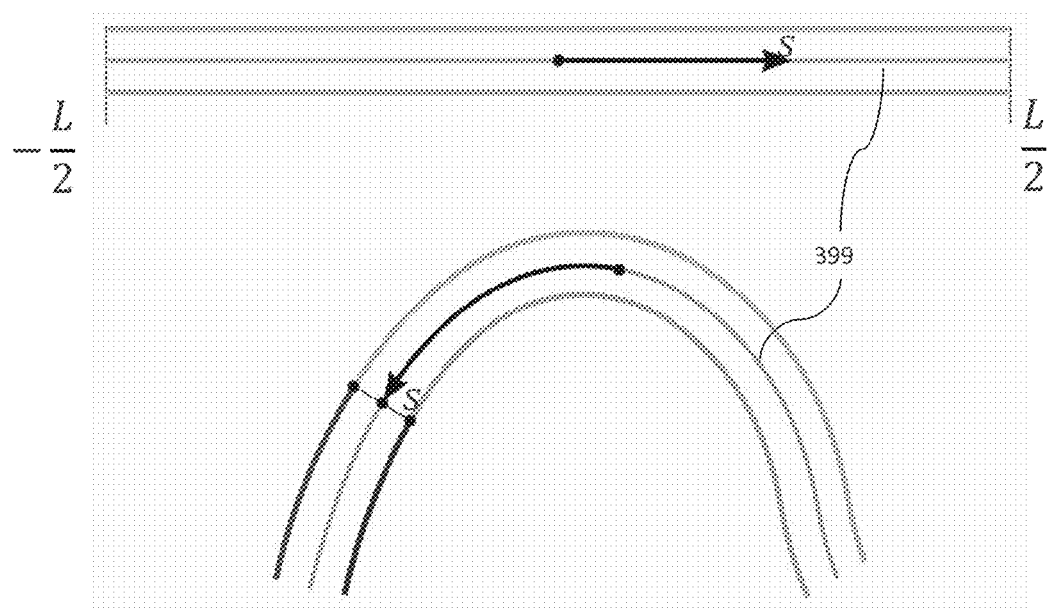
FIG. 19 conceptually illustrates cross-sectional views of the relative movement between adjacent slip folded structures, according to embodiments.

In embodiments the amount of slip incorporated into the compactible structures is at least in part determined by the slip degree of freedom needed to accommodate the movement of elements of the compactible structure in the second slip-wrap compaction step of wrapping. The slip freedom (s) may be considered as the difference in the arc-length between two curves as illustrated schematically in FIG. 19, and as expressed by:

$$\xi(s) = L_+(s) - L_-(s) \quad \text{(EQ. 1)}$$

Thus the slip is the integral of the signed curvature over the base curvature κ(s) in accordance with:

$$\xi(s) = h \int_{-\frac{L}{2}}^{s} \kappa(\tilde{s}) d\tilde{s} \quad \text{(EQ. 2)}$$

where h is the thickness of the compactible structure elements. As illustrated and discussed in relation to FIGS. 15a and 15b, above, wrapping the z-folded stack of n elements leads to the outer elements going around larger radii than the inner elements because each element has thickness h>0. Thus, for the same arc-length, outer elements traverse smaller wrapping angles than inner elements. If the moveable elements of the compactible structures do not have a sufficient slip degree of freedom the elements will be unable to slip against each other, and wrapping the stack of elements will result in straining of the compactible structure.

Figure 20:
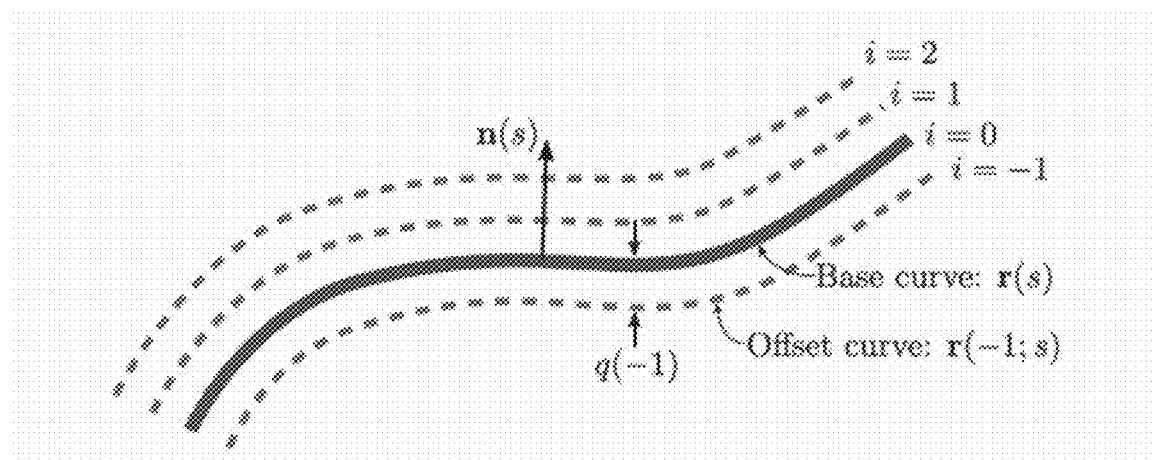
FIG. 20 conceptually illustrates cross-sectional views of the structure of adjacently slip folded structures, according to embodiments.

In addition to areas where the elements of the compactible structure can slip against each other, it is also advantageous to constrain the slip between two panels of the compactible structure to be zero at certain locations, which allows the compactible structures to be connected at the ends. In order to determine combinations, arrangements and parameters of panels of compactible structures that allow for such end connection, the compactible panel elements in the compactible structure that are to be wrapped may be modeled as a set of curves offset from a base curve, as illustrated in FIG. 20. As shown, in this model the base curve r(s): [−L/2, L/2]→R² may be parameterized by its arc length s, where the i$^{th}$ compactible panel element is offset from the base curve by q(i)n(s), where n(s) is the normal to the base curve and q(i) is a separation distance. (If n is odd, q(i)−ih.) Thus the i$^{th}$ compactible panel element follows the offset curve r(i; s)=r(s)+q(i)n(s). Accordingly, in embodiments for the ends of the compactible panel elements to be connected, the length of the i$^{th}$ compactible panel element L$_i$ must equal the length of the base curve L for all i. This is possible when the integral of the signed curvature κ(s) of the base curve is zero according to:

$$\xi\left(-\frac{L}{2}\right) = h \int_{-\frac{L}{2}}^{-\frac{L}{2}} \kappa(\tilde{s}) d\tilde{s} = 0 \quad \text{(EQ. 3)}$$

$$\xi\left(\frac{L}{2}\right) = h \int_{-\frac{L}{2}}^{\frac{L}{2}} \kappa(\tilde{s}) d\tilde{s} = 0 \quad \text{(EQ. 4)}$$

This condition may be met according to some embodiments by having κ(s) be an odd function of the arc-length (i.e., −κ(s)=κ($\tilde{s}$)). Accordingly, the condition of zero slip in embodiments can be achieved by using a rotationally symmetric wrapping (i.e., where the compactible structure incorporates a base curve (p(s): [0, L/2]→R²) and a copy of the base curve rotated by 180° embodiments.

Figure 21A:
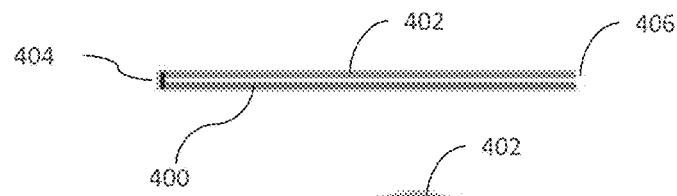
FIGS. 21a to 21d conceptually illustrate a cross-sectional view of a compactable satellite module having a slip folding and wrapping configuration, according to embodiments.
Figure 21B:
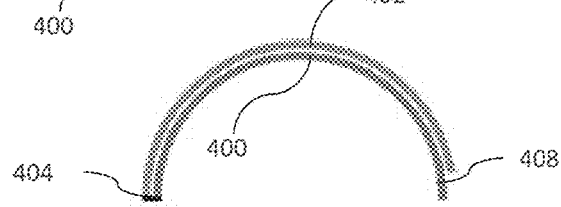
Figure 21C:
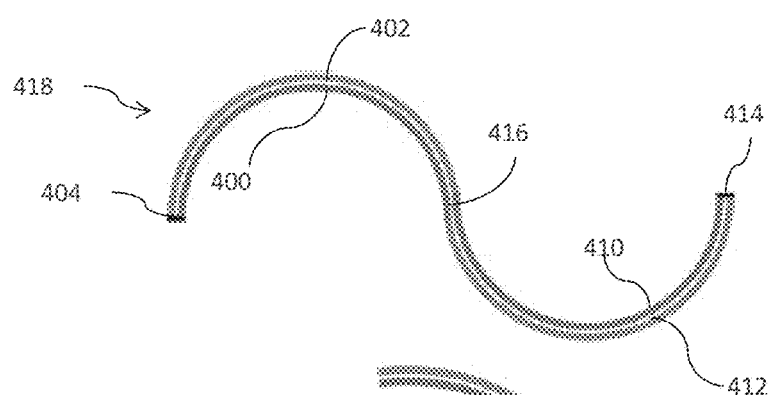
Figure 21D:
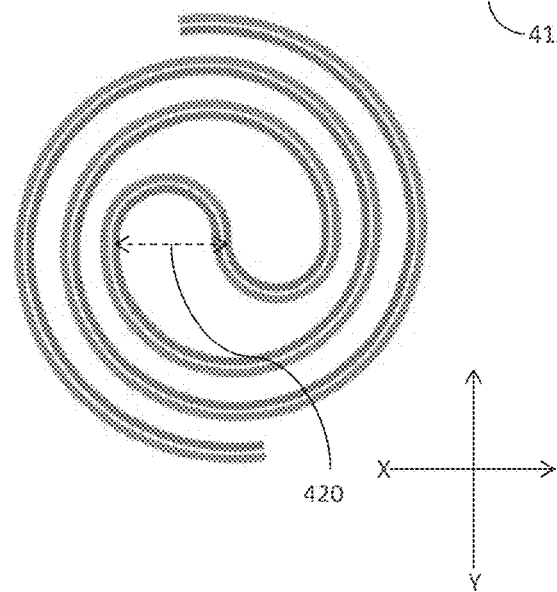

In many embodiments a slip-wrapping compacting technique utilizing such rotationally symmetric wrapping to allow the ends of the compactible structures to remain connected may be incorporated into compactible structures to package and deploy the satellite modules and/or power generation tiles. FIGS. 21a to 21d provide cross-sectional views of embodiments of such a rotationally symmetric wrapping techniques. As shown, in these embodiments a compactible structure formed of two elongated panel structures 400 and 402 interconnected at a first end 404 and open at a second end 406 (FIG. 21a) are wrapped about a hub (FIG. 21b). Such wrapping causes one of the elongated panel structures 400 to slip along its longitudinal length with respect to the second elongated panel structure 402 such that a gap 408 forms between the unconnected ends of the panels. A second set of such panel structures 410 and 412 interconnected at one end 414 are then obtained by a 180° rotation of the first set of panel structures and the non-interconnected ends are then joined together 416 such that the slip at the ends of the overall compactible structure cancel to form a single elongated compactible structure of an undulating configuration 418 interconnected at both ends 404 and 414 (FIG. 21c) with zero slip at the closed ends. The undulating structure thus formed may then be wrapped about a hub of a specified radius 420 that is no smaller than the minimum bend radius of the material of the various panels of the structure thus reducing the dimensions of the compactible structure of the satellite module biaxially in two axes (FIG. 21d).

Many embodiments of compactible structures may employ rotationally symmetric wrappings, which as described above, are a class of wrappings that result in a configuration that has two-fold symmetry, to enforce zero slip, for example, at the two ends of a folded stack of panels of a compactible structure. Such wrapping enables the edges of the compactible structures to remain uncut and able to transmit tension. Accordingly, while the slipping folds of the slip-wrap mechanism and method according to embodiments accommodate the incompatibility created by wrapping the thick panel elements around different radii, the rotationally symmetric wrapping mechanism and method according to embodiments ensures that the ends of the panel elements of the compactible structure remain connected.

Figure 22A:
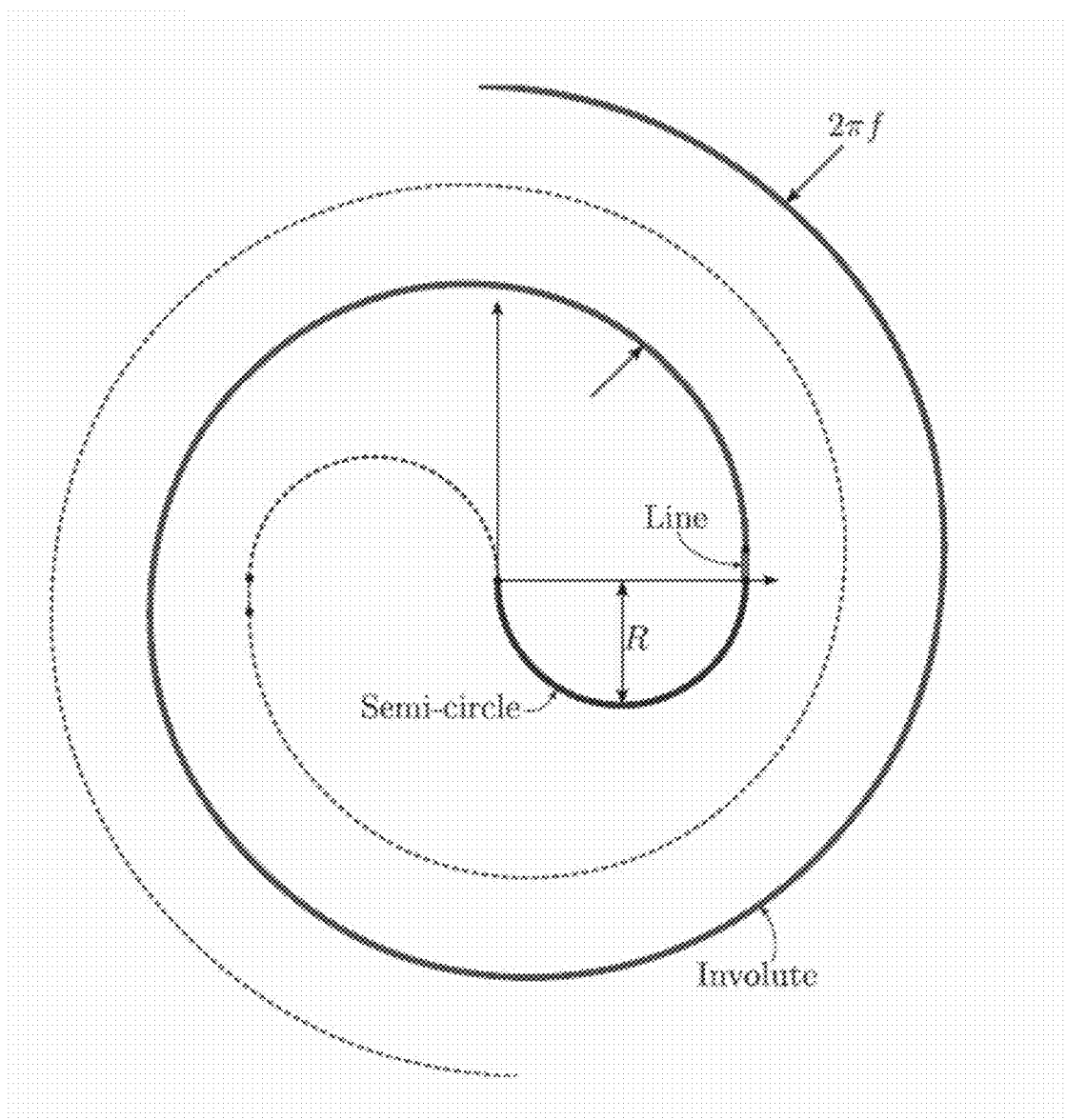
FIGS. 22a to 22d conceptually illustrate the wrapping of a compactible structure, according to embodiments.
Figure 22B:
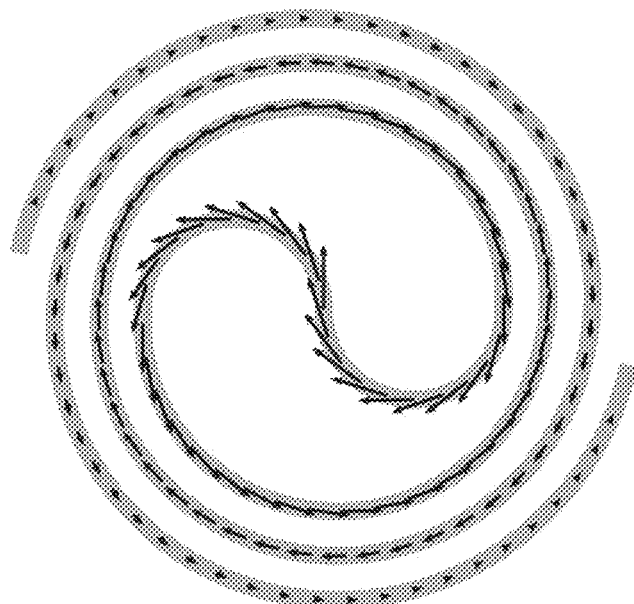

Wrapping mechanisms and methods to be used in association with slip-fold interconnected compactible structures to efficiently package and deploy the satellite modules and power generation tiles are also provided according to embodiments. Exemplary rotationally symmetric wrapping curves that may be used in embodiments of wrapping structures for compactible structures are discussing in relation to FIGS. 22a and 22b. Although many wrapping curve geometries may be used, in some exemplary embodiments, as shown in FIG. 22a, the curve consists of a semi-circle of radius R, a vertical line of length f, and an involute circle with a pitch of $2\pi f$, and which may be defined by the following:

$$p(s) = \begin{cases} R\left\{1-\cos\left(\frac{s}{R}\right), -\sin\left(\frac{s}{R}\right)\right\} & \text{if } s \in [0, \pi R] \\ R\left\{2, \left(\frac{s}{R}\right)-\pi\right\} & \text{if } s \in (\pi R, \pi R + f) \\ f\left\{\begin{matrix} \cos(\alpha-\theta)+\alpha\sin(\alpha-\theta), \\ \sin(\alpha-\theta)-\alpha\cos(\alpha-\theta) \end{matrix}\right\} & \text{if } s \in \left(\pi R+f, \frac{L}{2}\right) \end{cases}$$

Figure 22C:
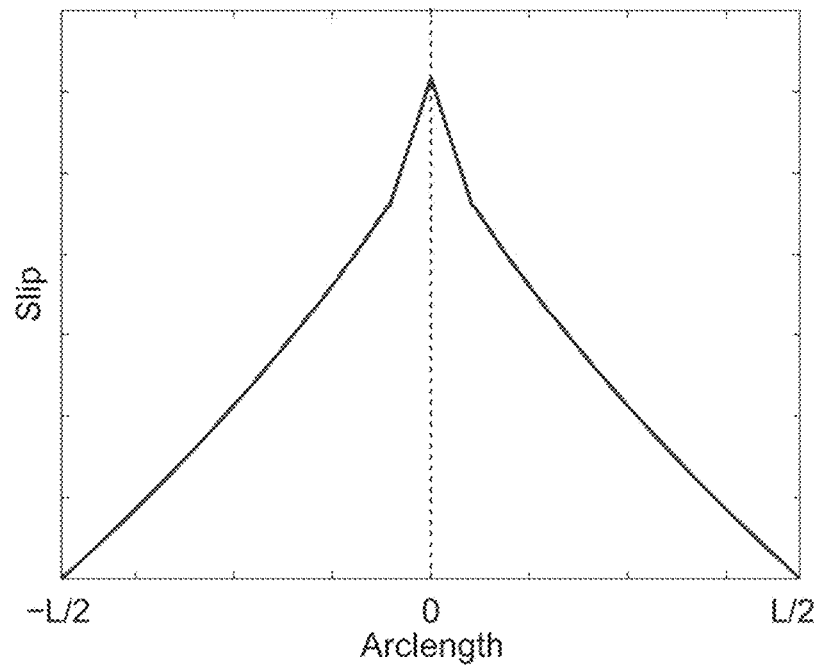
Figure 22D:
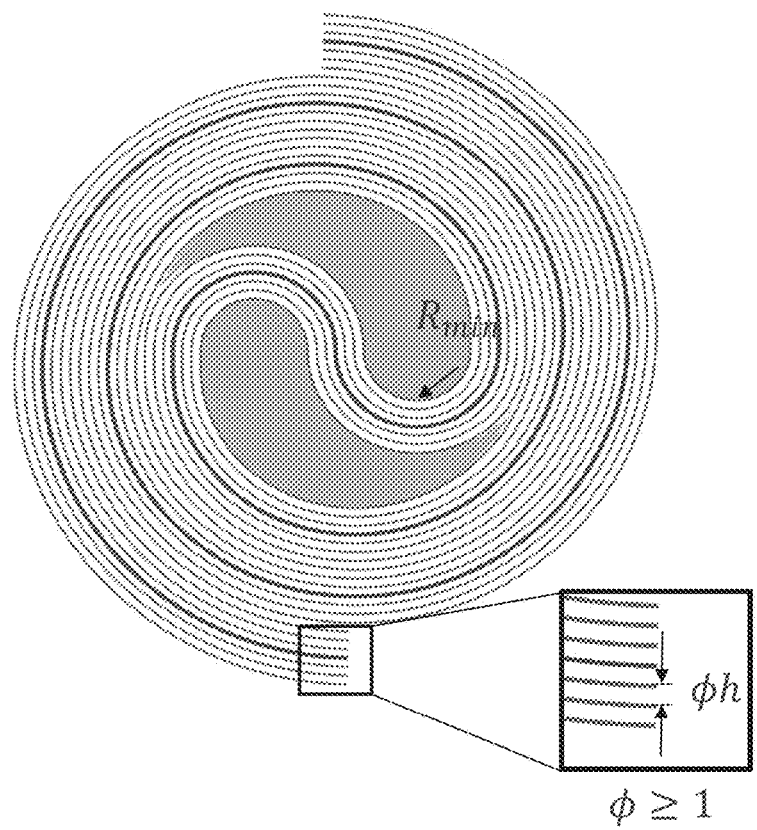

Using embodiments of this rotationally symmetric wrapping the maximum slip required between panel elements of compactible structures, as shown schematically in FIG. 22c and graphically in FIG. 22d, can be determined. In addition, the packaging efficiency of compactible structures (e.g. the size of deployed compactible structure that may be compacted into a package with a cylinder radius of $R_p$ and height of $H_p$), as shown in FIG. 22d, can also be determined. In many embodiments a compactible structure multiplier $\phi \geq 1$ may be included to account for packaging configuration where the compactible structure includes panel elements that in the packaged configuration are separated by some distance $\phi h \geq h$. In such embodiments the pitch of the involute would account for the thickness of the z-folded stack of panel elements of the compactible structure (e.g., $2\pi f = 2n\phi h$). Some embodiments of slip-wrapping also take into account the material limitations of the compactible structures, such as the radius of the semi-circle ($R=R_{min}+\phi hn/2$), which in embodiments is configured such that the curvature limit $1/R_{min}$ is dictated by the material modulus E and yield stress $\sigma_y$ such that these material limitations are not exceeded according to:

$$\frac{1}{R_{min}} = \frac{2\sigma_y}{Eh} \quad \text{(EQ. 5)}$$

In determining the packaging efficiency according to embodiments, the packaged radius $R_p = \max\|r(i;s)\|$, and the packaged height $H_p = L/n$ may be used as measures. Using these values (which are schematically illustrated in FIGS. 23a and 23b) the packaging efficiency of embodiments $\eta$, which is the ratio of the packaged volume to the material volume of the panel elements can be determined according to:

$$\eta = \frac{L^2 h}{\pi R_p^2 H_p} \quad \text{(EQ. 6)}$$

The packaging efficiency is thus a function of four non-dimensional parameters: the number of panels n, the non-dimensionalized minimum radius of curvature $\psi \equiv R_{min}/h$, the non-dimensionalized length of the panels L/h, and the thickness multiplier $\phi$. The packaging efficiency according to these four non-dimensional parameters may be given by:

$$\eta = \frac{n\lambda}{\pi\gamma^2} \quad \text{(EQ. 7)}$$

where $\gamma^2$ has the following function:

$$\gamma^2 = \left(\frac{R_p}{h}\right)^2 = \phi^2\left[\left(\frac{n}{\pi}\right)^2 + \left(\frac{n\alpha_{max}}{\pi}\right)^2 + \left(\frac{n-1}{2}\right)^2 + \frac{n(n-1)}{\pi}\alpha_{max}\right] \quad \text{(EQ. 8)}$$

and where $\alpha_{max}$ is given by:

$$\alpha_{max}^2 = \frac{\pi\lambda}{n\phi} + \frac{2\pi^2\psi}{n\phi} - 2 + \left(\frac{2\pi\psi}{n\phi}\right)^2 \quad \text{(EQ. 9)}$$

FIGS. 23a and 23b shown the packaging efficiency ($\eta$) of an exemplary compactible structure having 100 panels (n) with varying panel length ($\lambda$) for different thicknesses ($\phi$), as summarized in FIG. 23a, and minimum wrapping radius ($\psi$), as summarized in FIG. 23b. If the compactible structure is kept constant the packaging efficiency is not sensitive to the number of panels in the compactible structure since as n increase the packaged radius would increase but the packaged height (e.g., width of panels) would decrease. FIG. 23a shows that the panel thickness $\phi$ has the greatest effect on packaging efficiency at large panel lengths $\lambda$. Accordingly, in many embodiments for very large panels or panels with very small thicknesses the global packaging efficiency of the compactible structures depends on the local, per panel packaging efficiency. In contrast, as illustrated in FIG. 23b, for panels of small length $\lambda$, the minimum bend radius of the material $R_{min}=h\psi$ has a large effect on packaging efficiency.

This is because as the length of the panels λ increases, the size of the cavities (FIG. 22d) in the packaged compactible structure in relation to the overall package volume decreases, and in turn the relative importance of the bend radius ψ also decreases.

Figure 24:
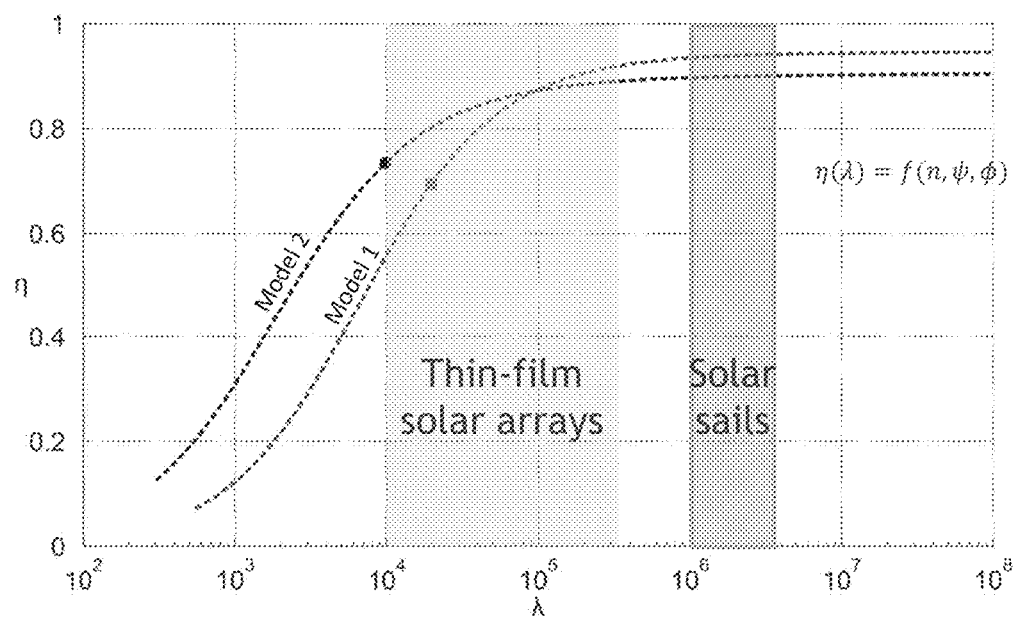
FIG. 24 provides a data graph showing the packaging efficiency of slip-wrapped compactible structures, according to embodiments.

Exemplary compactible structures having a plurality of movable panels of two different thicknesses configured for slip-wrap compaction were tested to determine a benchmark packaging efficiency for the slip-wrap method. In particular, two square models having 13 movable panels interconnected with ligament folds (7 ligaments per fold, each ligament having a width of 1.5 mm and a length of 8 mm) were made from aluminized polyester film and compacted using an embodiment of the slip-wrap compaction technique described herein. During compaction the panels were first z-folded into a stack of panel elements, and then the panels were wrapped to a specified wrapping radius and the packaging radius of the finally wrapped compactible structure measured. The parameter and packaging efficiency of the panels is summarized in FIG. 24 and Table 2. The lines represent packaging efficiencies achievable using similar manufacturing and packaging techniques, but scaled to different panel lengths.

TABLE 2

| Model | L (m) | h (μm) | $\log_{10}(\lambda)$ | η | n | ψ | φ |
|---|---|---|---|---|---|---|---|
| 1 | 0.5 | 25.4 | 4.3 | 69% | 13 | 78.7 | 1.057 |
| 2 | 0.5 | 50.8 | 4.0 | 73% | 13 | 39.4 | 1.106 |

In many embodiments, compactible structure incorporating moveable panels configured for slip-wrap compaction: 1) can accommodate panel thickness by incorporating slip between panel elements; 2) avoid the introduction of voids or gaps between the panels of the compactible structures either or both in the folded or wrapped configurations; and 3) can be folded and wrapped without material yielding (e.g., by removal of panel material along fold lines of the movable panels and/or by restricting the maximum curvature of the wrapped movable panels). Some compactible structures include a plurality of movable panels each interconnected by at least one slip fold such that the panels may fold relative to each other along a first folding axis and translate or slip relative to each other along an axis orthogonal to the folding axis. Slip folds may incorporate open sections along the fold lines of the movable panels where voids of panel material are disposed. Some of these open sections may be interconnected through movable elements, including, ligament folds and hinged elements, among others. The ends of adjacent panels in some embodiments may be interconnected. In some such embodiments the panels of such compactible structures are wrapped using a rotationally symmetric wrapping configuration such that the ends of the moveable panels of the compactible structure experience minimal to zero slip relative to each other. During compaction of the movable panels of the compactible structures some embodiments of compactible structures first incorporate a folding of the movable panels (e.g., by a z-fold, biaxial fold, star-fold, etc.), and further incorporate a wrapping of the stack of folded movable panels (e.g., by a rotationally symmetric wrap).

The number, size and configuration of the movable panels of the compactible structure may be chosen to minimize the compacted size of the compactible structure. Some embodiments minimize the spacing between the movable panels in the compacted configuration. In some such embodiments, where the deployed length of the movable panels of the compactible structure A is greater than $10^3$ the spacing φ between the movable panels of the compactible structure is less than 1.5, in some embodiments less than 1.25, and in still other embodiments less than 1. In other embodiments the deployed length of the movable panels of the compactible structure A is greater than $10^4$, in other embodiments greater than $10^5$, and in still other embodiments greater than $10^6$. Some other embodiments minimize the bend radius ψ of the compactible structure during wrapping. In some such embodiments, where the deployed length λ is less than $10^6$ the minimum bend radius is less than 350, in other embodiments less than 200, and in still other embodiments less than 50. In other embodiments the deployed length A of the movable panels is less than $10^5$, in still other embodiments less than $10^4$.

Figure 25:
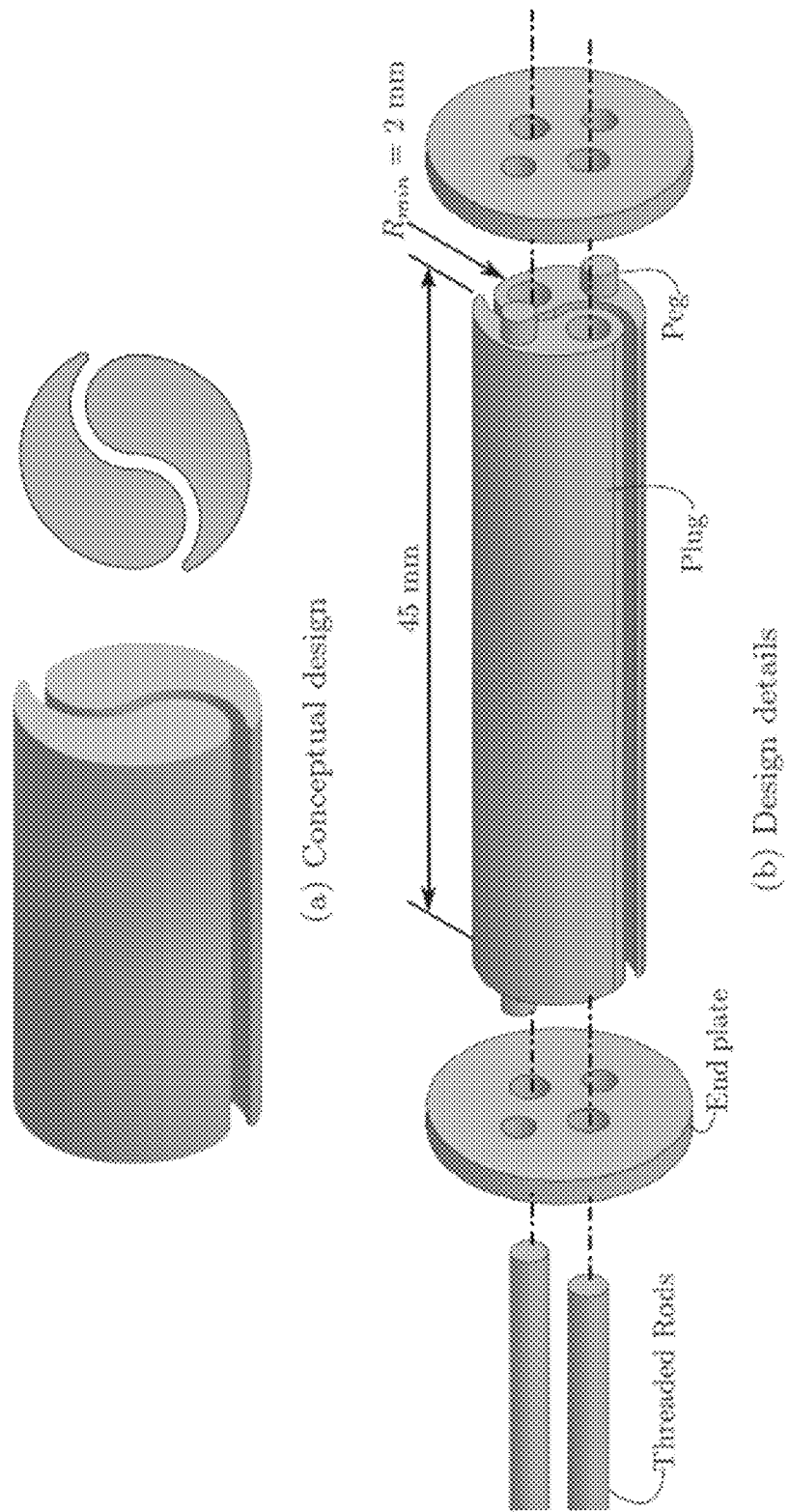
FIG. 25 conceptually illustrates a wrapping guide plug, according to embodiments.

Embodiments of slip-wrapped compactible structures are configured such that the curvature of the compacted configuration does not exceed the maximum curvature limit given by EQ. 5. In some embodiments, a wrapping guide plug may be used to guide the wrapping of the movable panels of the compactible structure such that the compactible structure is wrapped in accordance with a preselected curve geometry and/or such that the panels do not exceed the maximum curvature limit as determined by the material modulus and yield stress of the material(s) of the panels. Exemplary embodiments of wrapping guide plugs are shown schematically in FIG. 25. As illustrated conceptually in the top diagram, the wrapping plug comprises two rotationally symmetric halves of a cylinder with a slit disposed therebetween. Each half of the wrapping plug has an outer contour matching the profile of the rotationally symmetric wrapping curve to be used in compacting the compactible structure. During compaction the panels of the compactible structure would be wrapped about this structure to yield the final compacted package. The lower diagram provides a schematic of operable design of such a wrapping guide plug. In many embodiments a guide plug would implement endplates and threaded rods that would pass into and through the curved halves of the plug to stabilize the structure at a specified geometry during wrapping. Other constructions of such a wrapping guide plug could be contemplated such that compactible members could be controllably wrapped into a final packaging configuration at a specified minimum bend radius. Such a wrapping guide plug may be fabricated from any suitable material, such as a UV-curable acrylic plastic. The dimensions and geometry of the wrapping guide plug may be configured using stereolithography, among other suitable techniques.

During compaction using a wrapping guide plug according to embodiments, the movable panels of the compactible structure are clamped between the two plug halves such that they conform to the desired wrapping curve geometry and do not exceed the minimum bend radius. For example, a polyester film of thickness up to 50.8 μm has an E of 3.50 GPa and a $\sigma_y$ of 100 MPa, which gives an $R_{min}$, according to EQ. 6, of 0.89 mm to avoid plastic deformation in the panel material. It will be understood that these values are only exemplary and the modulus and stress values for other materials and panel constructions can be determined by techniques known in the art to allow for the determination of a minimum bend radius to avoid plastic deformation in the movable panels of the compactible structure in accordance with embodiments. As the wrapping guide plug may tightly clamp the movable panels during compaction, according to many embodiments, the various movable panels of the compactible structure may be pre-slipped with respect to each other to accommodate the thickness of the panels during subsequent wrapping.

Figure 26:
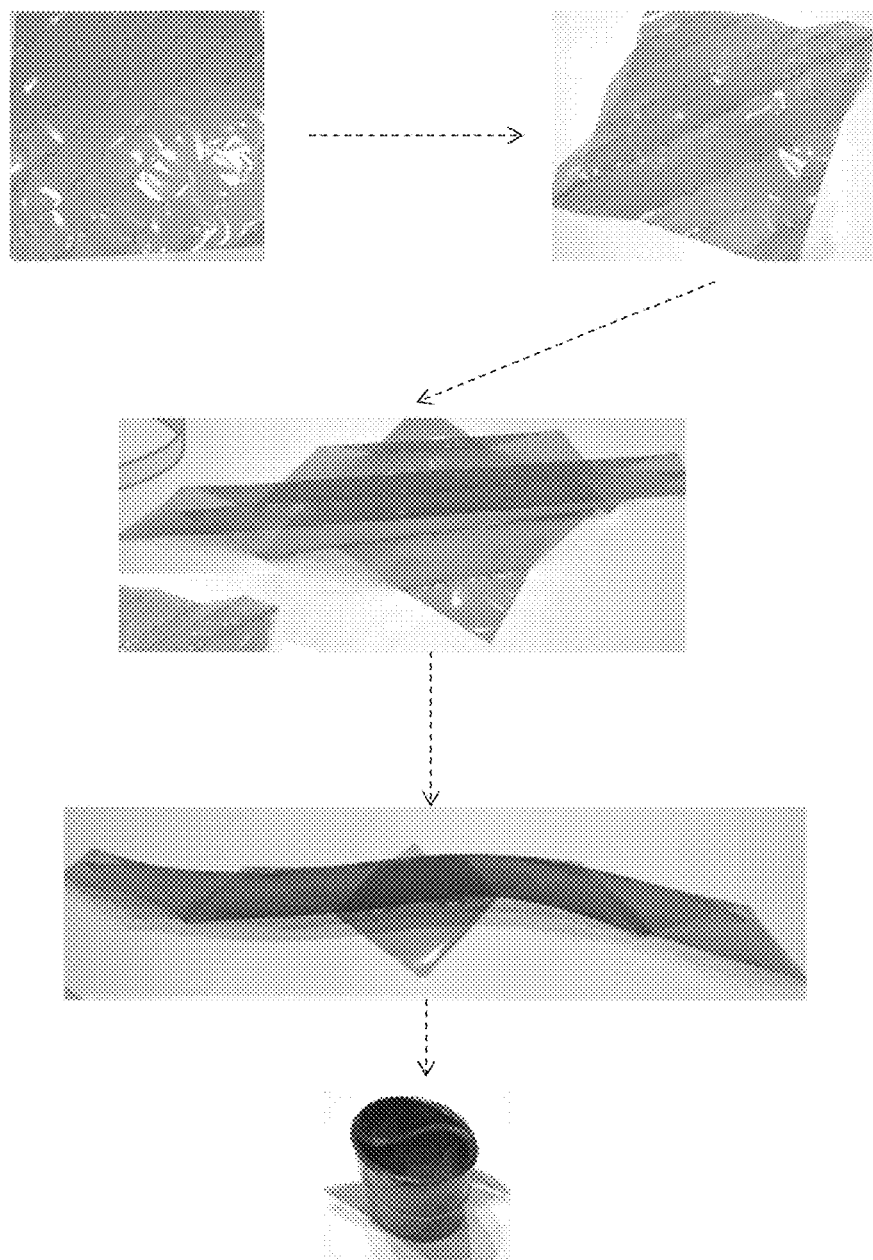
FIG. 26 provides images of a compactible structure being compacted using a slip-wrapping technique in accordance with embodiments.

Images of a compactible structure that is packaged using slip-wrapping compaction mechanisms and methods incorporating z-folds and rotationally symmetric wrapping in accordance with embodiments are provided in FIG. 26. Using such techniques it is possible to significantly reduce the packaging volume of the satellite modules. In the embodiment depicted in FIG. 26 the deployed square of 0.5 m may be packaged into a cylindrical structure with a diameter of 10 cm and a height of 7 cm. In one exemplary embodiment where the compactible structures of a satellite module have a tile/panel thickness of 1 cm and a minimum bend radius of 10 cm, a satellite module with a deployed area of 60 m×60 m and being comprised of 30 such compactible structures would be compatible using the slip-wrap packaging technique into cylindrical package with a diameter of 5 m and a height of 2 m.

Although z-fold and rotationally symmetric wrapping techniques used in combined slip-wrapping compaction mechanisms and methods have been described, it will be understood that the slip-wrapping embodiments may be used in conjunction with other types of folds, including, fan-folding, double z-folding, Miura-ori, and star-folding, among others. Images of a compactible structure incorporating star folding and symmetric wrapping in a slip-folding compaction technique in accordance with embodiments are provided in FIG. 27.

In many embodiments the number of compactible elements in each of the satellite modules in a solar space station may be the same or different and may contain one or more power generation tiles collocated thereon. One or more compacting techniques may be used in packaging the compactible elements of each of the satellite modules and the techniques used may also be the same or different. In many embodiments the compacting techniques utilized to package the satellite modules prior to deployment reduce the packaging volume of the satellite module in at least one dimension such that the satellite module fits within the allowed payload volume of the selected delivery vehicle.

Compactible Power Generation Tiles

Figure 28:
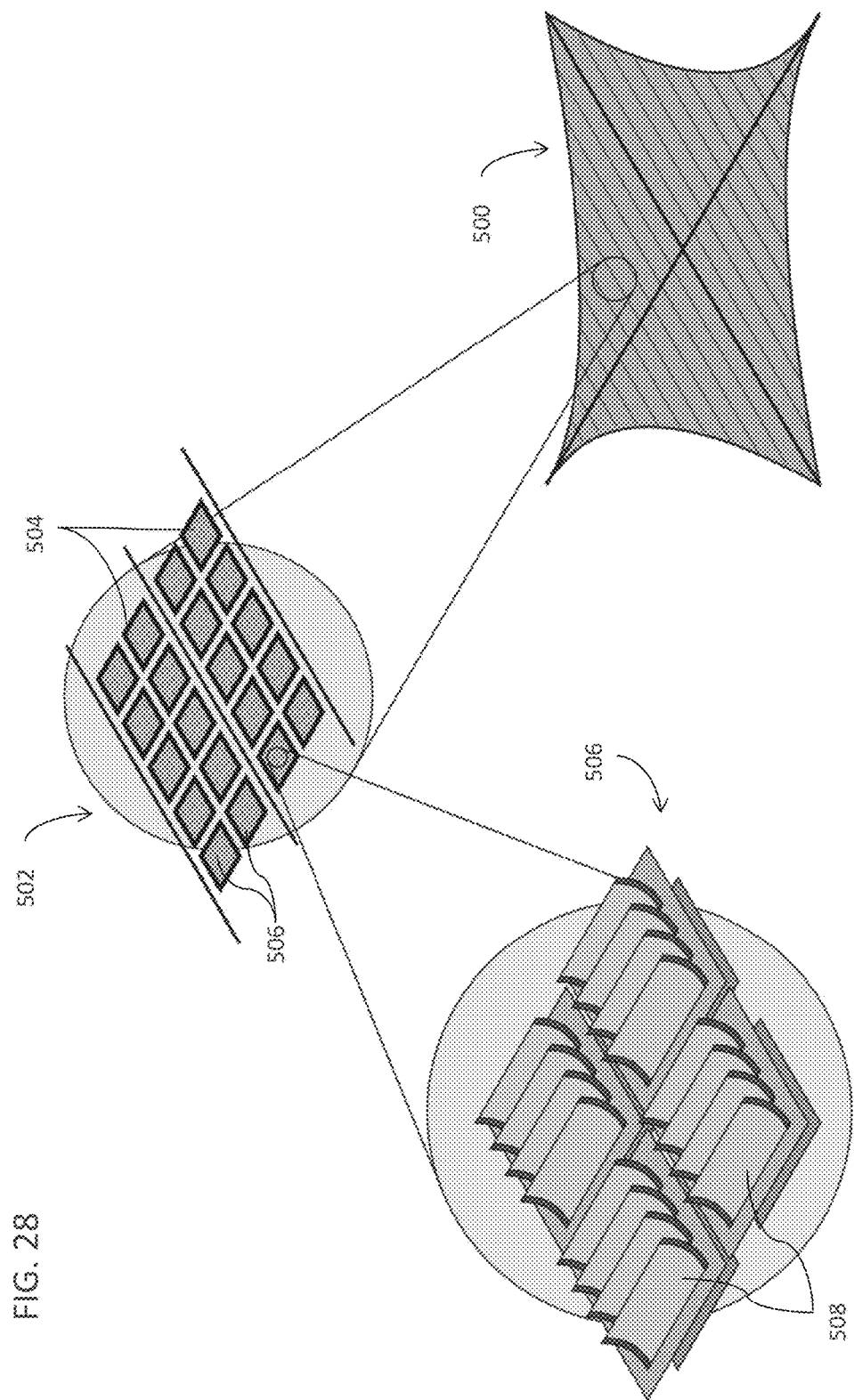
FIG. 28 conceptually illustrates a large-scale space-based solar power station, a compactable satellite module, and a compactible power generation tile in a deployed configuration, according to embodiments.
Figure 29A:
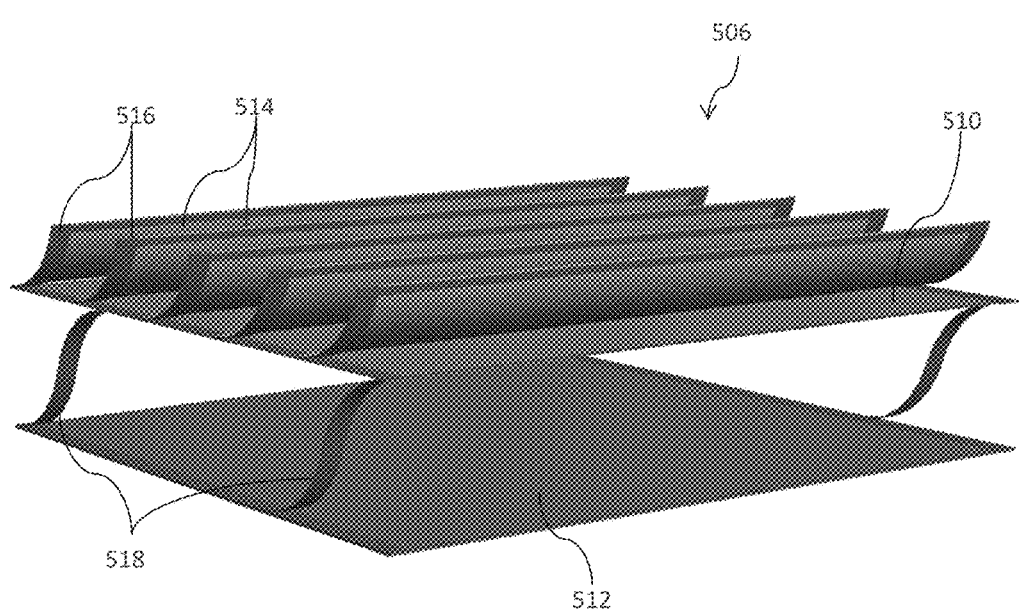
FIGS. 29a and 29b conceptually illustrates: a) a perspective view, and b) a cross-sectional view of a compactible power generation tile, according to embodiments.
Figure 29B:
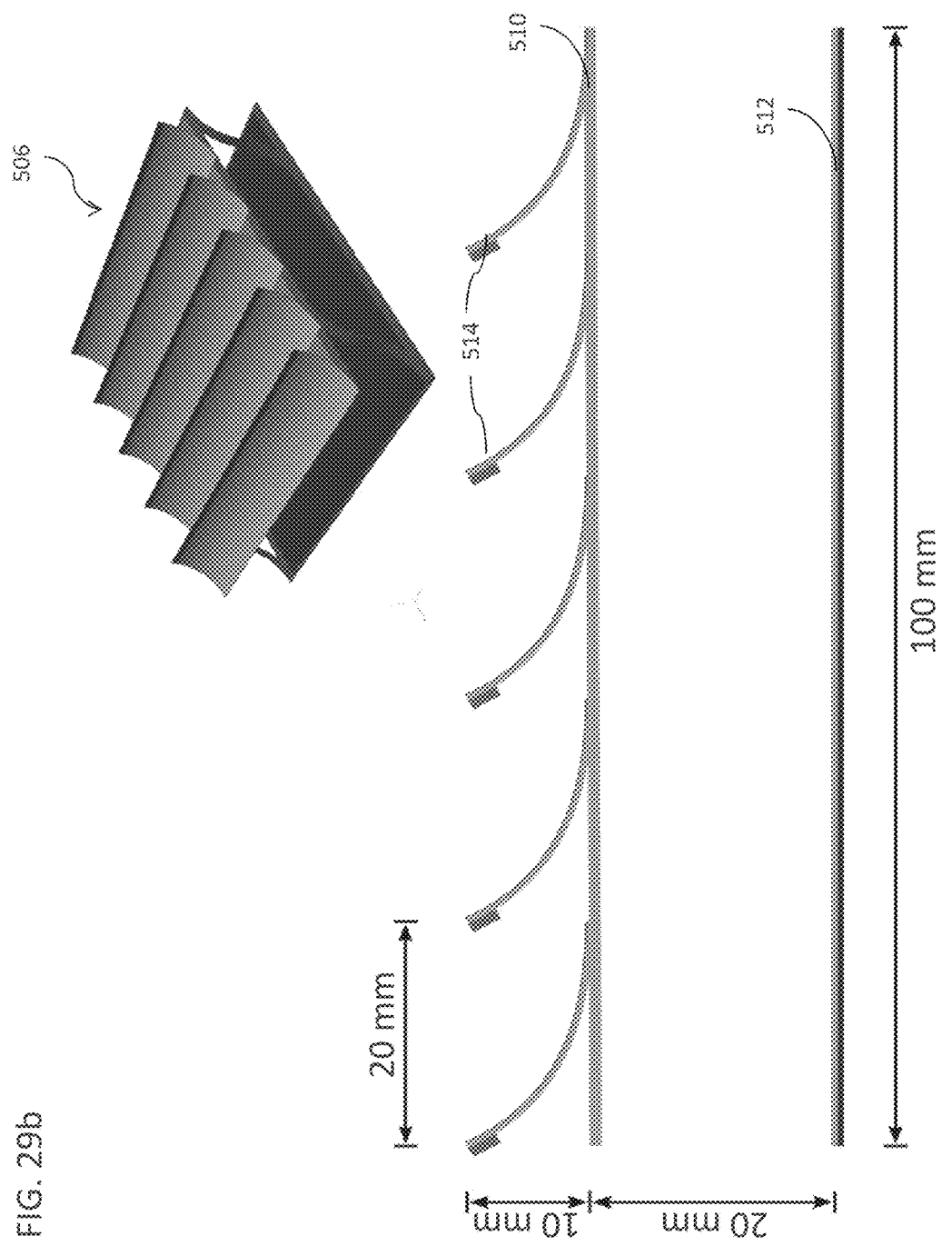

In many embodiments the power generation tiles may have further compactible and expandable features and structures disposed thereon. An illustration of such embodiments is provided in FIG. 28. As shown, in such embodiments a space-based solar power station 500 incorporates a plurality of satellite modules 502 formed from compactible structures that are implemented by a plurality of movable panels 504 on which are disposed a plurality of power generation tiles 506. Some embodiments of such power generation tiles 506 implement one or more compactible and expandable structures 508, such as deployable collectors, photovoltaic cells, antennas, etc. In some embodiments, as illustrated in FIGS. 29a and 29b, power generation tiles 506 may implement photovoltaic cell structures 510 and power transmitter structures 512 that are movably interrelated through a compactable structure, such that when in a compacted or packaged configuration the elements of the power generation tiles are compressed together to occupy a total volume lower than when in a deployed configuration. In some deployed configurations the photovoltaic cell and power transmitter are separated by a gap (e.g., to create an offset, such as a vertical offset, therebetween). Embodiments of compactable structure may include one or more deployable structures and mechanisms.

Figure 30:
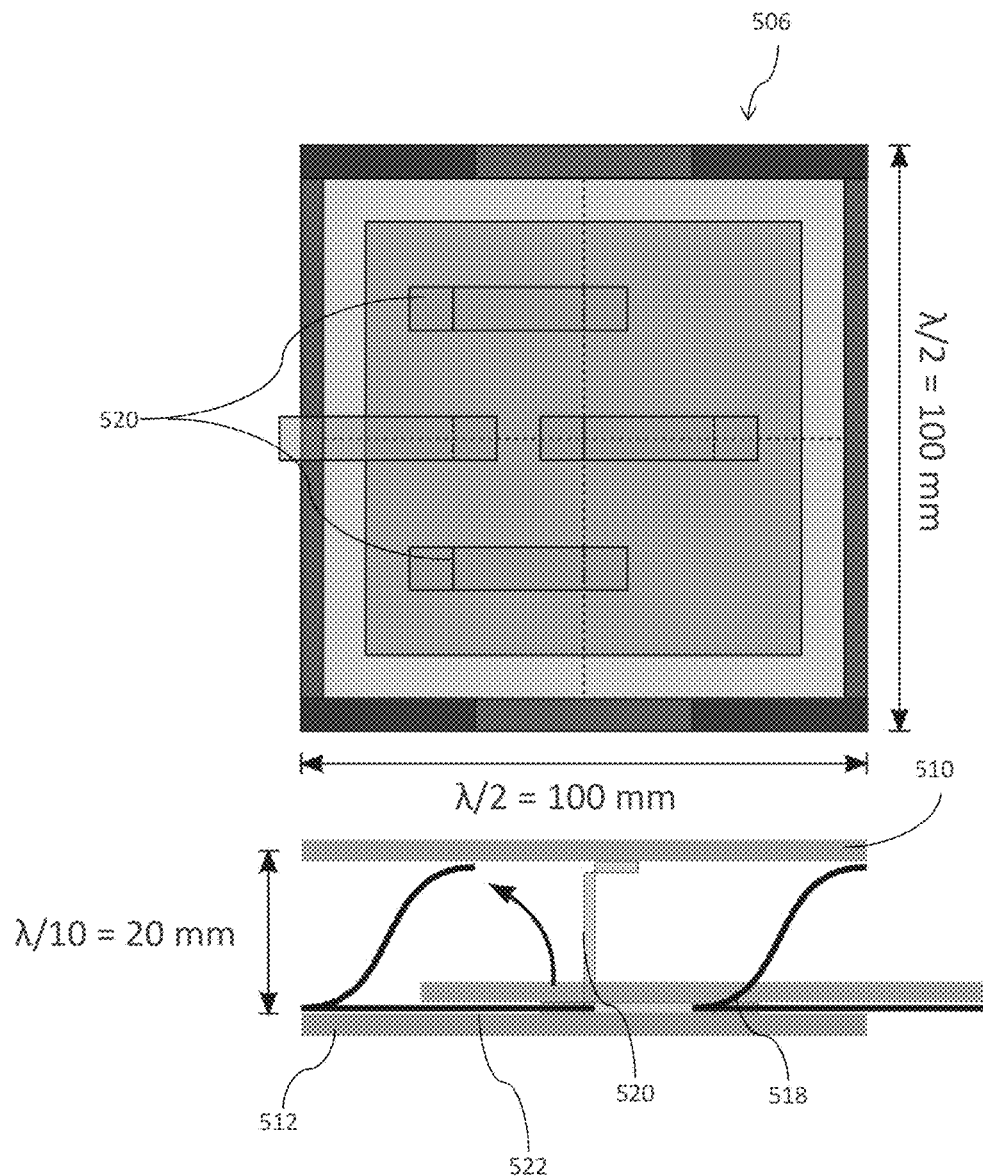
FIG. 30 conceptually illustrates top and cross-sectional views of a compactible power generation tile, according to embodiments.

Deployable structures may be implemented through motorized interconnections and resilient members such as spring or tension arms that are bent or are under compression, among others. Some embodiments may use composite springs (e.g., carbon fiber or "S" springs). Some embodiments, for example, may include collectors 514 that are elastically deployed via spring members 516 incorporated or attached thereto. In some other embodiments the photovoltaic structure 510 may be deployed distally from the power transmitter through elastic structures such as "S" springs 518 that are attached or integrated into one or both of the photovoltaic and/or power transmitter structures. These springs 518 may be compacted into cutouts 522 formed into the body 512 of the power transmitter, as illustrated in FIG. 30. Additional structures may be incorporated with such deployable structures. Some embodiments of power generation tiles 506 where the photovoltaic structure 510 is distally separated from the power transmitter structure 512 may include power and signal feeds 520 to electrically interconnect the photovoltaic and power transmission structures when spatially separated after deployment. Other interconnections, support structures, thermal transmission features, etc. may also be incorporate into such embodiments such that they may be deployed when the compactible structures of the power generation tiles are deployed.

Any suitable materials may be used to form such deployable power generation tiles. In many embodiments suitable conductive materials may include metals such as Au, Al, Ag, Pt. etc. Suitable insulating materials may include polyimide film, among others. The springs and other deployable structures may be made of a suitable resilient material such as carbon fiber, memory metals, etc.

Although specific spring deployable structures are shown, it should be understood that such compactable structures may also incorporate packaging techniques such as one or a combination of z-folding, wrapping, rolling, fan-folding, double z-folding, Miura-ori, slip folding and symmetric wrapping may be used, among others. In addition, although specific deployable structures (e.g., collector, photovoltaics, power transmission, antenna) in association with specific power generation tiles are described, it should be understood that embodiments of such deployable structures may be used to deploy, offset and support other numbers, geometries, configurations, shapes or sizes of such deployable structures according to embodiments.

Pre-Stressing Compactible Structures

In addition to the size and weight of the structures of the satellite modules, another consideration in their design in accordance with embodiments is their stability, i.e., conformation to a pre-designed shape and ability to resist deformation from that pre-designed shape during operation. The stability requirement for a satellite module, power generation tile, etc. depends on its size and purpose, and, for a power transmitter the wavelength of operation. For example, consider a phased array of square patch antennas on a grid of $\lambda/2$ with $\lambda \approx 30$ cm (1 GHz microwaves), attached to a 60 m diameter spinning membrane structure. The antennas are synchronized to emit coherently in order to transmit power in a narrow beam. If the calibration of the antennas is carried out assuming that the membrane structure is perfectly planar, a subsequent distortion of the structure distorts the radiation pattern and causes some power to be lost.

Figure 31:
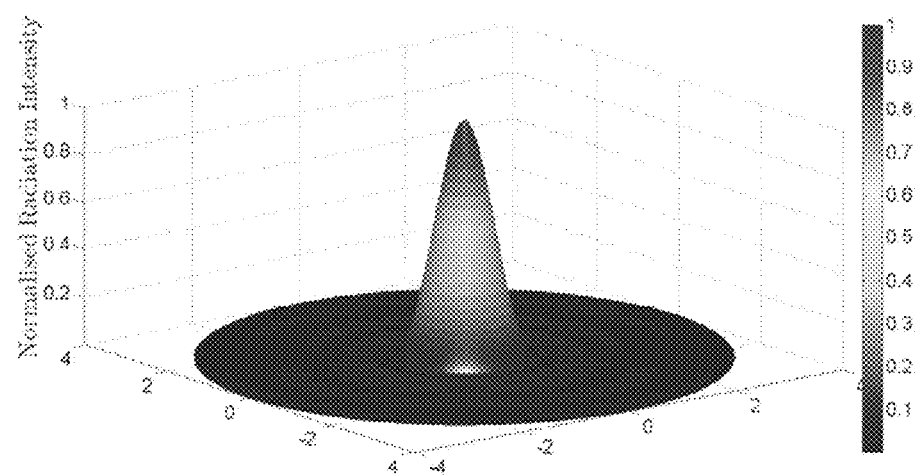
FIG. 31 provides a data graph illustrating a radiation pattern from a flat power transmitter, according to embodiments.
Figure 32:
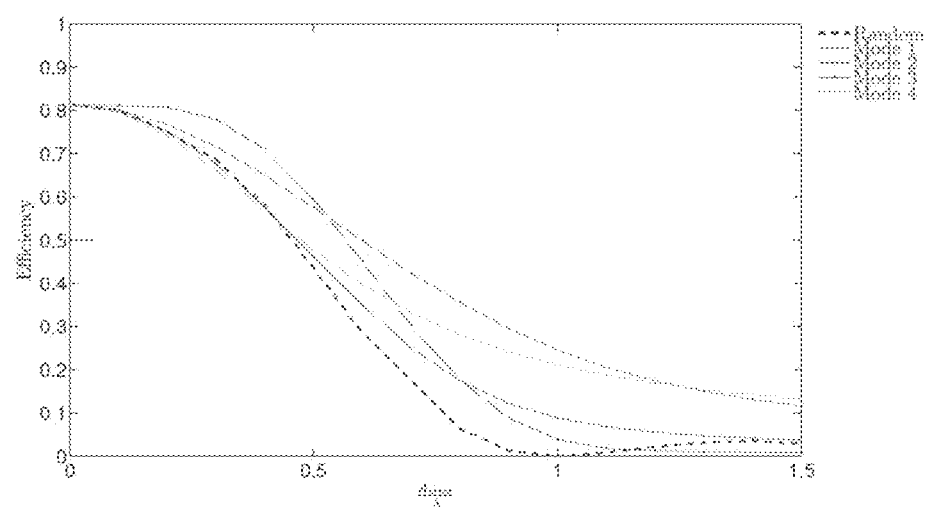
FIG. 32 provides a data graph illustrating the effect of vibrational deformation on the power transmission efficiency, according to embodiments.
Figure 33:
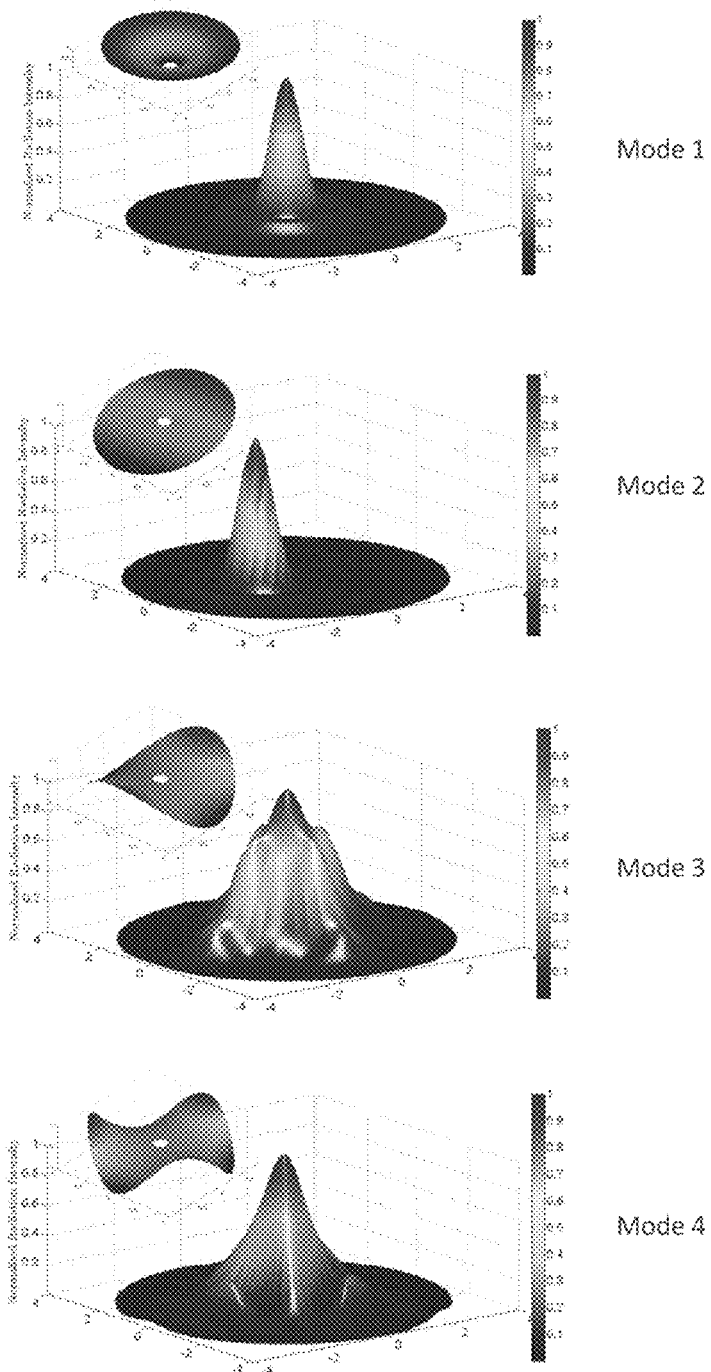
FIG. 33 provides data graphs illustrating radiation patterns from power transmitters subject to deformation, according to embodiments.

The efficiency of the array antenna is defined as the capability of transferring power in a chosen direction, which corresponds to the direction of the main beam if the antenna is perfectly planar. FIG. 31 shows the normalized radiation pattern (normalized radiation intensity in every direction) of a calibrated flat structure for λ=1 m (faster simulations). FIG. 32 shows the power transmission efficiency of the 60 m antenna array described above respectively deformed on each of the first vibration modes of a spinning membrane as a function of the deformation amplitude along with random deformation of various amplitudes. (Normalized radiation patterns from each of four vibration modes of deformation are provided in FIG. 33.) In the graph the x-axis is the amplitude of the mode (maximum out-of-plane deformation) divided by the wavelength. In particular, for λ=30 cm FIG. 32 shows that a shape error of as little as 18 cm over a 60 m structure can, in certain embodiments, decrease the power efficiency of the power transmission by a factor of two for at least one mode.

There are a number of sources of possible deformation in the out-of-plane flatness of satellite modules and power generation tiles according to embodiments, including: material imperfections (e.g., initial and degradation over time), compaction imperfections (e.g., creases, electrostatic self-attraction, wrinkles), thermal interference (e.g. external and internal sources), inertial loads (e.g., translations that depend on orbit and formation such as maneuvering, and rotation such as reaction wheels and slewing, among others), gravity gradients (including in-plane and out-of-plane), and solar pressure (e.g., from solar radiation).

Figure 35A:
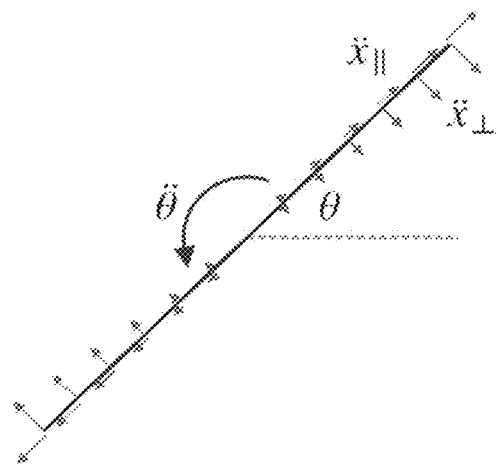
FIGS. 35a to 35c provide: a) a conceptual illustration of inertial loading forces, b) graphs of such inertial loading, and c) a data graph showing the deformation force applied to a satellite module subject to inertial loading, according to embodiments.

Consider inertial loads placed on the satellite modules of a solar space station during operation. One exemplary inertial load, as illustrated in FIG. 34 might occur as the result of a need to slew the satellite module to keep either or both the photovoltaic or power transmitter pointed in the correct direction (e.g., in the direction of incoming solar radiation or in the direction of a power receiving rectenna, respectively). In such cases, as shown in FIG. 35a, the forces on the slewing satellite module would have two components: a normal load from Euler force related by the expression:

$$\ddot{\chi}\perp = \ddot{\Theta} r_{mod} \quad \text{(EQ. 10)}$$

and a centrifugal force given by the expression:

$$\ddot{\chi}_\| = \dot{\Theta}^2 r_{mod} \quad \text{(EQ. 11)}$$

Figure 35B:
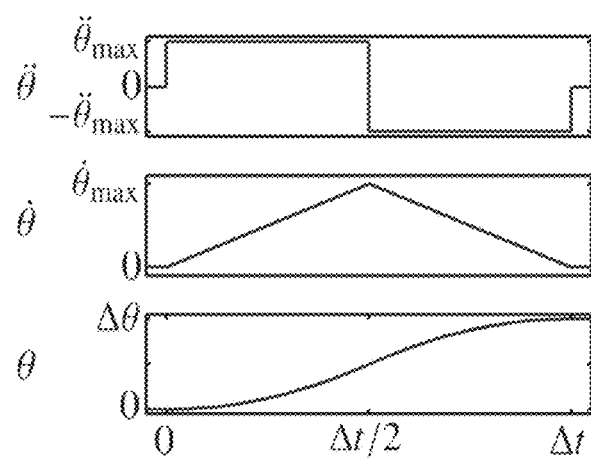
Figure 35C:
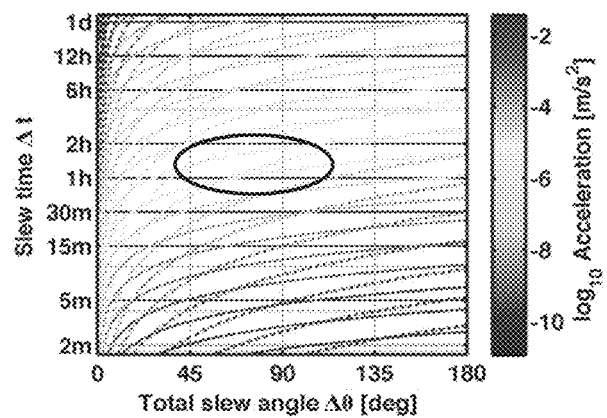

The maximum acceleration profiles for such inertial loads are shown graphically in FIG. 35b for values of θ to θ̇. Using these values it is possible to plot the inertial load for a particular movement over a specified time period, as shown in the data plot in FIG. 35c. Assuming a 90° slew over a one hour time period (which can be considered a fast-slew within embodiments of the SPS), an inertial load of 5.15× $10^{-7}$ N/m² normal to the plane of the satellite module and an inertial load of 8.10×$10^{-7}$ B/m² in the plane of the satellite module would be generated.

Figure 36A:
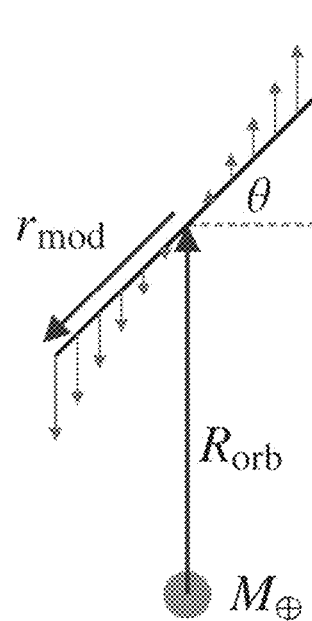
FIGS. 36a and 36b provide: a) a conceptual illustration of gravity gradient loading forces, and b) a data graph showing the deformation force applied to a satellite module subject to gravity forces, according to embodiments.

Similarly, as illustrated in FIG. 36a, it is possible to predict the gravity gradient load on a satellite module according to the expression:

$$\ddot{x}_{gg} = \left( \frac{1}{R_{orb}^2} - \frac{1}{(R_{orb} - r\sin\theta)^2} \right) GM_\oplus \quad \text{(EQ. 12)}$$

Figure 36B:
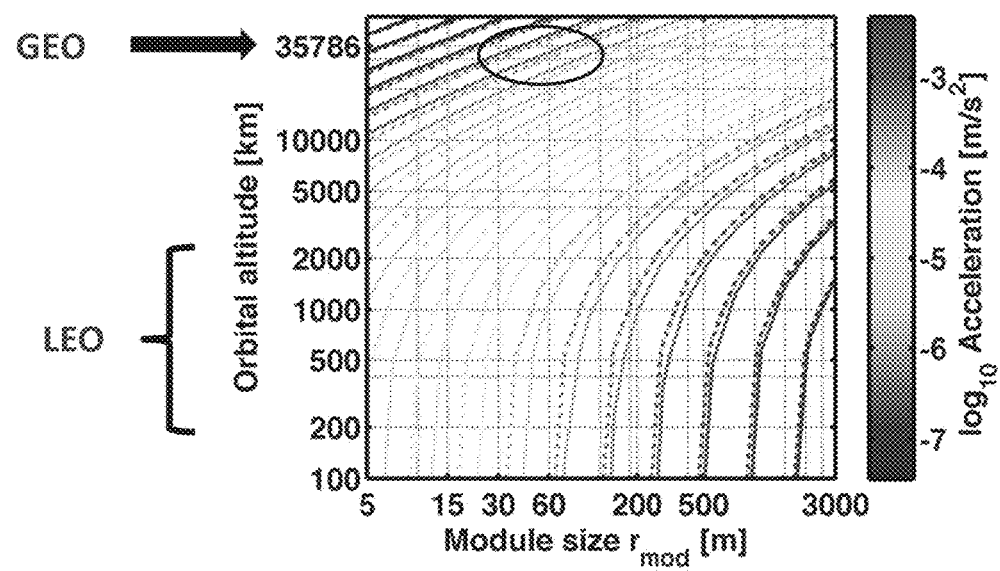

At the geosynchronous orbits at which the SPS is proposed for operation, the gravity gradient loads are ~5.64×$10^{-9}$ N/m² (normal) and ~1/13×$10^{-8}$ N/m² (out of plane), as shown graphically in FIG. 36b. These forces are a factor of 100 lower than the loads applied by inertial loading.

Finally, the contribution of the solar radiation pressure for an exemplary SPS (e.g., combination of photon absorption, reflection and emission) can be given by the expression:

$$P_{SRP\perp} = \frac{nE_f}{c} \cos^2\beta \quad \text{(EQ. 13)}$$

Where the reflector is normal to the sun at 1 AU the normal solar radiation pressure would be on the order of 9.08×$10^{-6}$ N/m², the highest deformational load of the contributions from inertial loading, gravity loading and solar radiation pressure by a factor of 10.

Figure 37:
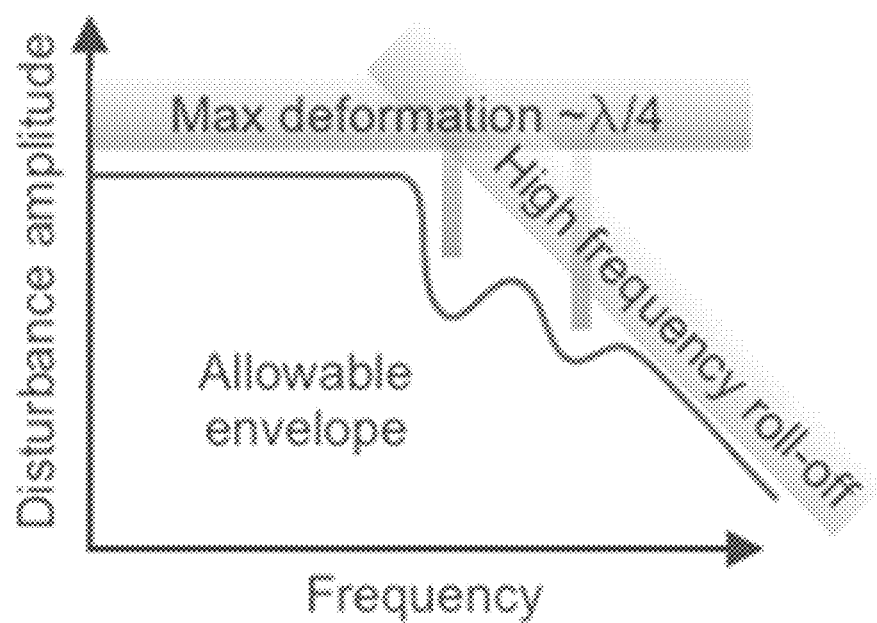
FIG. 37 provides a conceptual data graph showing the maximum allowable deformation of a satellite module, according to embodiments.

Regardless of the source of deformation, in some embodiments a maximum deformation amplitude related to the frequency can be plotted, as shown in FIG. 37. As shown, an allowable disturbance envelope may be characterized below ~λ/4 for low frequency disturbances. It will be noted that there is a roll-off at high frequency because of an inability to measure and compensate for disturbances quickly enough at high enough frequencies. Accordingly, in some embodiments the satellite module on which the power generation tiles are located is configured to be sufficiently stable to avoid the creation of, or to reduce the system's sensitivity to, deleterious deformations in the power transmission of the solar power station. Some embodiments are configured to avoid the creation of, or to reduce the system's sensitivity to disturbances below a maximum deformation amplitude of around λ/4. Alternatively or in addition, electronic recalibration can be used in many embodiments to correct for such deformations.

Figure 38A:
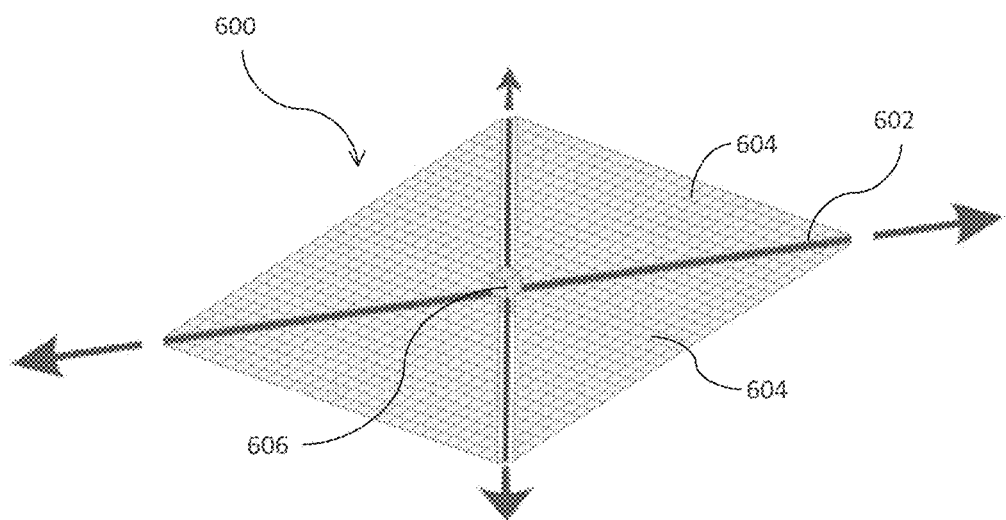
FIGS. 38a and 38b conceptually illustrate a prestress mechanism employing a series of stabilizing arms, according to embodiments.
Figure 38B:
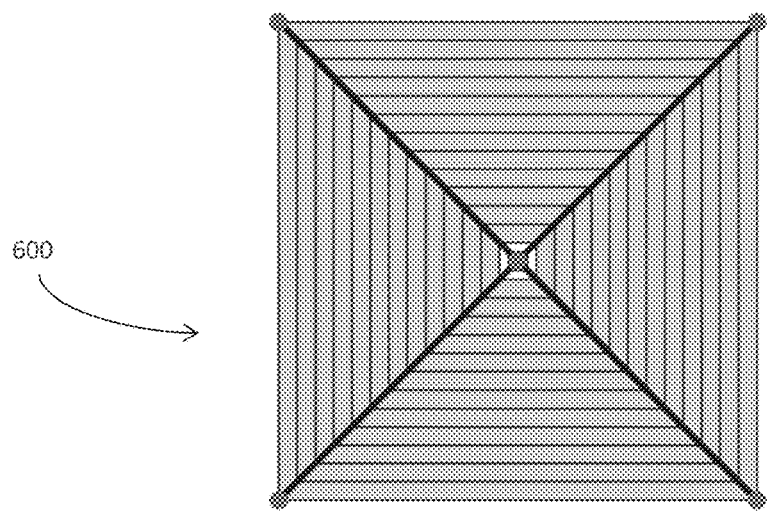

In many embodiments, deformations of the satellite modules and power generation tiles of the solar power station are mitigated by prestressing one or more of the components of each of the satellite modules such that the planar surface of the satellite module is stabilized against out of plane deformation. Some embodiments of pre-stressing mechanisms and methods include the use of stabilizing booms under compression or bending such that a prestress is applied across at least a portion of the satellite module. An illustration of a prestressed satellite module 600 using stabilizing booms 602 is illustrated in FIGS. 38a and 38b. In some embodiments the satellite module 600 is divided into quadrants of compactible structures 604 with booms 602 extending along a diagonal with respect to the quadrants. In many embodiments, the quadrants are connected to the booms on at least two points, along their length near the hub 606 and at the end of the boom 608 (e.g., such that the prestress tensions is distributed through the edges of the compactible structures of the satellite module), although the number and type of connections to the booms may take any suitable form. The quadrants 604 may be subdivided into a plurality of compactible structures that may be disposed in any number, configuration, shape or size suitable for compaction. In the exemplary embodiment illustrated in FIG. 38a, the quadrants of the satellite module are divided into a plurality of square tiles, however, other configurations could be considered, such as in elongated panels running perpendicular or parallel to the stabilizing booms (as shown in FIG. 38b). In addition, although four quadrants are shown in the figures, it should be understood that any number, size and shape of such divisions of the overall compactible structure may be formed and interconnected by any number or configuration of stabilizing booms.

Figure 39:
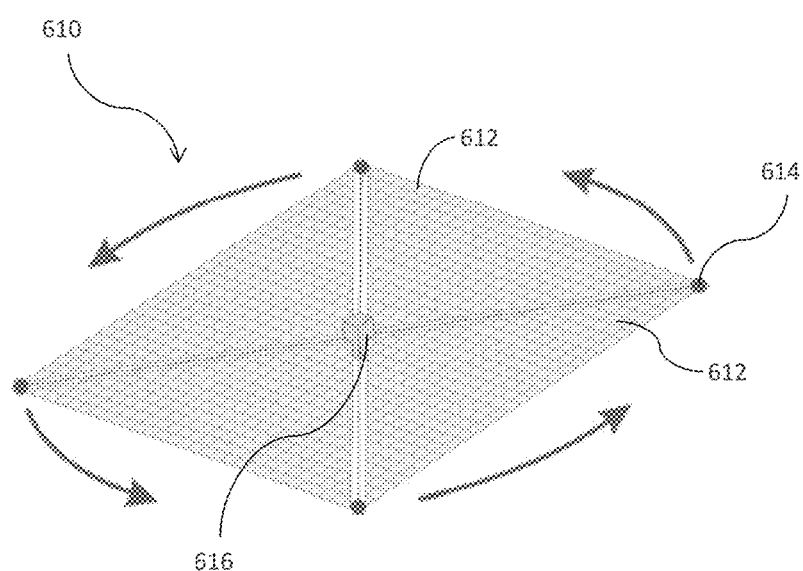
FIG. 39 conceptually illustrates a prestress mechanism employing weighted tips, according to embodiments, FIG. 40 conceptually illustrates the anistropic prestress of a slip-folded compactible structure, according to embodiments.

In other embodiments, the stabilizing pre-stress force may be applied via a dynamic force, such as a weighted spinning structure. An illustration of one such embodiment is provided in FIG. 39 where weighted elements 614 are attached between a central hub 616 and at least an edge portion of each of the compactible structures 612 of the satellite module 610 such that when the central hub of the satellite module is spun the centrifugal force of the spinning hub causes the weighted elements to apply a pre-stress to the compactible structures. In such embodiments the satellite module may be made to spin continuously to provide a stabilization force to the compactible structures. Although an embodiment shown weighted tip elements at four corners of the satellite module, it should be understood that any number, arrangement, shape and size of weighted elements may be provided such that a sufficient stabilizing force is applied to the panels of the compactible structure of the satellite module. In many embodiments, the weighted elements may be integrated with the panels such that separate weighted element are not provided.

Figure 40:
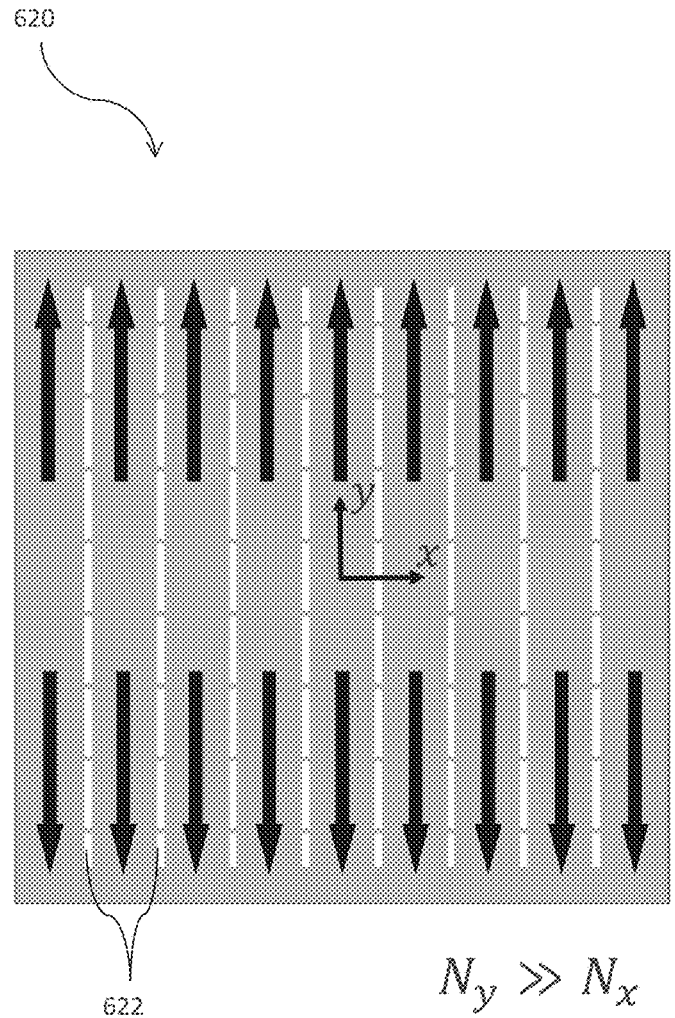

Satellite modules incorporating slip-folds may also be pre-stressed in accordance with embodiments. However, a satellite module 620 incorporating slipping folds 622 is anisotropic (e.g., the stiffness parallel to the slipping folds is much higher than the stiffness perpendicular to them), as illustrated in FIG. 40. In embodiments, this anisotropy is incorporated into the stabilizing method or mechanism when prestressing the moveable elements of the compactible structure of the satellite module. Some embodiments implement pre-stress configurations and mechanisms such that the prestress along the fold axis is much higher than the pre-stress orthogonal to the fold axis. An illustration of an embodiment of a compactible structure 630 incorporating such an anisotropic prestress configuration is provided in FIG. 41. In the embodiments slipping folds 632 are provided parallel to the y-axis 634, and the compactible structure of the satellite module has a length a along the x-axis and length b along the y-axis. The prestress is applied such that each panel has equal tension in the y-direction (i.e., parallel to the slipping folds), and no tension (or a much lower tension) is provided in the x-direction (i.e., perpendicular to the slipping folds). In such embodiments global tensioning forces $F_x$ at $[\pm a/2, 0]$ and Fy at $[0, \pm b/2]$ (e.g., using suitable external stabilizing members, such as booms or masts, or weights and a spinning force as described above) may be applied to the compactible structures of the satellite module.

In some embodiments the satellite module edges can be shaped so as to distribute prestress tensioning forces to implement uniaxial tensile loading P, which is a force per unit length, to the moveable elements of the compactible structure. Since the symmetric wrapping according to embodiments can be implemented such that the edges 636 of the membrane are continuous and uncut, they can operate to transmit the tension from the prestress to the moveable elements. In many embodiments the application of the prestress tension is configured such that the force P is uniformly distributed. Some embodiments implement uniform prestress along the moveable elements of the compactible structure by conforming the edges of the compactible structure into a parabolic conformation.

Figure 41:
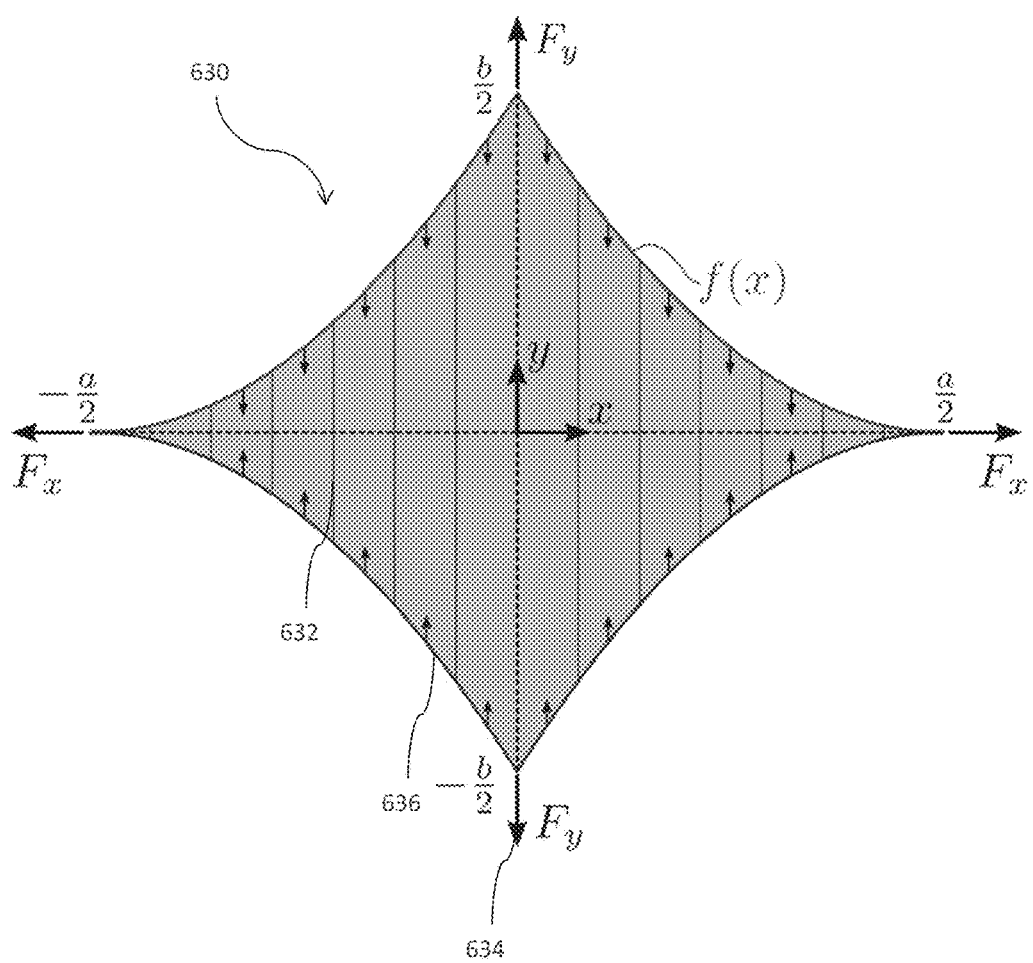
FIG. 41 conceptually illustrates a prestress mechanism for a slip-folded compactible structure, according to embodiments.
Figure 42:
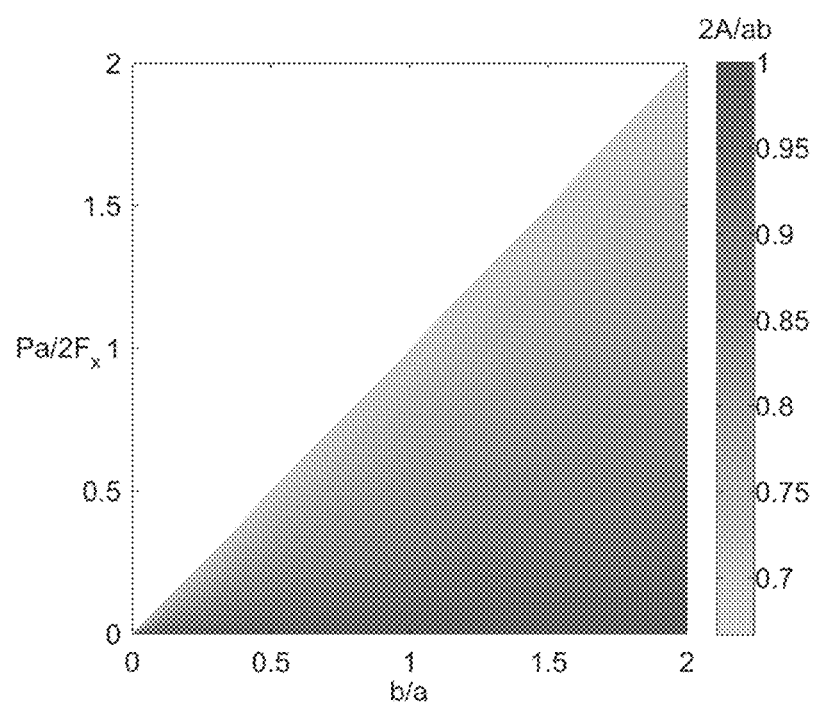
FIG. 42 provides a data graph calculating geometric profiles for a slip-folded compactible structure, according to embodiments.

Although one particular parabolic edge profile is shown in FIG. 41, the possible configuration of edge profiles (f(x):[0, a/2]→R) available can be determined by examining the area A normalized by the rhombus area ab/2 as a function of the aspect ratio b/a and the normalized loading $Pa/2F_x$. As illustrated in FIG. 42, the white area on the graph is inaccessible because f'(a/2)≤0, where:

$$f(x) = \left(\frac{P}{F_x}\right)x^2 - \left(\frac{Pa}{2F_x} + \frac{b}{a}\right)x + \frac{b}{2} \quad \text{(EQ. 14)}$$

The profile of the edges of the compactible structure of the satellite module can be constructed by taking f(x) and mirroring it about the x and y axes. To ensure f(x)≥0 then f'(a/2)≤0, and hence the following expression follows:

$$\frac{Pa}{2F_x} - \frac{b}{a} \leq 0 \quad \text{(EQ. 15)}$$

where $Pa/2F_x$ is the loading parameter and b/a is the aspect ratio. In turn, the prestressed satellite module area A normalized by the rhombus area ab/2 can be determined by these parameters, as can the ratio of the global tensioning forces $F_y/F_x$, according to the following expressions:

$$\frac{2A}{ab} = 1 - = \frac{1}{3}\frac{a}{b}\frac{Pa}{2F_x} \quad \text{(EQ. 16)}$$

$$\frac{F_y}{F_x} = \frac{Pa}{2F_x} + \frac{b}{a} \quad \text{(EQ. 17)}$$

These values are plotted in FIG. 42 and provide a graphical description of the dimensionless area as a function of these parameters.

Figure 43:
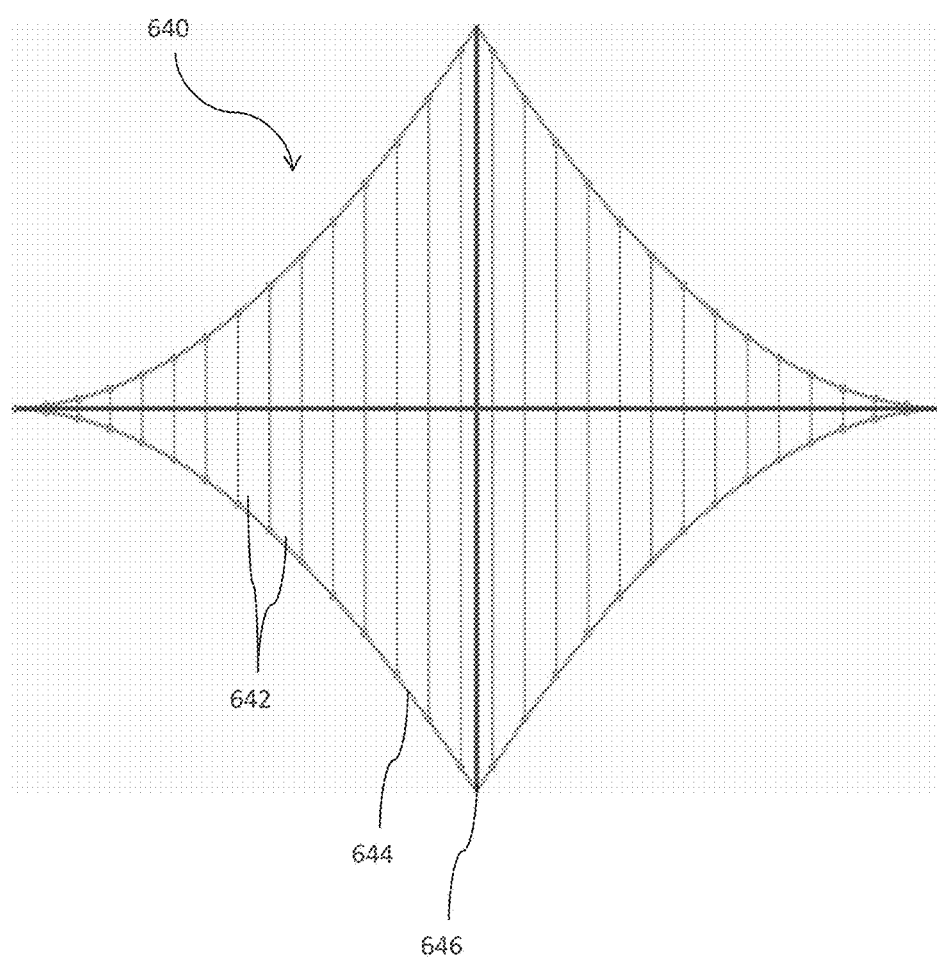
FIG. 43 conceptually illustrates a prestress mechanism for a slip-folded compactible structure, according to embodiments.

Accordingly, in some embodiments the edge profile of the compactible structure of the satellite module is configured in accordance with the loading parameter and aspect ratio such that the prestress force P provides equal tension across the movable elements of the satellite module in the direction parallel to the slip folds of the moveable elements. Some embodiments implement prestress on slip folded compactible satellite modules through one or more stabilizing members (e.g., compression or bend loaded boom arms) and/or tip weighted members that apply a prestress force to the movable members of the satellite modules along the axis of the slip folds that is higher than the prestress force applied orthogonal to the axis of the slip folds. Some embodiments apply a zero prestress force to the axis orthogonal to the slip folds. In many embodiments the prestress force may be distributed across the individual movable elements 642 of the satellite module 640 through an edge cord 644 that is attached between the stabilizing members 646 and at least one end of each of the movable elements of the satellite module, as illustrated in FIG. 43. Some edge cords are provided with a parabolic profile that matched the parabolic edge profile of the movable elements of the satellite module.

Figure 44:
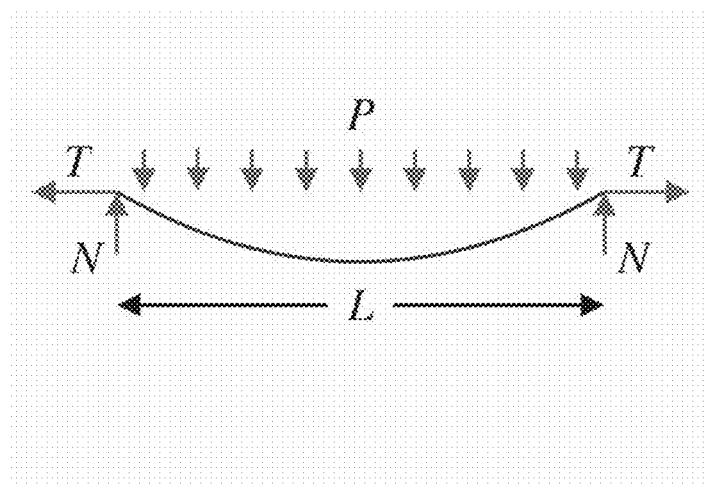
FIG. 44 conceptually illustrates the forces applied to a prestressed compactible structure, according to embodiments.

The amount of the prestress load applied to the movable elements is dependent on the amount of deformation expected and allowable for satellite module operation. The relationship between the load on the movable elements and maximum deformational deflection can be determined according to embodiments. FIG. 44 illustrates the loads on a movable element of length L with a prestress tension T applied thereto. According to embodiments, the maximum deflection for such a movable element may be given by:

$$\Delta y_{max} = \frac{WP}{2T}\left(\frac{L}{2}\right)^2 \quad \text{(EQ. 18)}$$

and the maximum rotation of the movable element may be given by:

$$\left(\frac{dy}{dx}\right)_{max} = \frac{LWP}{2T} \quad \text{(EQ. 19)}$$

According to embodiments, for a 60 m satellite module formed of 30 movable panel elements to keep the maximum deflection below 8 cm would entail implementing a tension of 4.24 N to the movable elements, which could be accomplished by carbon fiber composite booms having a radius of 2.5 cm. It will be understood that using embodiments many other configurations of prestress forces and moveable elements capable of stabilizing the satellite module may be implemented.

Figure 45:
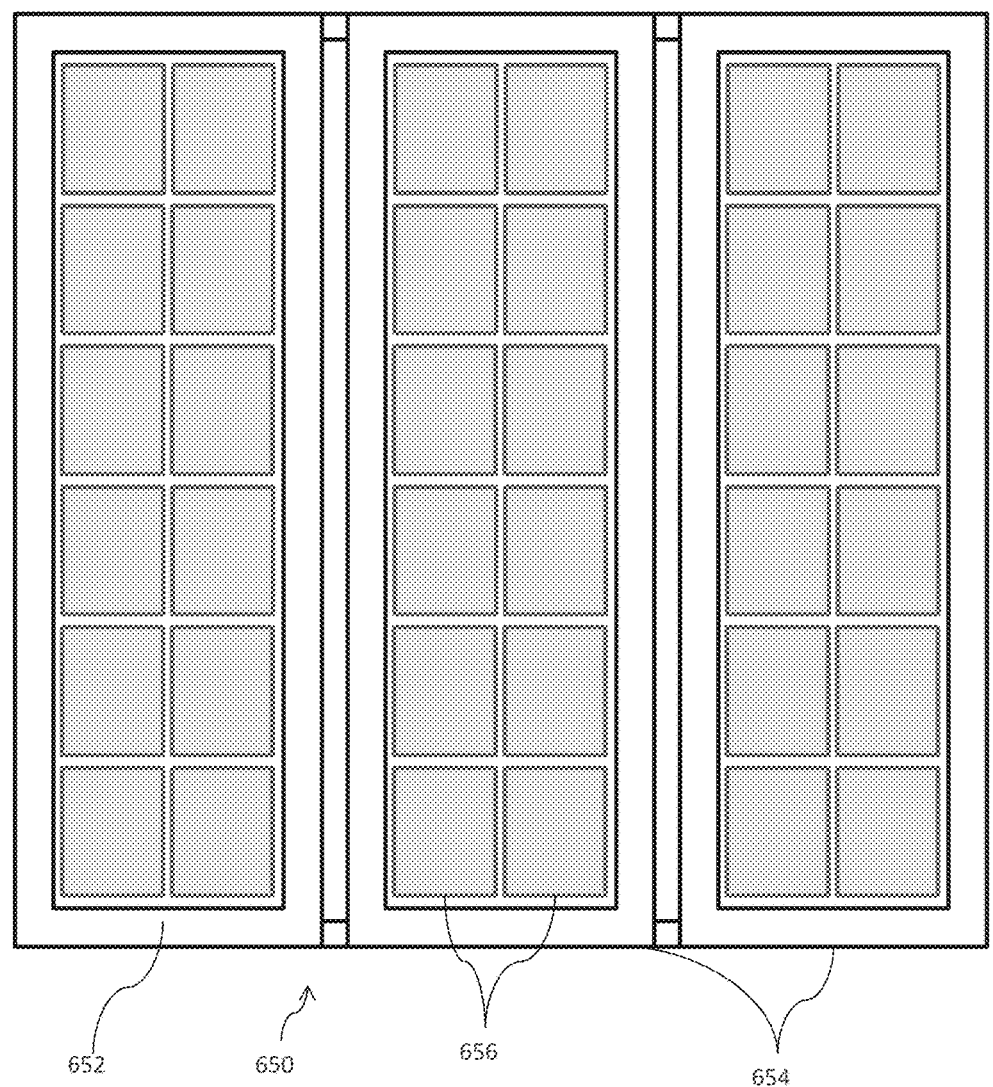
FIG. 45 conceptually illustrates moveable panels having a plurality of power generation tiles incorporating frameworks for isolating prestress from the power generation tiles, according to embodiments.

Some embodiments of prestressed satellite modules 650 implement lightweight structures 652 (e.g. a network of rigid or semi-rigid frames) either at the module or the movable element level 654 onto which the power generation tiles 656 may be attached (e.g. hung) such that the prestress is distributed through the lightweight structure and the individual power generation tiles carry very little or no prestress, as illustrated in FIG. 45. Alternatively, the prestress may be directly distributed through a network of interconnected power generation tiles.

Although specific embodiments of mechanisms and methods for applying prestress forces for various satellite modules have been provided, it should be understood that alternative prestressing mechanics and methods may be applied to the satellite modules such that a stabilizing force is distributed across the movable elements of the satellite module according to alternative embodiments. In addition, the prestressing embodiments described may be applied to other compactible satellite modules having different number, shape or configurations of movable elements.

Compactible Structure Deployment Mechanisms

In many embodiments deployment mechanisms are provided to deploy the compacted satellite modules (e.g., move the compactible elements of the satellite module from a compacted to a deployed configuration). In many embodiments an active or passive mechanism is interconnected with one or more portions of the compactible structures of the satellite module such that when activated the compacted structures of the satellite modules may be expanded into a deployed operational configuration.

Figure 46A:
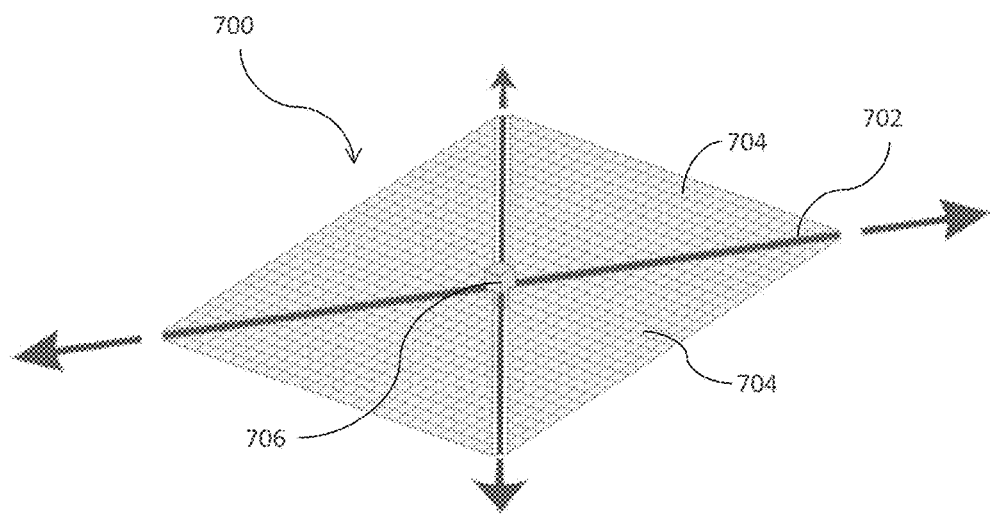
FIG. 46a conceptually illustrates a boom deployment mechanism for a compactable satellite module, according to embodiments.

In some embodiments a mechanically expandable member may be incorporated into the satellite module. An illustration of such a satellite module is provided in FIG. 46*a* where a satellite module 700 having a plurality of compactible structures 702 are disposed about a central hub 704. The compactible structures 702 are interconnected on at least one edge with a mechanically expandable member 706 such that as the mechanical member is urged outward the compactible structures are also expanded outward from the central hub. The expandable member may be motorized or may use stored energy, such as, compressed or bent expandable members, among others.

Figure 46B:
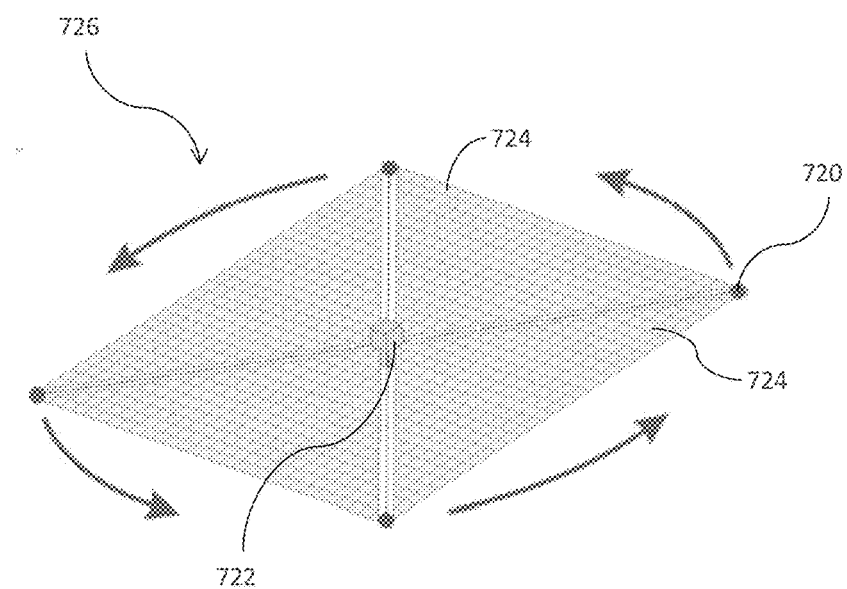
FIG. 46b conceptually illustrates a spin deployment mechanism for a compactable satellite module, according to embodiments.

In many embodiments the compactible structures of the satellite module may be configured such that motion of the satellite module provides the expansive deployable force. An illustration of one such embodiment is provided in FIG. 46*b* where weighted elements 720 are attached between a central hub 722 and at least a portion of each of the compactible structures 724 of the satellite module 726 such that when the central hub of the satellite module is spun the centrifugal force of the spinning hub causes the weighted elements to move outward thereby expanding the compactible structures. In such embodiments the satellite module may be made to spin continuously to provide a stabilization force to the compactible structures.

Figure 47A:
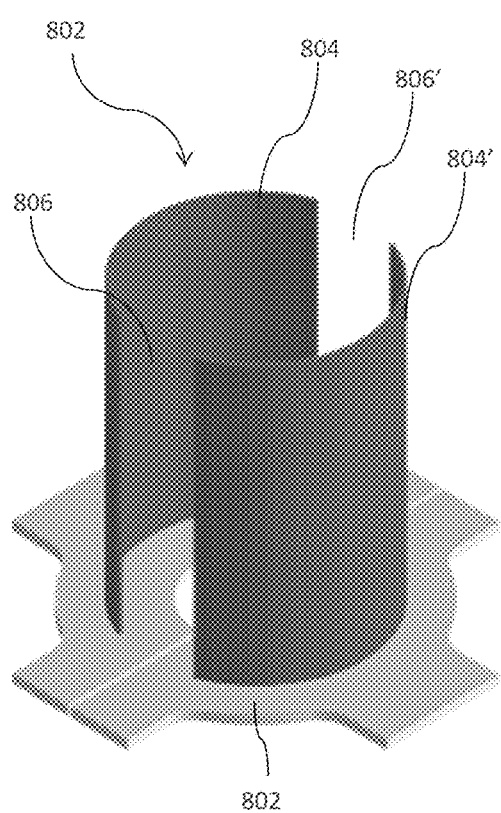
FIGS. 47a and 47b conceptually illustrate a packaging and deployment construct for a slip-folded compactible structure, according to embodiments.

Embodiments are also directed to packaging/deployment constructs for implementing a slip-wrapped satellite module. Some embodiments of such a slip-wrapping packaging/deployment construct in the form of a cage 800 and associated clip 801 is illustrated in FIG. 47*a* (isometric view of cage) and 47*b* (sectional view of clip). In many embodiments, the cage 800 provides an unwrapping management device incorporating a hollow body 802 formed of two halves 804 and 804' and having two slots disposed therein 806 and 806'. Some slots 806 and 806' are formed across the two halves 804 and 804' of the hollow body. During operation the wrapped and folded satellite module would be positioned within the hollow body with the ends B and B' at the slot entrances such that they can be pulled therethrough by application of the forces (e.g., $F_B$ and $F_{B'}$). In many other embodiments the clip is used in conjunction with the cage and provides an unfolding management device. The clip in accordance with embodiments is rotatably mounted within the cage body 802 such that the clip may rotate relative thereto during the unwrapping. The clip incorporates moveable panel holding portions 808 and 808' interconnected via a central axial element 810. The holding portions are configured such that the top 812 and bottom 812' portions of at least some of the moveable panels within the stack of moveable panels are held within the midportion of the clip. Some embodiments of the holding portions provide sufficient holding pressure to the moveable panels such that the moveable panels are controllably deployed during unfolding one section at a time in a sequential manner. During operation, the ends A and A' of the stack of moveable panels of the unwrapped compactible structure are positioned such that during the unfolding the halves 804 and 804' of the cage body 802 are drawn apart as the moveable panels are unfolded when the forces (e.g., $F_A$ and $F_{A'}$) are applied to the ends A and A' thereof.

Figure 47B:
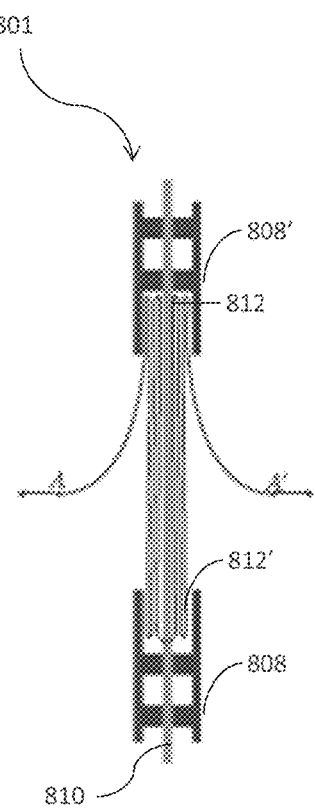
Figure 48:
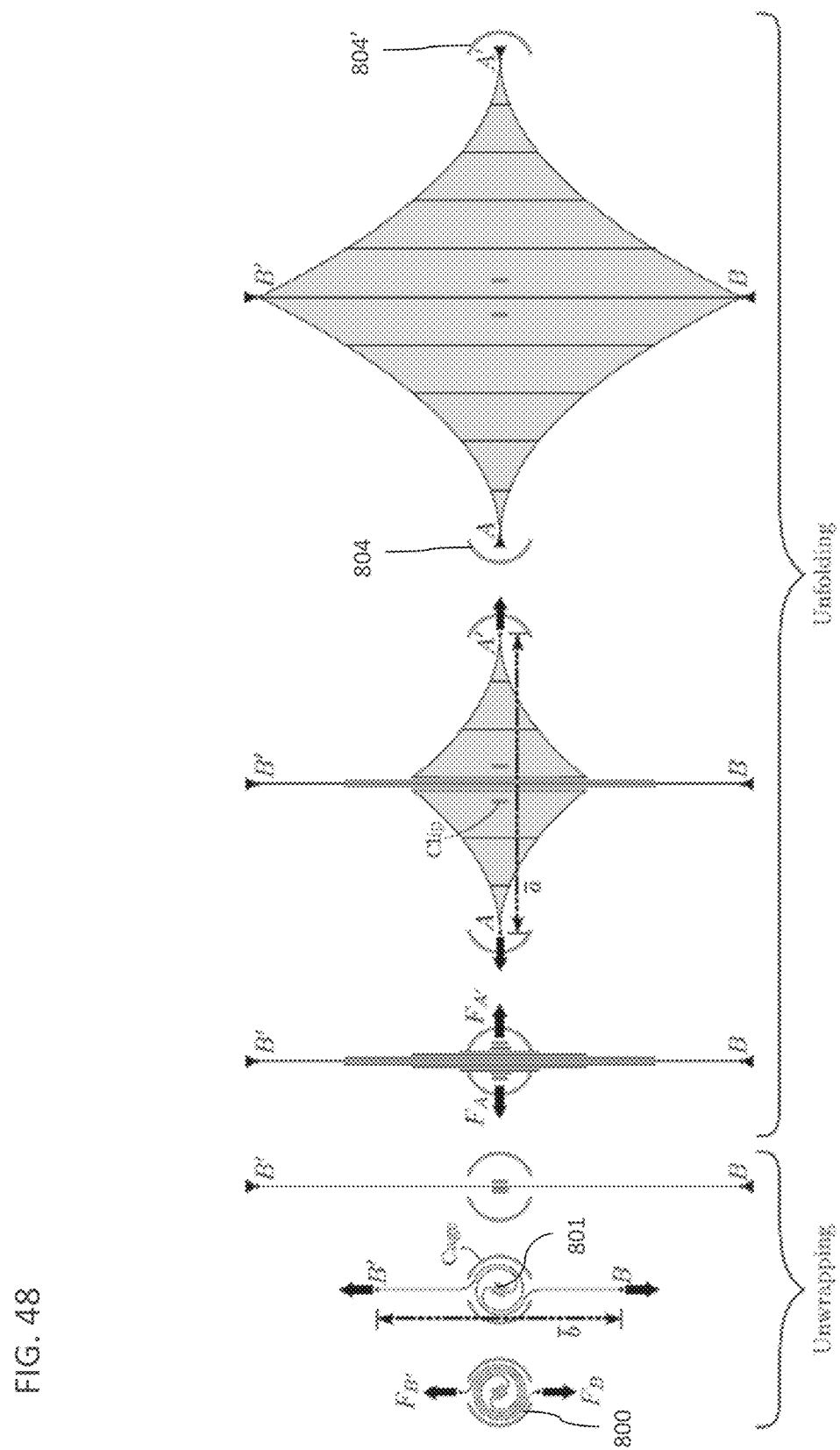
FIG. 48 conceptually illustrates the deployment of a slip-folded compactible structure implementing a packaging and deployment construct, according to embodiments.

Some embodiments for deploying a slip-wrapped compactible structure using the packaging and deployment construct of FIGS. 47*a* and 47*b* are illustrated in FIG. 48. As shown in some embodiments the unwrapping stage is implemented by pulling the two ends B and B' in opposite directions out of the cage 800 by applying appropriate forces (e.g., $F_B$ and $F_{B'}$). The application of force to the ends may be done in any order consecutively or simultaneously and the force is applied until such point that the entire lengths of the moveable panels of the compactible structure are unwrapped such that a stack of elongated folded moveable panels of the compactible structure is obtained. During the unwrapping the clip 801 will rotate within the cage 800. Once the unwrapping is complete the stack of moveable panels is unfolded by applying a force (e.g., $F_A$ and $F_{A'}$) at points A and A' of the stack of moveable panels. The application of force to the ends of the unwrapped stack moveable panels may be done in any order consecutively or simultaneously and the force is applied until such point that a fully deployed compactible structure is obtained. As shown during the unfolding the halves 804 and 804' of the cage are drawn away with the ends A and A'. Although the unwrapping/unfolding deployment methodology was described in relation to embodiments of a packaging/deployment construct it will be understood that such a unwrapping/unfolding method may be implemented using other suitable deployment mechanisms and packaging configurations.

Figure 49A:
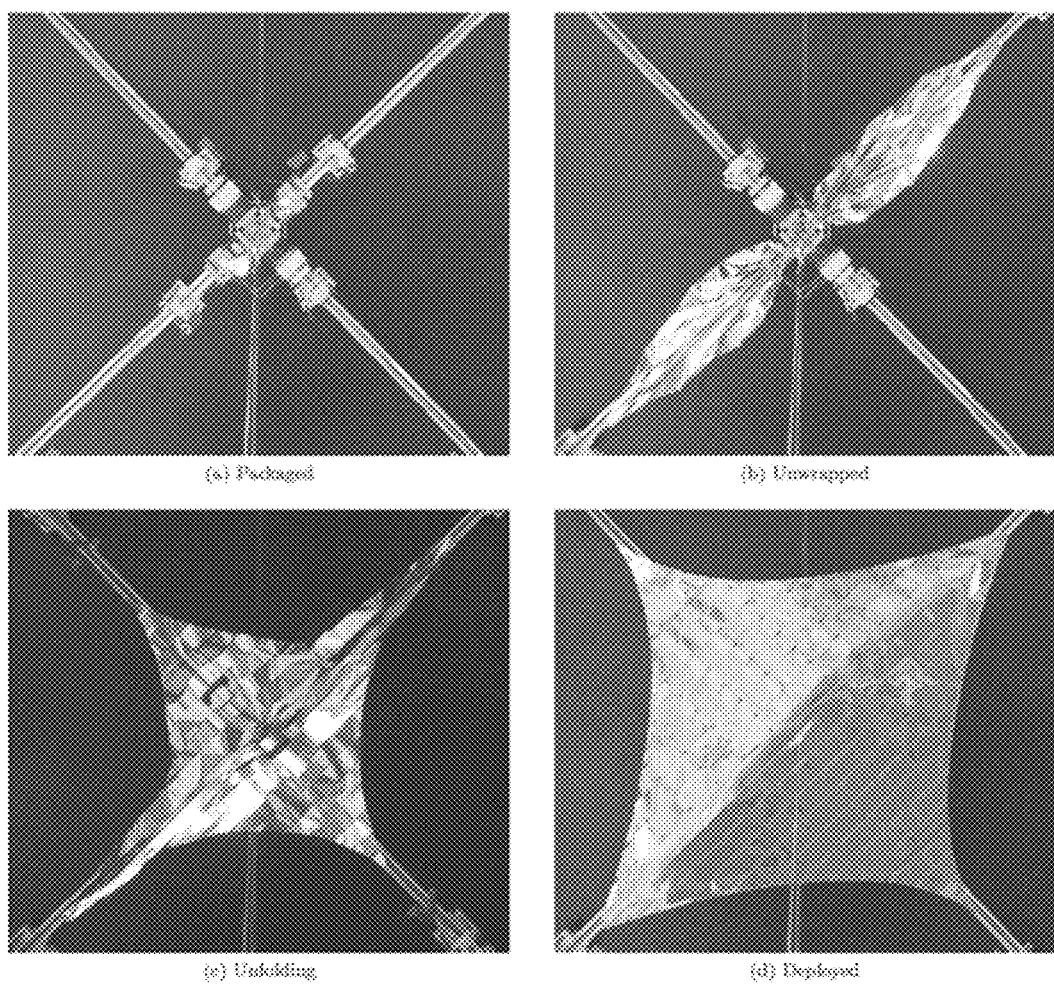
FIG. 49a provides images of a compactible structure implementing a slip-folding compaction and deployment technique, according to embodiments.
Figure 49B:
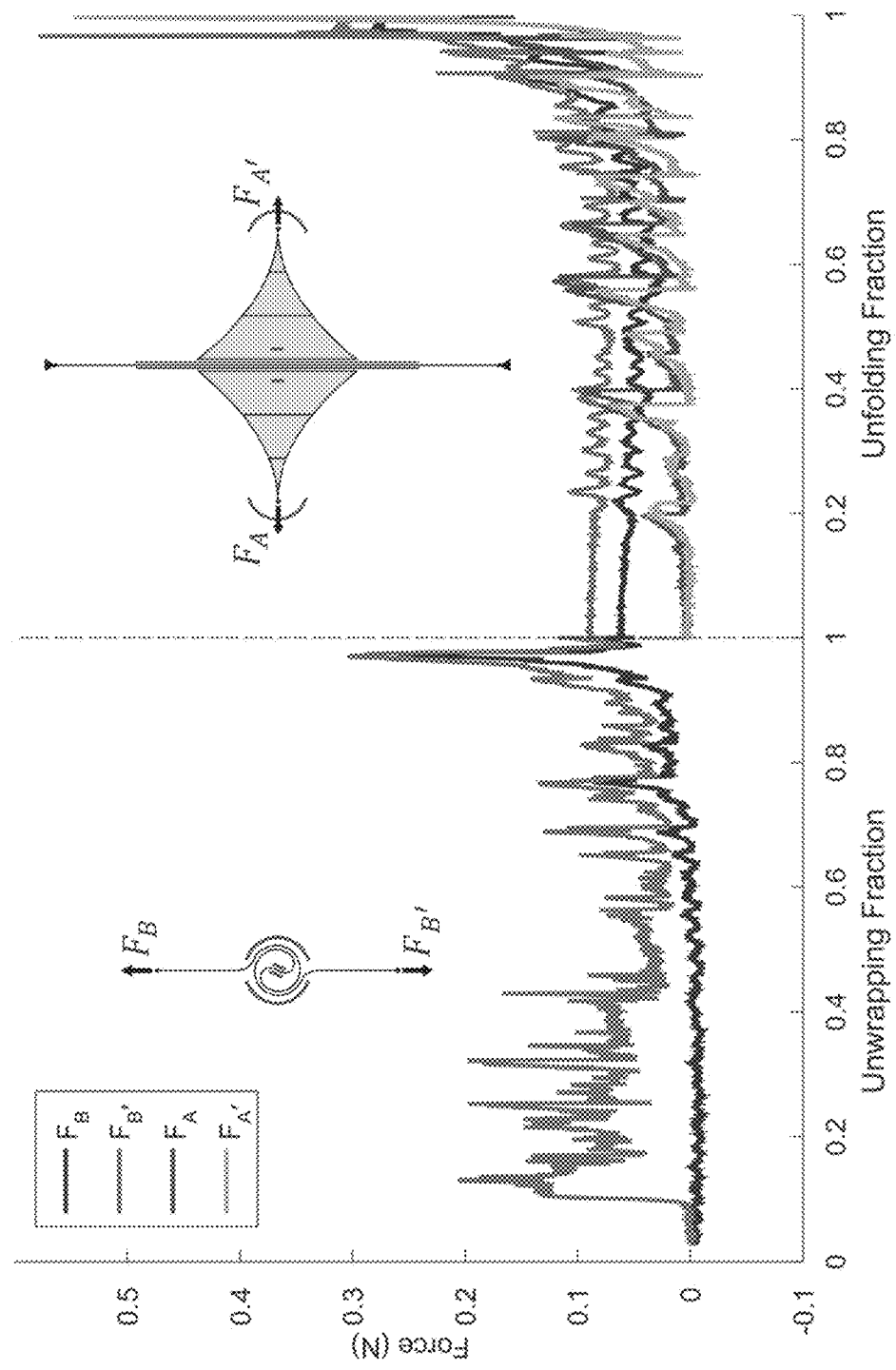

An exemplary embodiment of a compactible structure deployed in accordance with the slip-wrapped mechanisms and methods is presented in FIG. 49*a*. As shown a compactible structure with parabolic edges and ligament slipping folds having a b/a=Pa/2$F_x$=1, and a=1 m, h=25.4 μm, and being made from aluminized polyester film was provided. Since b/a=Pa/2$F_x$, $F_y/F_x$=2. As shown in the images, the deployment of the compactible structure occurred as described in the embodiments above, with a first unwrapping step followed by an unfolding step. During the deployment the forces required to deploy the compactible structure were measured. Results for both the unwrapping and unfolding steps are provided in FIG. 49b. Both in-plane and radial forces were measured, however, as the in-plane transverse forces were 20 times smaller than the radial forces they are not graphed. As shown in the graph the radial forces applied never exceeded 0.6 N. The deployment was displacement controlled at a rate of 11.9 mm/s. The peaks in the unfolding graph demonstrate the consecutive (as opposed to simultaneous) deployment of the moveable panels as there is an increase and decrease in the force applied as each panel is separately deployed. The test demonstrates that the deployment construct and methodology in accordance with embodiments operates to unwrap and unfold the compactible structure in a controlled manner.

Regardless of the mechanism chosen, in many embodiments the satellite module may be divided into any number and configuration of separate compactible structures with any number of hubs and deployment mechanisms (e.g., expandable members, weighted elements, etc.). In many embodiments the compactible structures are attached along at least two edges to more than one deployment mechanism such that more even expansion of the compactible structures may be obtained. In many embodiments, for example, multiple weights or expandable members may be attached to each of the compactible structures along multiple points or edges of the compactible structures. Some expandable members or weighted elements may be incorporated into the structure of the compactible structures. Many embodiments of deployment mechanisms may include deployment controls to controllably operate the compactible structures of the satellite modules so that the satellite modules are expanded into a deployed configuration when desired. Some embodiments of such deployment controls may be automated, such that the positioning or motion of the satellite hub automatically engages the deployment mechanism, such as, for example, by spinning the satellite module at a specified rate. Other embodiments may incorporate control circuits such that an external signal or command is required to activate the deployment mechanism. Such deployment controls may operate across an entire satellite module, may be disposed individually in each power generation tile, or a combination thereof.

While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without departing from the spirit and scope of the invention as it is defined in the appended claims.

What is claimed is:

1. A space-based solar power station comprising:
a plurality of independently operable unconnected compactible satellite modules disposed in space in an orbital array formation, wherein each of the compactible satellite modules comprises:
a plurality of moveably interconnected structural elements each having a finite thickness and are foldable relative to each other along at least one fold axis via a slip-fold and are configured to slip relative to each other in a direction parallel to the at least one fold axis such that the dimensional extent of the satellite modules is compactible;
a plurality of independent power generation tiles disposed on each of the plurality of moveably interconnected structural elements, each of the independent power generation tiles having at least one photovoltaic cell and at least one power transmitter collocated thereon, the at least one photovoltaic cell and the at least one power transmitter in signal communication with each other such that an electrical current generated by the collection of solar radiation by the at least one photovoltaic cell powers the at least one power transmitter, and where each of the at least one power transmitters comprises:
an antenna configured to receive a radio frequency power signal; and
control electronics in signal communication with the antenna and configured to control the phase of the radio frequency power signal such that the at least one power transmitter is in phased signal coordination with at least one other power transmitter on the plurality of other power generation tiles thereby forming an independent phased array of power transmitters;
wherein the independent phased array of power transmitters is configured to transmit a power signal to a remote location.

2. The space-based power station of claim 1, wherein the folded movably interconnected structural elements are further configured to wrap about a wrap axis with a rotational symmetry.

3. The space-based solar power station of claim 1, wherein the plurality of moveably interconnected structural elements are configured to slip a predetermined distance relative to each other.

4. The space-based solar power station of claim 3, wherein the moveably interconnected structural elements further comprise at least one open space formed along at least a portion of the at least one fold axis between the structural elements.

5. The space-based solar power station of claim 4, further comprising interconnections along at least another portion of the at least one fold axis that bridge the at least one open space.

6. The space-based solar power station of claim 5, wherein the interconnections along at least another portion of the at least one fold axis comprise ligament folds.

7. The space-based solar power station of claim 5, wherein the interconnections along at least another portion of the at least one fold axis are at least one hinge selected from the group consisting of latachable, frictionless, and slippage.

8. The space-based solar power station of claim 3, wherein the folded moveably interconnected structural elements form a stack having a first and second longitudinal end running transverse to the fold axis.

9. The space-based solar power station of claim 8, wherein the stack of a plurality of moveably interconnected structural elements is configured to wrap into a curved structure having a bend radius at which plastic deformation of the moveably interconnected structural elements is avoided.

10. The space-based solar power station of claim 9, wherein the bend radius does not exceed a minimum bend radius $R_{min}$ given by:

$$\frac{1}{R_{min}} = \frac{2\sigma_y}{Eh}$$

where h is the thickness of the individual structural elements, E is the material modulus of the structural elements, and $\sigma_y$ is the yield stress of the structural elements.

11. The space-based solar power station of claim 9, wherein the plurality of moveably interconnected structural elements are configured such that when disposed in a wrapped configuration the first and second longitudinal ends of the stack of a plurality of structural elements undergo no slip relative to each other.

12. The space-based solar power station of claim 1, wherein the plurality of moveably interconnected structural elements are configured to compact such that a packaging efficiency, of the satellite module when in a compacted state, as determined by the ratio of the packaged volume of the compacted satellite module to the material volume of the satellite module, is greater than 50%.

13. The space-based solar power station of claim 12, wherein the moveably interconnected structural elements have a deployed dimensionalized length λ ranging from 103 to 106 and a dimensionalized spacing ϕ between the moveably interconnected structural elements in a compacted state between 1 and 1.5 wherein the dimensionalized length and spacing are determined based on the overall packing efficiency.

14. The space-based solar power station of claim 3, wherein each of the plurality of independent power generation tiles further comprise a plurality of moveable interconnection elements; and where the at least one photovoltaic cell and the at least one power transmitter of each independent power generation tile are movable relative to each other via the moveable interconnection elements.

15. The space-based solar power station of claim 14, wherein the moveable interconnection elements of the power generation tiles are interconnected through one or more resilient members.

16. The space-based solar power station of claim 14, wherein at least the photovoltaic cell and the power transmitter on each power generation tile are disposed on separate moveable interconnection elements such that an offset transverse to the planes of the photovoltaic cell and power transmitter is opened therebetween when the separate moveable elements are displaced.

17. The space-based solar power station of claim 16, wherein the separate moveable elements are interconnected through one or more resilient members.

18. The space-based solar power station of claim 17, wherein the resilient members are springs.

19. The space-based solar power station of claim 18, wherein the resilient members and the power transmitter are configured to compact within the same plane.

20. The space-based solar power station of claim 16, further comprising one or more conductive elements that extend between the offset to conductively couple the power transmitter and the photovoltaic cell.

21. The space-based solar power station of claim 14, wherein each of the independent power generation tiles further comprise one or more collectors configured to concentrate incoming solar radiation onto each of the photovoltaic cells, and wherein the collectors are configured to engage with one or more resilient support structures configured to displace the collectors into and out of the plane of the photovoltaic cell.

22. The space-based power station of claim 1, wherein the moveably interconnected structural elements are under a prestress tensional force, the prestress tensional force being sufficient to resist any out-of-plane spatial deformation of the satellite module.

23. The space-based power station of claim 22, further comprising at least one stabilizing boom arm connected to the plurality of moveably interconnected structural elements wherein the prestress tensional force is distributed across the plurality of moveably interconnected structural elements through the at least one stabilizing boom arm.

24. The space-based power station of claim 22, wherein the prestress tension is distributed across the structural elements by one or more weighted elements being subject to a centrifugal force applied by the rotation of the satellite module.

25. The space-based power station of claim 22, wherein the plurality of moveably interconnected structural elements are interconnected through a plurality of slip-folds each having a slip fold axis, and wherein the prestress tensional force is distributed anisotropically across the plurality of moveably interconnected structural elements such that the tension applied along each slip-fold axis is much greater than the tension applied transverse to each slip-fold axis.

26. The space-based power station of claim 25, wherein the edges of the structural elements transverse to each slip-fold axis are continuously interconnected with respect to each other, and wherein the prestress tensional force is distributed to the plurality of structural elements through the edges of the structural elements.

27. The space-based power station of claim 22, wherein the plurality of structural elements comprise a plurality of edges, and wherein the edges of the structural elements are disposed in a parabolic profile.

28. The space-based power station of claim 22, wherein the structural elements comprise an outer supportive frame through which the prestress tension is applied, the power generation tiles being disposed within the outer supportive frame such that no prestress tension is distributed into the power generation tiles.

29. The space-based power station of claim 1, further comprising a deployment mechanism configured to engage with the at least two structural elements to apply a force thereto such that the elements are moved relative to each other on application of the force.

30. The space-based power station of claim 29, wherein the deployment mechanism comprises one or more booms configured to elongate.

31. The space-based power station of claim 29, wherein the deployment mechanism comprises weighted elements, and wherein the force is applied by rotation of the satellite module.

* * * * *